United States Patent [19]
Kawashima et al.

[11] Patent Number: 5,936,881
[45] Date of Patent: Aug. 10, 1999

[54] SEMICONDUCTOR MEMORY DEVICE

[75] Inventors: Shoichiro Kawashima; Ryuhei Sasagawa; Makoto Hamaminato, all of Kawasaki, Japan

[73] Assignee: Fujitsu Limited, Kawasaki

[21] Appl. No.: 09/135,646

[22] Filed: Aug. 18, 1998

[30] Foreign Application Priority Data

Aug. 20, 1997 [JP] Japan ..................................... 9-223602
May 26, 1998 [JP] Japan ................................... 10-144643

[51] Int. Cl.⁶ ............................ G11C 11/24; G11C 11/34; G11C 16/04
[52] U.S. Cl. ........................... 365/149; 365/150; 365/187; 365/188; 365/189.08
[58] Field of Search ..................................... 365/149, 150, 365/187, 188, 189.01, 189.08

[56] References Cited

U.S. PATENT DOCUMENTS

| | | | |
|---|---|---|---|
| 4,811,305 | 3/1989 | Watanabe et al. | 365/230.03 |
| 4,935,896 | 6/1990 | Matsumura et al. | 365/149 |
| 5,010,519 | 4/1991 | Yoshimoto et al. | 365/149 |
| 5,029,141 | 7/1991 | Yoshimoto et al. | 365/230.03 |
| 5,103,423 | 4/1992 | Miyazaki et al. | 365/189.01 |
| 5,377,142 | 12/1994 | Matsumura et al. | 365/189.01 |
| 5,652,728 | 7/1997 | Hosotani et al. | 365/149 |
| 5,796,650 | 8/1998 | Wik et al. | 365/189.01 |
| 5,812,476 | 9/1998 | Segawa | 365/149 |
| 5,841,690 | 11/1998 | Shibutani et al. | 365/149 |

FOREIGN PATENT DOCUMENTS

| | | |
|---|---|---|
| 62-209798 | 9/1987 | Japan . |
| 63-138593 | 6/1988 | Japan . |
| 1-137491 | 5/1989 | Japan . |

Primary Examiner—Trong Phan
Attorney, Agent, or Firm—Armstrong, Westerman, Hattori, McLeland & Naughton

[57] ABSTRACT

A semiconductor memory device includes cells arranged in a matrix formation. Each of the cells includes a driver transistor, a read transistor which is controlled by a read word line and outputs read data read from the cell to a read bit line, a write transistor which is controlled by a write word line and supplies write data supplied from a write bit line to a cell capacitor connected to a gate of the driver transistor, and a column write select transistor which is controlled by a column write select signal line and is connected to the write transistor in series. The write data is supplied to the cell capacitor via both the column write select transistor and the write transistor.

17 Claims, 51 Drawing Sheets

FIG. 37A    FIG. 37B
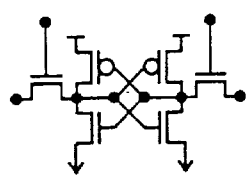
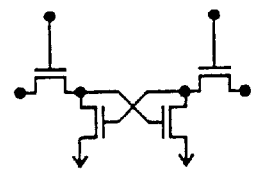
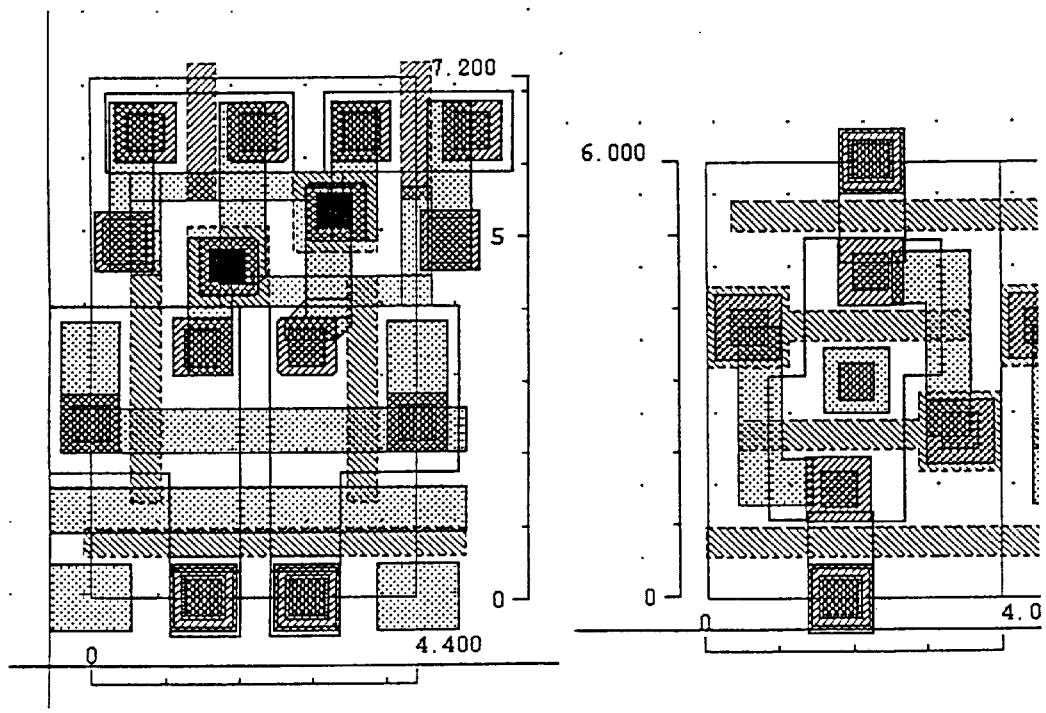
SRAM 31.7um$^2$    4Tr-Cross 24.0um$^2$ 4Tr 19.5um²

4Tr 15.6um²

4.25×3.15 = 13.4 μm²    8.7×2.05 = 17.8 μm²    6.95×1.8 = 12.5 μm²    8.2×2.05 = 16.8 μm²

SEMICONDUCTOR MEMORY DEVICE

BACKGROUND OF THE INVENTION

1. Field of the Invention

The present invention generally relates to semiconductor memory devices, and more particularly to a dynamic random access memory (DRAM) device. More specifically, the present invention is concerned with improvements in speeding up the operation (cycle time) of the DRAM device.

Nowadays, the general DRAM devices employ a memory cell made up of one transistor and one capacitor and achieve high-speed operation. Comparatively, the DRAM device does not have a data read speed as high as that of a ROM (Read Only Memory) device because the data read operation is performed in a high-impedance state in which a capacitor stored in a memory cell is shared by a bit line. Further, data stored in the cell is destroyed after the data is read therefrom, and thus data must be amplified by sense amplifiers and then rewritten into the cells connected to the same word line as the above cell. The address access time is as low as $1/5$–$1/6$ of the operation speed of a CPU. Hence, even when an I/O having a capability of transferring data at a high speed is employed, the latency is equal to 5–10.

In the data write operation, data stored in the cells connected to the same word line as a cell into which data should be written are destroyed. Hence, data are read from the cells connected to the same word line, and then a restore operation is carried out. Thus, the write cycle of the DRAM device is not short as that of an SRAM (Static Random Access Memory) device.

With the above in mind, the present invention is directed to providing a semiconductor memory device having a write cycle as short as that of the SRAM device and a read cycle as short as that of the ROM device and having a cell area less than that of the SRAM device.

In order to facilitate understanding the invention, a description will now be given of art related to the present invention.

2. Description of the Related Art

A DRAM device used in 1970s employs a memory cell formed by three transistors. FIG. 1 shows the structure of such a DRAM device. One memory cell consists of a driver transistor Q1, a read transistor Q2 and a write transistor Q3. A cell capacitor (illustrated by broken lines) provides a storage capacitance and is connected to the gate of the driver transistor Q1. The read transistor Q2 is connected by read word lines Read_WLn (n=0, 1, . . . , n). The write transistors Q3 are controlled by write word lines Write_WLn. The read transistors Q2 are connected to read bit lines Read_BLn, and the write transistors Q3 are connected to write bit lines Write_BLn. In the following description, the above symbols "Read_" and "Write_" are abbreviated as "R" and "W", respectively.

When data is read from a memory cell, the read transistor Q2 is turned ON by the read word line RWL. The cell capacitor is connected to the gate of the driver transistor Q1. Hence, even when the read transistor Q2 is ON, the potential of the memory capacitance (cell capacitor) retains, and data stored therein is not destroyed. Thus, there is no need to perform the data rewrite (restore) operation after the read operation, and the read cycle can be reduced. Further, data is read from the memory cell in a current drive formation in which the driver transistor Q1 is turned ON and the charge of the read bit line RBL is caused to flow to the ground GND when the charge is stored in the cell capacitor. Hence, the potential of the read bit line RBL is changed rapidly, and data can be read from the memory cell at a comparatively high speed.

In contrast, when data is written into a memory cell, data stored in the memory cells connected to the same word line as the memory cell are destroyed. This will be described with reference to FIG. 2. The potentials of the write bit lines WBL are applied to all the cells selected by the write word line WWL because the cell capacitors of these cells are connected to the write bit lines WBL. For example, when the write word line WWL0 is selected, the potentials of the write bit lines WBL0, WBL1, . . . , WBLn are applied to the cell capacitors of the memory cells A, B, . . . connected to the write word line WWL0. That is, data of the write bit lines WBL0, WBL1, WBLn are written into the cell capacitors of the memory cells A, B, . . . , via the respective write transistors Q3.

Hence, as shown in data write cycles of the cells A and B in FIG. 2, one write cycle requires a data read operation and a data restore (rewrite) operation. For example, when data should be written into the cell A, the read word line RWL0 is driven, and data stored in the cells connected to the read word line RWL0 are read to the read bit lines RBL0, RBL1, and so on. The read data are latched in sense amplifiers (not shown) connected to the bit lines, and the restore operation is performed so that the latched data are rewritten in the memory cell while the target cell A is supplied with write data via the write bit line WBL0 at the timing of the above restore operation.

In FIG. 2, when data is written into the cell A, data (high level) of the cell B is read to the read bit line RBL1, and the write bit line WBL1 is driven so as to become high by the restore operation. Hence, the high-level data is rewritten into the cell B.

As described above, the write operation requires two operations of the read operation and the restore operation. Hence, it is very difficult to reduce the write cycle. It is to be noted that FIG. 4 shows that the read cycle has the same cycle as the write cycle. However, the time necessary to read data is half the time necessary to write data.

SUMMARY OF THE INVENTION

It is an object of the present invention to provide a semiconductor memory device in which the above disadvantages are eliminated.

A more specific object of the present invention is to provide a semiconductor memory device having a reduced write cycle, which is approximately equal to the write cycle of the SRAM device.

The above objects of the present invention are achieved by a semiconductor memory device comprising cells arranged in a matrix formation, each of the cells comprising: a driver transistor; a read transistor which is controlled by a read word line and outputs read data read from the cell to a read bit line; a write transistor which is controlled by a write word line and supplies write data supplied from a write bit line to a cell capacitor connected to a gate of the driver transistor; and a column write select transistor which is controlled by a column write select signal line and is connected to the write transistor in series.

The semiconductor memory device may be configured so that in each of the cells, the write data supplied from the write bit line is supplied to the cell capacitor via both the column write select transistor and the write transistor.

The semiconductor memory device may be configured so that it further comprises: a decoder which decodes a signal on an address line and thus specifies at least one of the cells; and a selector which supplies, at the time of writing, the write data to the write bit line of the specified cell and which selects the column write select signal line of the specified cell, the column write select transistor of the specified cell being driven under control of the selected column write select signal line.

The semiconductor memory device may be configured so that the read bit line and the column write select signal line of an adjacent cell are unified and formed of a unified signal line.

The semiconductor memory device may be configured so that it further comprises: a decoder which decodes a signal on an address line and thus specifies at least one of the cells; and a selector which supplies, at the time of writing, the write data to the write bit line of the specified cell and which selects the unified signal line of the specified cell, the column write select transistor of the specified cell being driven under control of the unified signal line.

The semiconductor memory device may be configured so that the read bit line and the column write select signal line in each of the cells are unified and formed of a unified signal line.

The semiconductor memory device may be configured so that it further comprises: a decoder which decodes a signal on an address line and thus specifies at least one of the cells; and a selector which supplies, at the time of writing, the write data to the write bit line of the specified cell and which selects the unified signal line of the specified cell, the column write select transistor of the specified cell being driven under control of the unified signal line.

The semiconductor memory device may be configured so that the read bit line and the write bit signal line of an adjacent cell are unified and formed of a unified signal line.

The semiconductor memory device may be configured so that it further comprises: a decoder which decodes a signal on an address line and thus specifies at least one of the cells; and a selector which supplies, at the time of writing, the write data to the unified signal line of the specified cell and which selects the column write select signal line of the specified cell, the column write select transistor of the specified cell being driven under control of the selected column write select signal line.

The semiconductor memory device may be configured so that the read bit line and the write bit line in each of the cells are unified and formed of a unified signal line.

The semiconductor memory device may be configured so that it further comprises: a decoder which decodes a signal on an address line and thus specifies at least one of the cells; and a selector which supplies, at the time of writing, the write data to the unified signal line and which selects the column write select signal line of the specified cell, the column write select transistor of the specified cell being driven under control of the unified signal line.

The semiconductor memory device may be configured so that it further comprises a write control transistor provided between the write bit line and the cell capacitor and connected in series to the write transistor and the column write select transistor, wherein: the write control transistor is controlled by the write bit line of an adjacent cell; and the write bit line, the read bit line and the column write select signal line are unified in each of the cells and are formed by a unified signal line.

The semiconductor memory device may be configured so that it further comprises: a decoder which decodes a signal on an address line and thus specifies at least one of the cells; and a selector which supplies, at the time of writing, the write data to the unified signal line and which selects another unified signal line of a cell adjacent to the specified cell, the column write select transistor of the specified cell being driven under control of the unified signal line.

The semiconductor memory device may be configured so that: the write bit line and the read bit line are formed of a unified signal line in each of the cells; and column write select signal lines related to a plurality of cells are simultaneously driven so that a plurality of bits can be simultaneously written into the plurality of cells.

The semiconductor memory device may be configured so that: the read bit line and the column write select signal line are formed of a unified signal line in each of the cells; and column write select signal lines related to a plurality of cells are simultaneously driven so that a plurality of bits can be simultaneously written into the plurality of cells.

The semiconductor memory device may be configured so that: the read bit line and the write bit line of an adjacent cell are formed of a unified signal line; read and write operations are alternately carried out; and read data appearing on the unified signal line is written into the cell of an adjacent column so that data is shifted.

The semiconductor memory device may be configured so that: the read bit line and the write bit line of an adjacent cell are formed of a unified signal line in each of the cells; read and write operations are alternately carried out; and read data appearing on the unified signal line is written into the cell of an adjacent column so that data is shifted.

The above objects of the present invention are also achieved by a semiconductor memory device comprising cells arranged in a matrix formation, each of the cells comprising: a driver transistor; an AND circuit which inputs a write word line and a column write select signal line and outputs a write select signal line; and a write select transistor which is controlled by the write select signal line and supplies write data supplied from the write bit line to a cell capacitor connected to a gate of the driver transistor.

BRIEF DESCRIPTION OF THE DRAWINGS

Other objects, features and advantages of the present invention will become more apparent from the following detailed description when read in conjunction with the accompanying drawings, in which:

FIGS. 37A and 37B are diagrams showing circuit configurations of a conventional DRAM device and layout patterns thereof;

FIGS. 38A, 38B, 38C and 38D are diagrams showing circuit configurations of the present invention cell and layout patterns thereof;

DESCRIPTION OF THE PREFERRED EMBODIMENTS

The present invention is directed to realizing a data write operation in which data stored in memory cells are not destroyed. In order to realize the above data write operation, a column write select transistor is provided to a cell formed by three transistors. The column write select transistor is controlled by a control signal such as a column write select signal. Only a cell which is simultaneously selected by the write word line and a column write select signal line over which the column write select signal is carried is connected to the corresponding write bit line. Then, data on the write bit line is written into the cell capacitor of the selected cell. A "half-selected" cell (which is selected by the same word line as the selected cell but is not supplied with the corresponding column write select signal) is not connected to the corresponding data write line. Hence, data stored in the half-selected cell is not destroyed but retained.

As described above, data can be written into the target memory cell while data stored in other cells are not destroyed. Hence, it is no longer necessary to perform the read and restore operations on the cells connected to the same write word line as the selected cell. In other words, only the write operation is required to write data into the target cell, so that the write cycle can be reduced to be approximately equal to the write cycle of the SRAM device.

Figure 3:
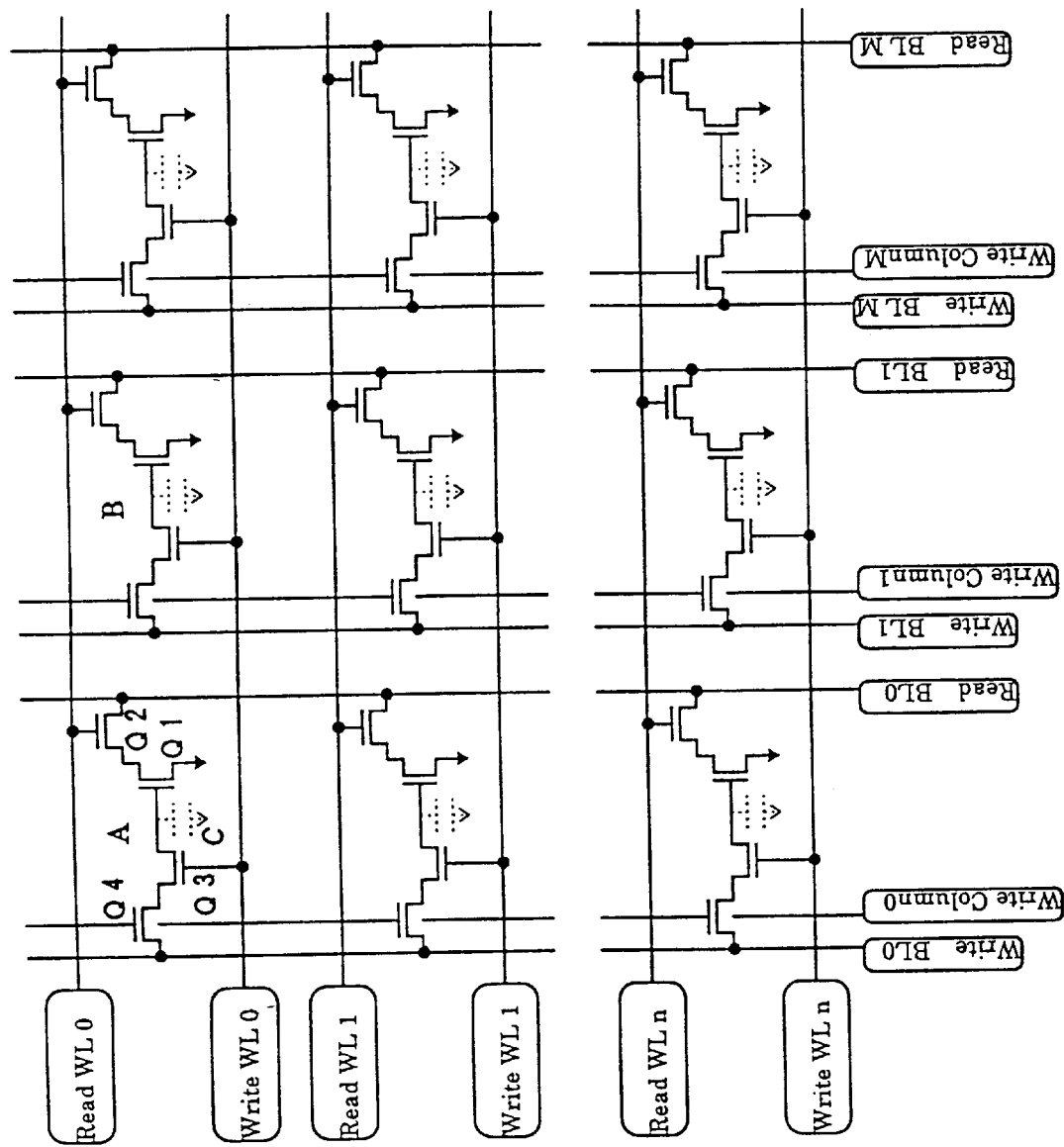
FIG. 3 is a circuit diagram of a first embodiment of the present invention.
Figure 4:
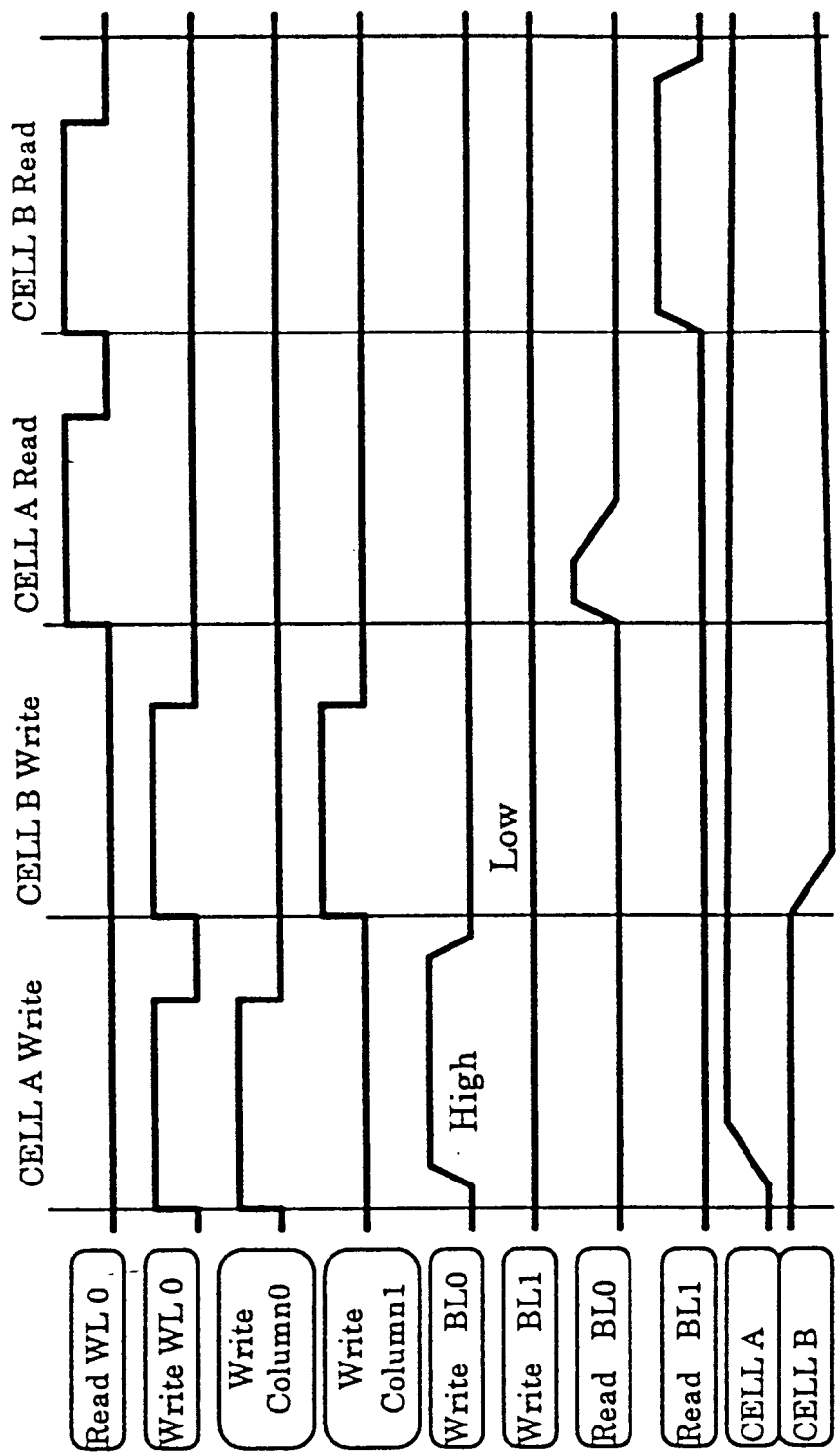
FIG. 4 is a timing chart of an operation of the first embodiment of the present invention shown in FIG. 3.

FIG. 3 is a circuit diagram of a first embodiment of the present invention. FIG. 4 is a timing chart of an operation of the circuit shown in FIG. 3 observed when high-level and low-level data are written into the cells A and B, respectively, and the data are read from the cells A and B in this order.

As shown in FIG. 3, a fourth transistor Q4 is provided to each cell. The fourth transistor Q4 functions as the above-mentioned column write select transistor. The column write select transistor Q4 is provided between the write bit line WBL and the write transistor Q3 connected to the write word line WWL. In other words, the transistors Q3 and Q4 are connected in series. The gate of the write select transistor is connected to a column write select signal line Write__Column__M (M=0, 1, . . . , M), which will be abbreviated as WCOLM in the following.

The circuit shown in FIG. 3 operates as shown in FIG. 4.

The write word line WWL0 is set to the high level, and simultaneously the column write select signal WCOL0 is set to the high level. The other word lines WWL1–WWLn and the other column write select signal lines WCOL1–WCOLM are set to the low level (non-selected state). Hence, the write bit line WBL0 and the cell capacitor C of the cell A are connected together. When high-level data is applied to the write bit line WBL0, the potential of a node A becomes high (the term "node A" denotes a connection point at which the gate of the driver transistor Q1 is connected to the cell capacitor C). At this time, the nodes of the cells (cell capacitors) connected to the same write word line WWL0 to which the cell A are not connected to the write bit lines WBL1–WBLM, and thus hold the current data (levels). For example, the node of the cell B (node B) is isolated from the write bit line WBL1 and holds the current data. Thereafter, the write word line WWL0 and the column write select line WCOL0 are returned to the low level, and the write cycle of the cell A ends. The cell capacitor C may be formed of a gate capacitance of the driver transistor Q1 or may be a capacitance element separately formed.

Next, in order to write data into the cell B, the write word line WWL0 is set to the high level and simultaneously the column write select signal WCOL1 is set to the high level. The other write word lines WWL1–WWLn and the column write select signal lines WCOL0 and WCOL2–WCOLM are maintained at the low level (not selected). Hence, the cell capacitor C of the cell B is connected to the write bit line WBL1. If low-level data is applied to the write bit line WBL1, the potential of the node B becomes low. At this time, the nodes of the cells connected to the same write word line WWL0 as the cell B are isolated from the write bit lines WBL0 and WBL2–WBLM, and hold the current levels. For example, the node of the cell A is isolated from the write bit line WBL0 and holds the current level. Thereafter, the write word line WWL0 and the column write select signal line WCOL1 are returned to the low level, and the write cycle of the cell B ends.

Next, the read word line RWL0 is set to the high level and thus selected. The other read word lines RWL1–RWLn and all the column write select signal lines WCOL0–WCOLM are low and are thus in the non-selected state. Hence, the cells selected by the read word line RWL0 are connected to the read bit lines RBL0–RBLM, respectively. The cell capacitors of these cells are connected to the gates of the respective driver transistors Q1, and data stored therein are not destroyed. Only the read bit line RBL0 selected by a decoded column select signal is pulled up in a pulse-like formation and temporarily become high. Since the cell A stores high-level data, the driver transistor Q1 of the cell A is ON, and pulls down the potential of the read bit line RBL0 via the read transistor Q2. After a given period, the level of the read bit line RBL0 is determined, and the inverted version of the level of the read bit line RBL0 is output as read data of the cell A. In the current example, the read bit line RBL0 is pulled down to the low level, and thus high-level data is output as read data of the cell A. The data stored in the other cells are not destroyed at all, and thus the restore operation is not needed. Then, the read word line RWL0 is returned to the low level, and the read cycle of the cell A ends.

Next, the read word line RWL0 is set to the high level and thus selected. The other read word lines RWL1–RWLn and the column write select signal lines WCOL0–WCOLM are maintained at the low level. The read bit line RBL0 selected by a decoded column select signal is pulled up in a pulse-like formation, and temporarily becomes high. Since the cell B stores low-level data, and the driver transistor Q1 is OFF. Hence, even if the read transistor Q2 is turned ON, and the read bit line RBL1 is not pulled down. After the given period, the level of the read bit line RBL1 is determined, and the inverted version of the determined level is output as read data of the cell B. In the example being considered, the potential of the read bit line RBL1 is high, and low-level data is output as read data of the cell B. The data stored in the other cells are not destroyed at all, and thus the restore operation is not needed. Then, the read word line RWL0 is returned to the low level, and the read cycle of the cell B ends.

Figure 1:
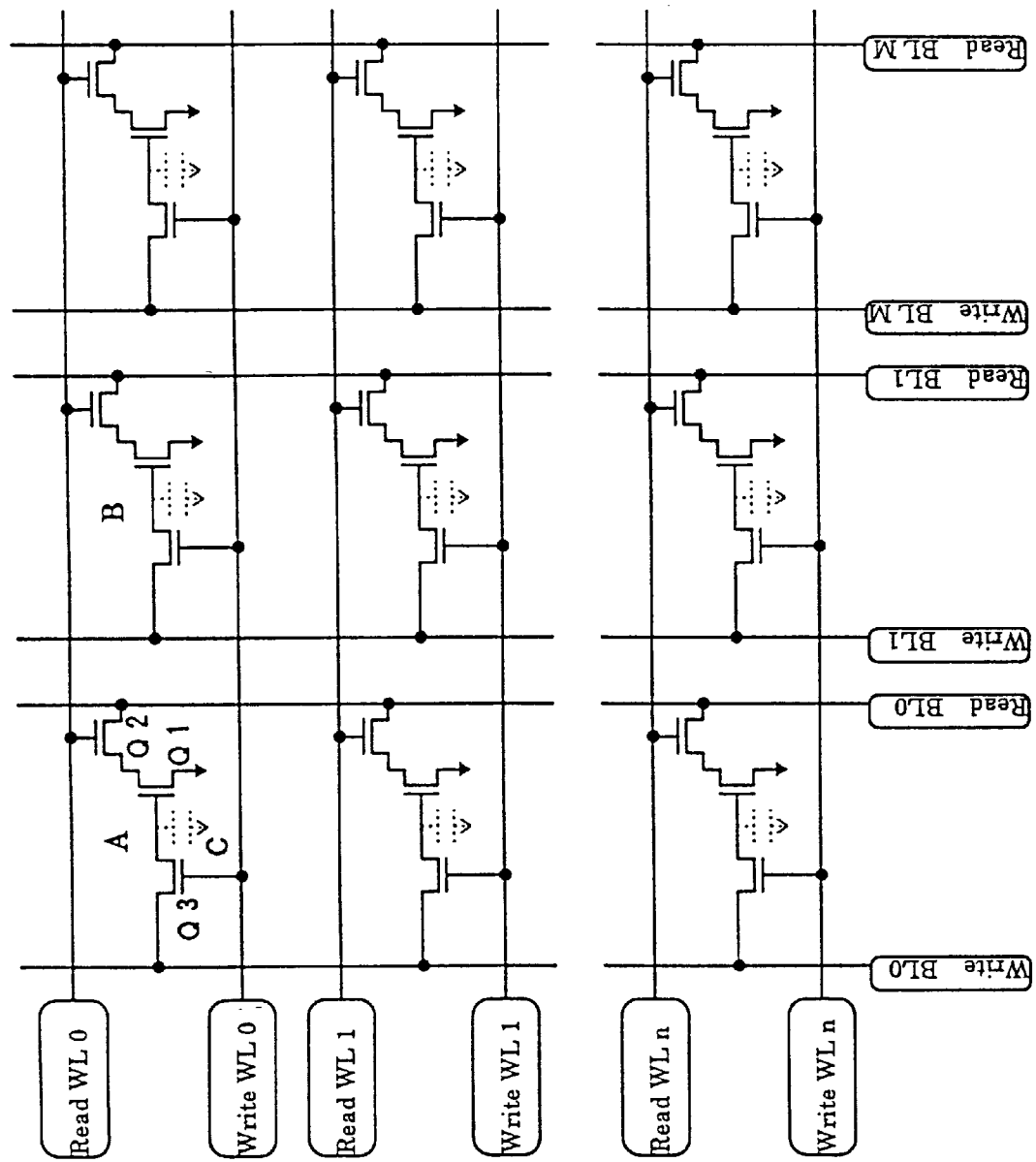
FIG. 1 is a circuit diagram of a conventional DRAM device having a memory cell consisting of three transistors.
Figure 2:
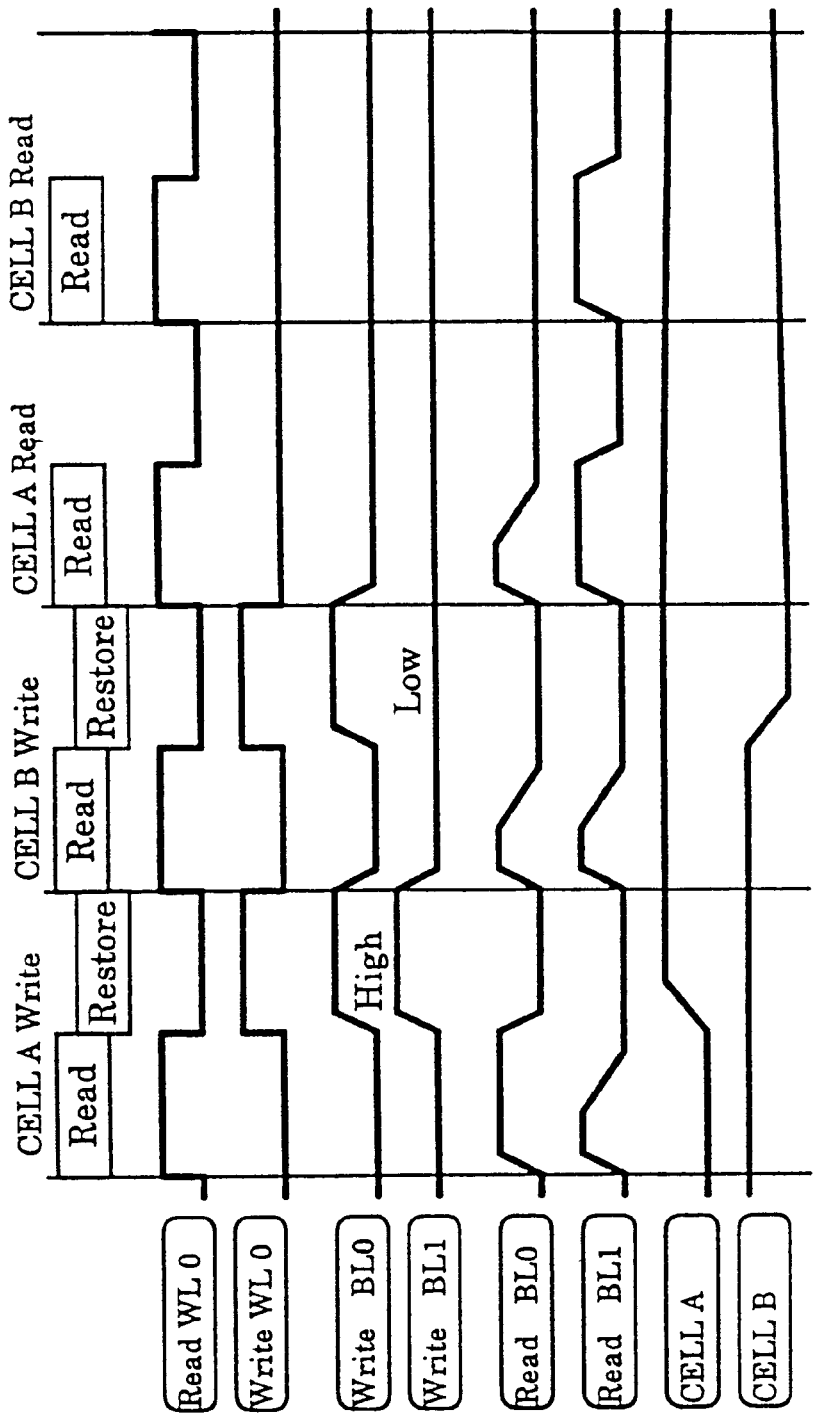
FIG. 2 is a timing chart of an operation of the DRAM device shown in FIG. 1.

One cycle shown in FIG. 4 has a length approximately half that of one cycle shown in FIG. 2 in order to facilitate reading of FIG. 4 so that one cycle of FIG. 4 is enlarged so as to be twice one cycle of FIG. 2.

The DRAM device of the first embodiment of the present invention is capable of reading and writing data without destroying data in other cells. Thus, there is no need to provide the same number of sense amplifiers as the number of bit lines. For example, when the read and write operations are carried out per bit, the DRAM device can be equipped with only one sense amplifier. Hence, it is possible to reduce the number of sense amplifiers and reduce power consumption. It will be noted that the cell capacitors require refresh operation as in the case of the one-capacitor one-transistor DRAM device. When only one sense amplifier is used, a plurality of cell capacitors cannot be simultaneously subjected to the refresh operation. Thus, the read cycle and the write cycle must be serially performed for each cell. Hence, a data shift operation on bit lines will be required to perform the refresh operation, as will be described later.

Figure 5:
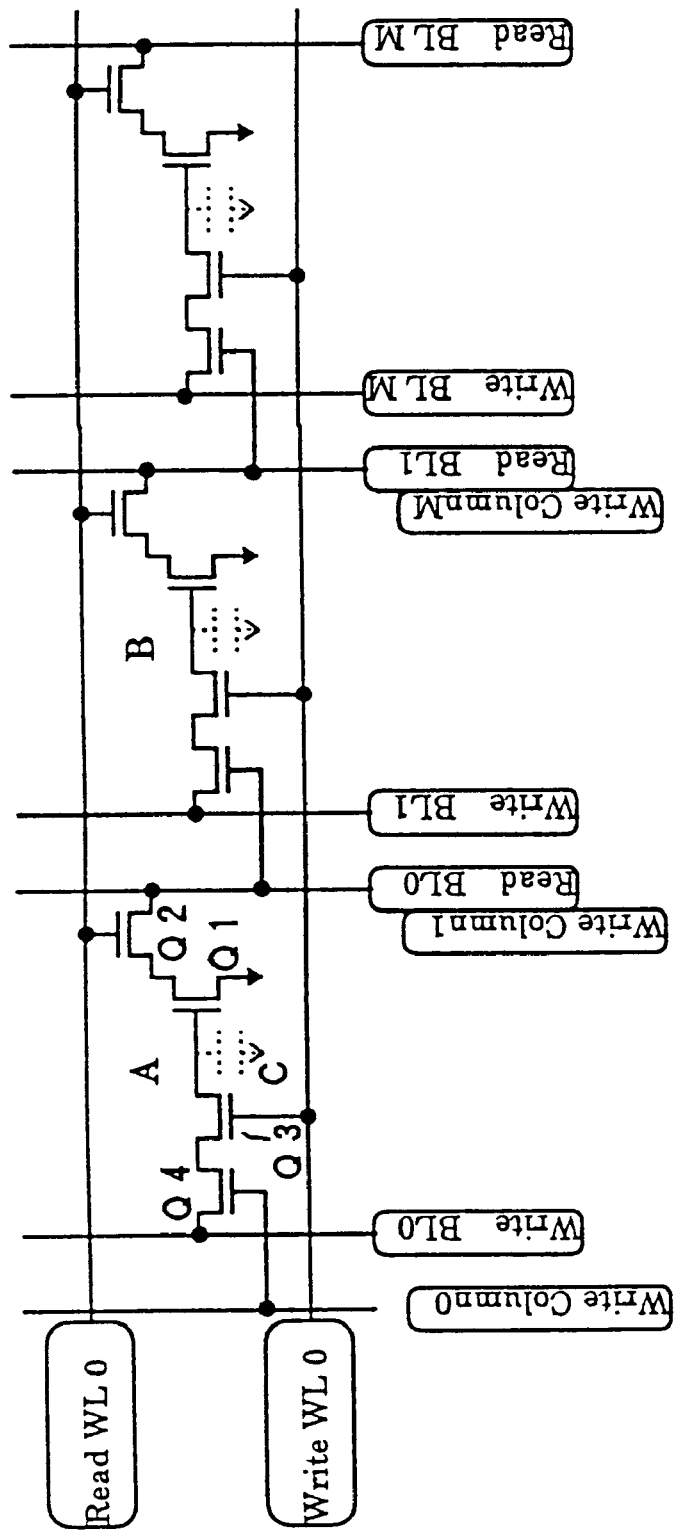
FIG. 5 is a circuit diagram of a second embodiment of the present invention.

A description will be given, with reference to FIGS. 5 and 6, of a second embodiment of the present invention, which corresponds to a first modification of the first embodiment of the present invention. The second embodiment of the present invention is directed to unifying the column write select signal line WCOL and the read bit line RBL0 for the adjacent column to thereby reduce the number of lines extending along the column to two per cell. More particularly, the read bit line RBL(M-1) is used as the column write select signal line WCOL(M). For example, as shown in FIG. 5, the read bit line RBL0 for the cell A and the column write select signal line WCOL0 for the cell B are formed of a single common line. It will be noted that FIG. 5 shows an arrangement for only one word for the sake of simplicity, but cells are arranged in a matrix formation in practice.

Figure 6:
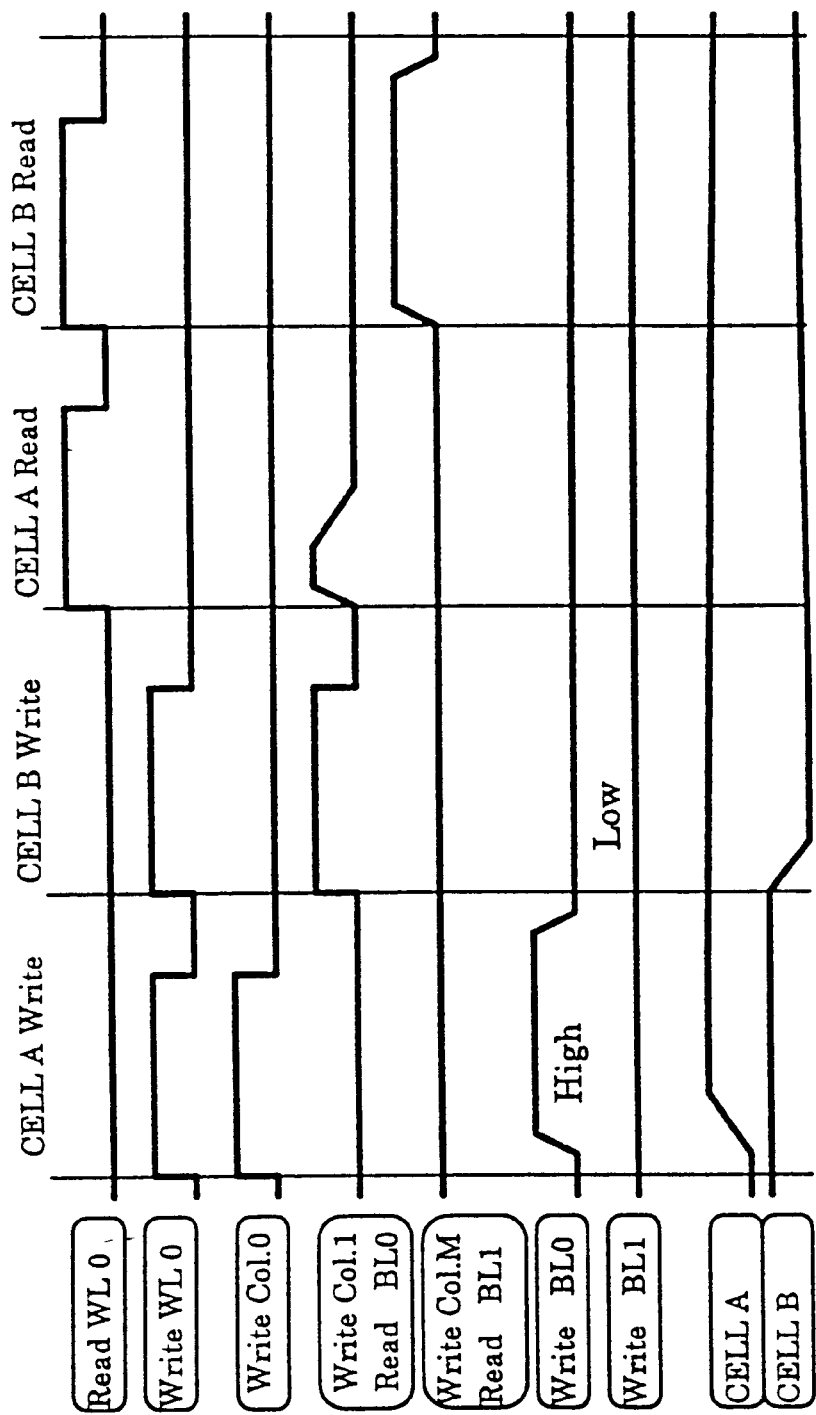
FIG. 6 is a timing chart of an operation of the second embodiment of the present invention shown in FIG. 5.

Referring to FIG. 6, the read word line RWL0 is not selected and is thus low in the write cycle of the cell A. Hence, the transistor Q2 is OFF and the read bit line RBL0 is isolated from the cell. Hence, the read bit line RBL0 which is idle in the write cycle of the cell A can be used as the column write select signal line WCOL1 when data is written into cell B. At the time of reading data from the cell A, even when the column write select transistor Q4 is turned ON, the write word line WWL0 is low and is maintained in the non-selected state. Thus, the cell capacitor of the cell B cannot be connected to the write bit line WBL1.

the common signal line is connected to a drive circuit which outputs the column write select signal in the write cycle, while it is disconnected therefrom in the read cycle and is connected to the sense amplifier and a pull-up circuit having a pulse-like formation, which will be described later.

Figure 7:
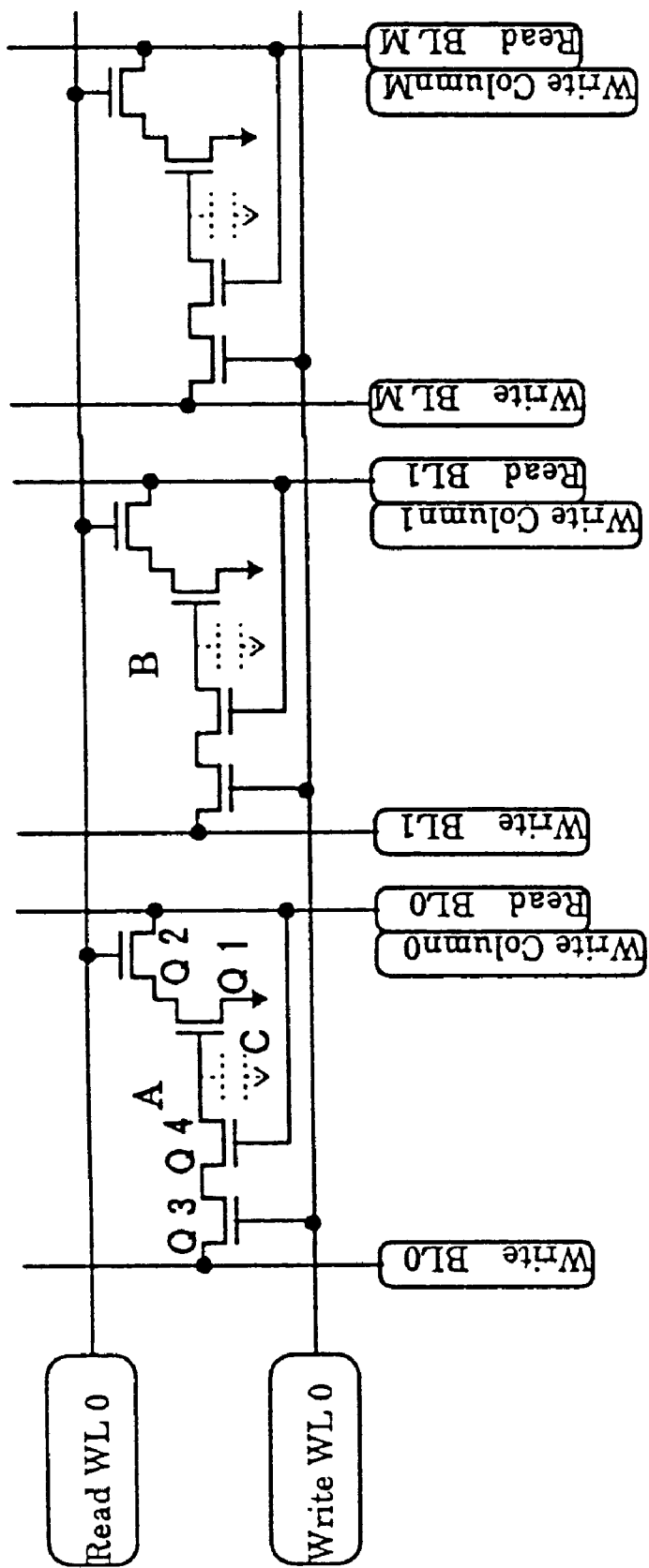
FIG. 7 is a circuit diagram of a third embodiment of the present invention.

A description will now be given, with reference to FIGS. 7 and 8, of a third embodiment of the present invention, which corresponds to a second modification of the aforementioned first embodiment thereof. The third embodiment of the present invention unifies, in each cell, the column write select signal line WCOL(N) and the read bit line RBL(N) to thereby reduce the number of lines extending along the column to two per cell. In order to realize the above, the write transistor Q3 is directly connected to the write bit line WBLO, and the column write select transistor Q4 is interposed between the cell capacitor C and the transistor Q3. It will be noted that FIG. 7 shows a cell arrangement for only one word for the sake of simplicity, but cells are arranged in a matrix formation in practice.

Figure 8:
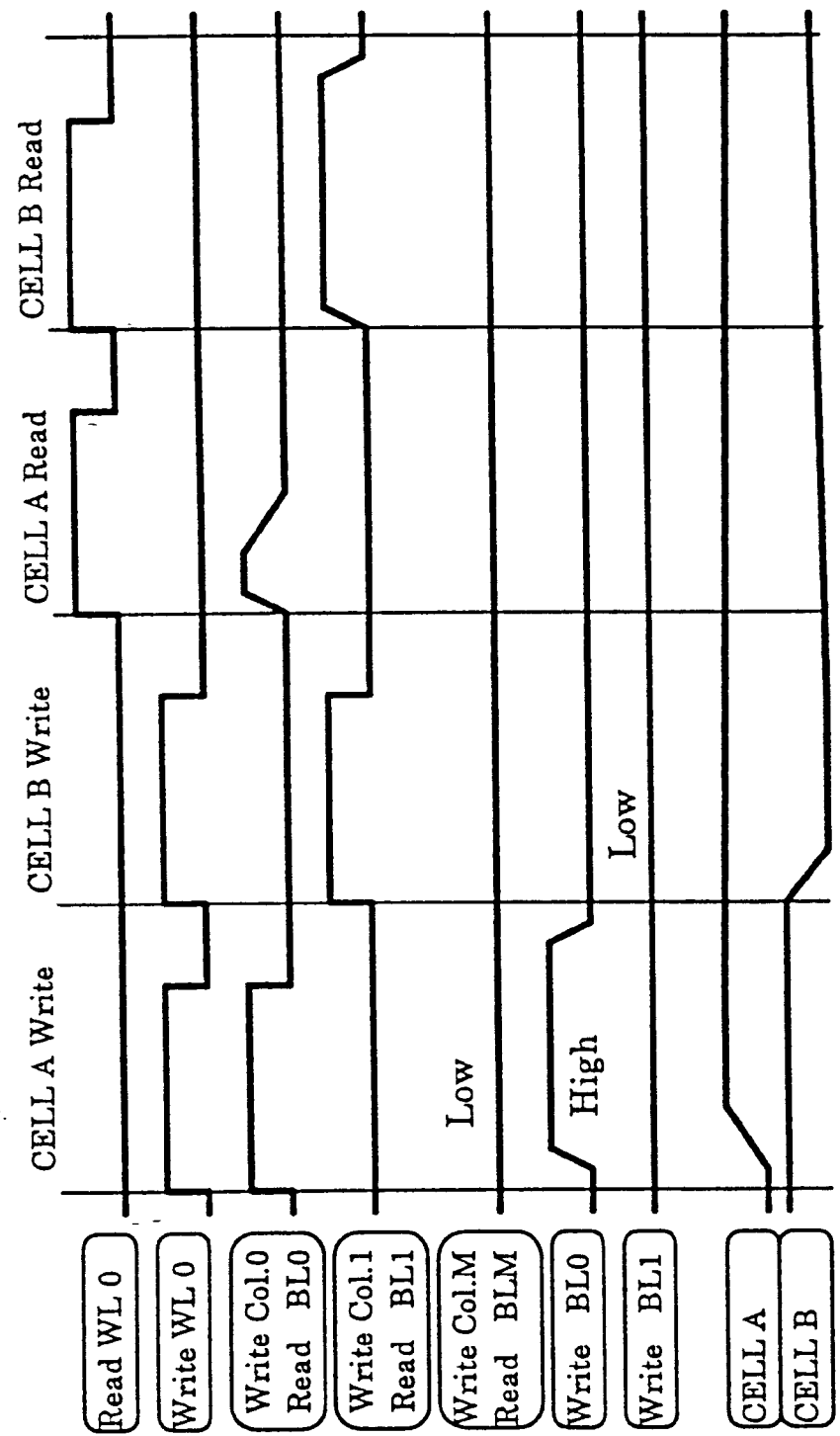
FIG. 8 is a timing chart of an operation of the third embodiment of the present invention shown in FIG. 7.

Referring to FIG. 8, in the write cycle of the cell A, the read word line RWL0 is low and is in the non-selected state, so that the read bit line RBL0 is isolated from the cell A. Hence, the read bit line RBL0 which is idle in the write cycle of the cell A can be used as the column write select signal line WCOL0 when data is written into the cell A. When data is read from the cell A, the column write select signal line WCOL0 is not needed, and thus can be used as the read bit line RBL0. In this case, the read bit line RBL0 is switched to the high level. However, the write word line WWL0 is low, and thus the cell capacitor C of the cell A cannot be connected to the write bit line WBL0.

Figure 9:
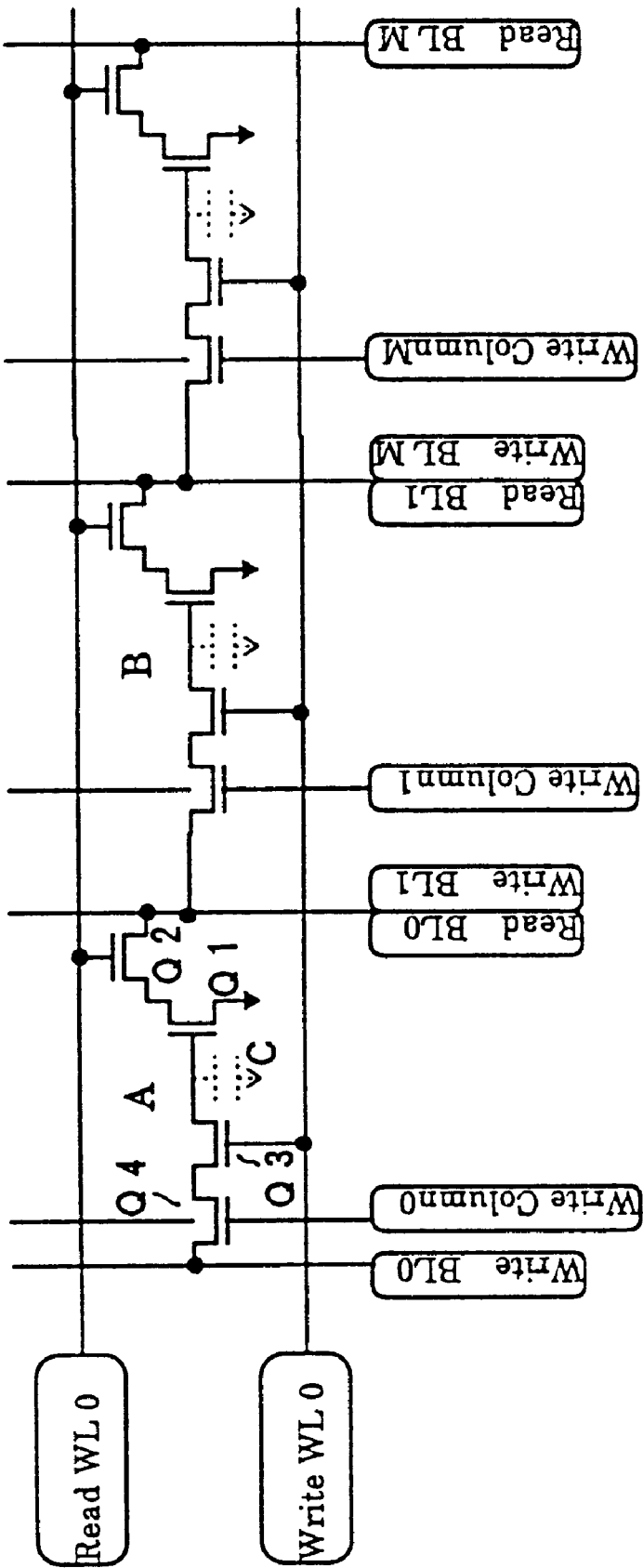
FIG. 9 is a circuit diagram of a fourth embodiment of the present invention.

A description will now be given, with reference to FIGS. 9 and 10, of a fourth embodiment of the present invention, which corresponds to a third modification of the aforementioned first embodiment thereof. The fourth embodiment of the present invention unifies, in each cell, the read bit line RBL and the write bit line for the adjacent column and thus reduces the number of lines extending along the column to two per cell. More particularly, the read bit line RBL(M-1) is used as the write bit line WBL(M). For example, as shown in FIG. 9, the read bit line RBL0 for the cell A and the write bit line WBL1 for the cell B are unified to a single line. It will be noted that FIG. 9 shows a cell arrangement for only one word for the sake of simplicity, but cells are arranged in a matrix formation in practice.

Figure 10:
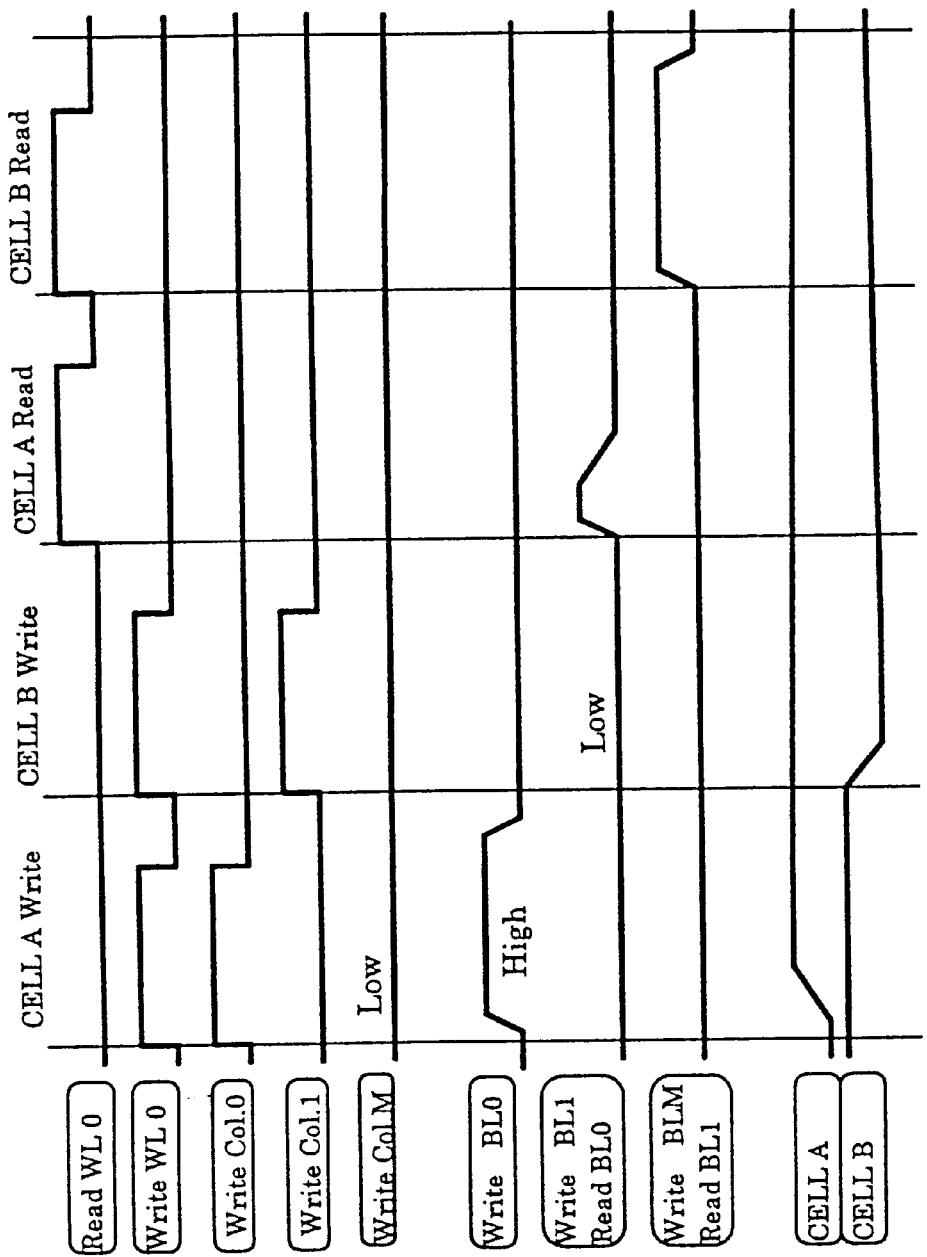
FIG. 10 is a timing chart of the fourth embodiment of the present invention shown in FIG. 9.

Referring to FIG. 10, in the write cycle of the cell A, the read word line RWL0 is low and is in the non-selected state. Hence, the read bit line RBL0 is isolated from the cell A, so that the read bit line RBLO which is idle in the write cycle of the cell A can be used as the write bit line WBL1 when data is written into the cell B. When data is read from the cell A, even when data read from the cell A is high-level data, the data read from the cell B cannot be written into the cell capacitor of the cell B because the write word line RWL0 is low and is maintained in the non-selected state.

In the write cycle, write data is applied to the common line, which is connected, in the read cycle, to the sense amplifier and the pull-up circuit, as will be described later.

Figure 11:
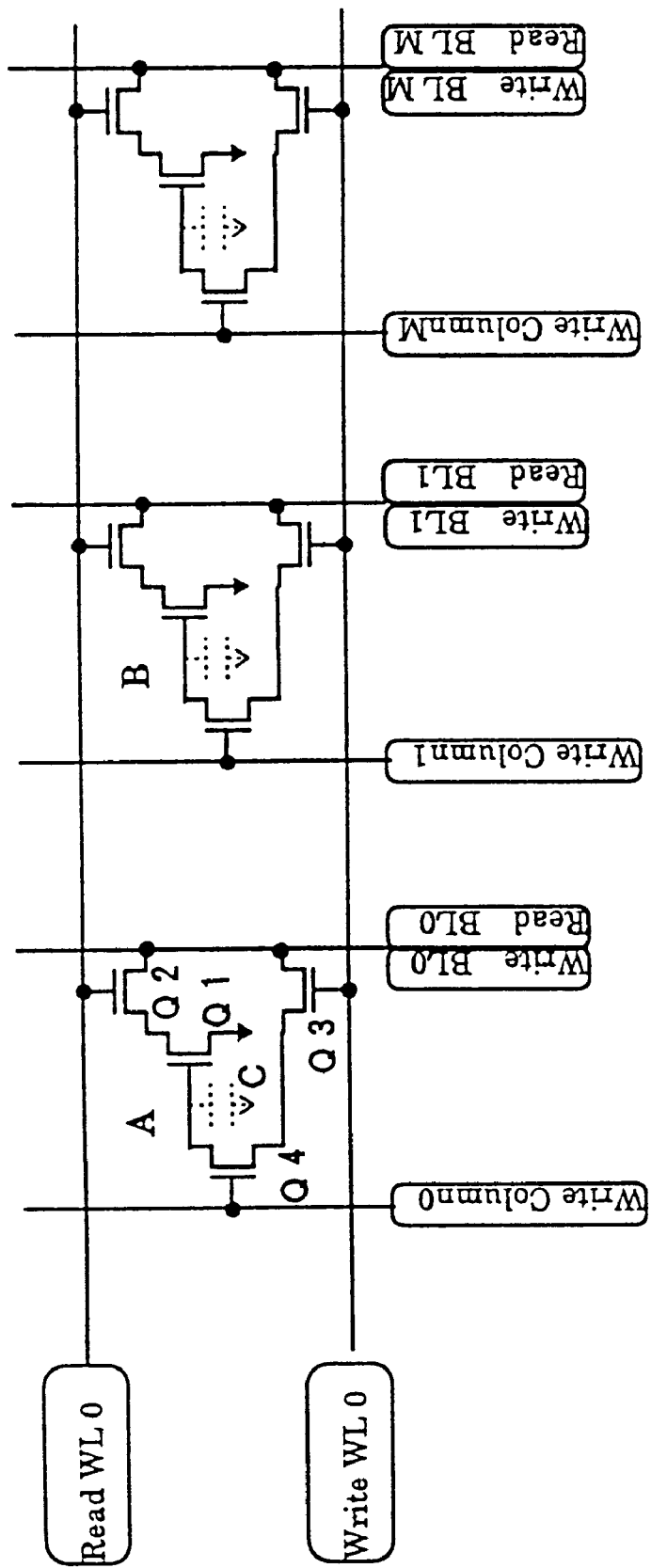
FIG. 11 is a circuit diagram of a fifth embodiment of the present invention.

A description will now be given, with reference to FIGS. 11 and 12, of a fifth embodiment of the present invention, which corresponds to a fourth modification of the first embodiment thereof. The fifth embodiment of the present invention unifies, in each cell, the write bit line WBL and the read bit line RBL to thereby reduce the number of lines extending along the column to two per cell. It will be noted that FIG. 11 shows a cell arrangement for only one word for the sake of simplicity, but cells are arranged in a matrix formation in practice.

Figure 12:
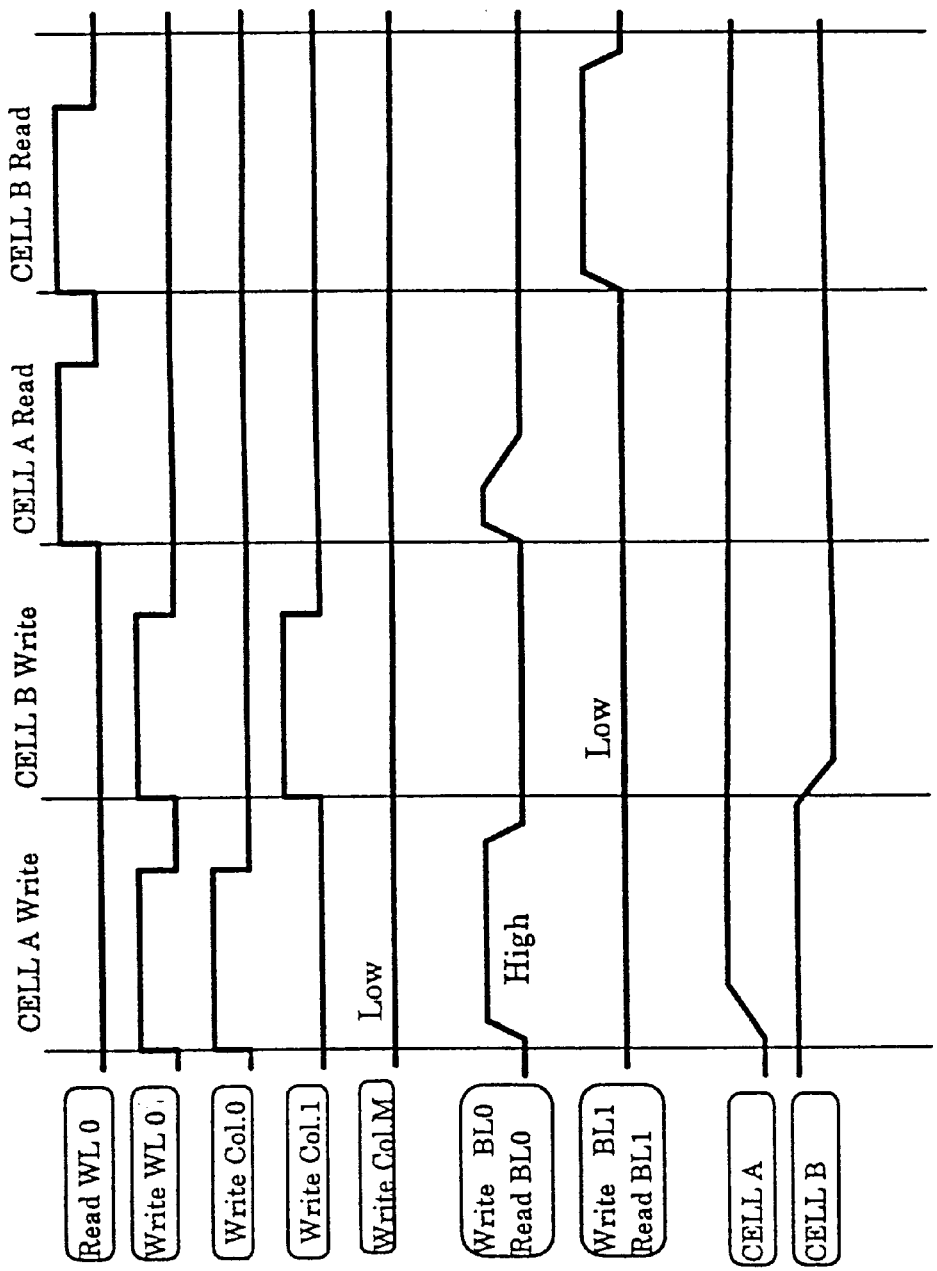
FIG. 12 is a timing chart of an operation of the fifth embodiment of the present invention shown in FIG. 11.

Referring to FIG. 12, in the write cycle of the cell A, the read word line RWL0 is low and is maintained in the non-selected state. Thus, the read transistor Q2 is OFF, and the cell A is isolated from the read bit line RBL0. Data on the unified write bit line WBL0 passes through the transistors Q3 and Q4, and is written into the cell capacitor C of the cell A. When data is read from the cell A, the write word line WWL0 and the column write select signal line WCOL0 are both low, and thus the transistors Q3 and Q4 are OFF. The read word line RWL0 is at the high level, and the transistor Q2 is ON. Hence, the transistor Q1 is turned ON or OFF based on the state of the cell capacitor C, so that data can be read on the unified read bit line RBL0.

Hence, the read bit line RBL0 which is idle in the write cycle of the cell A can be used as the write bit line WBL0 in the write cycle of the cell A. The write bit line WBL0 is not needed when data is read from the cell A, and can be used as the read bit line RBL0.

Figure 13:
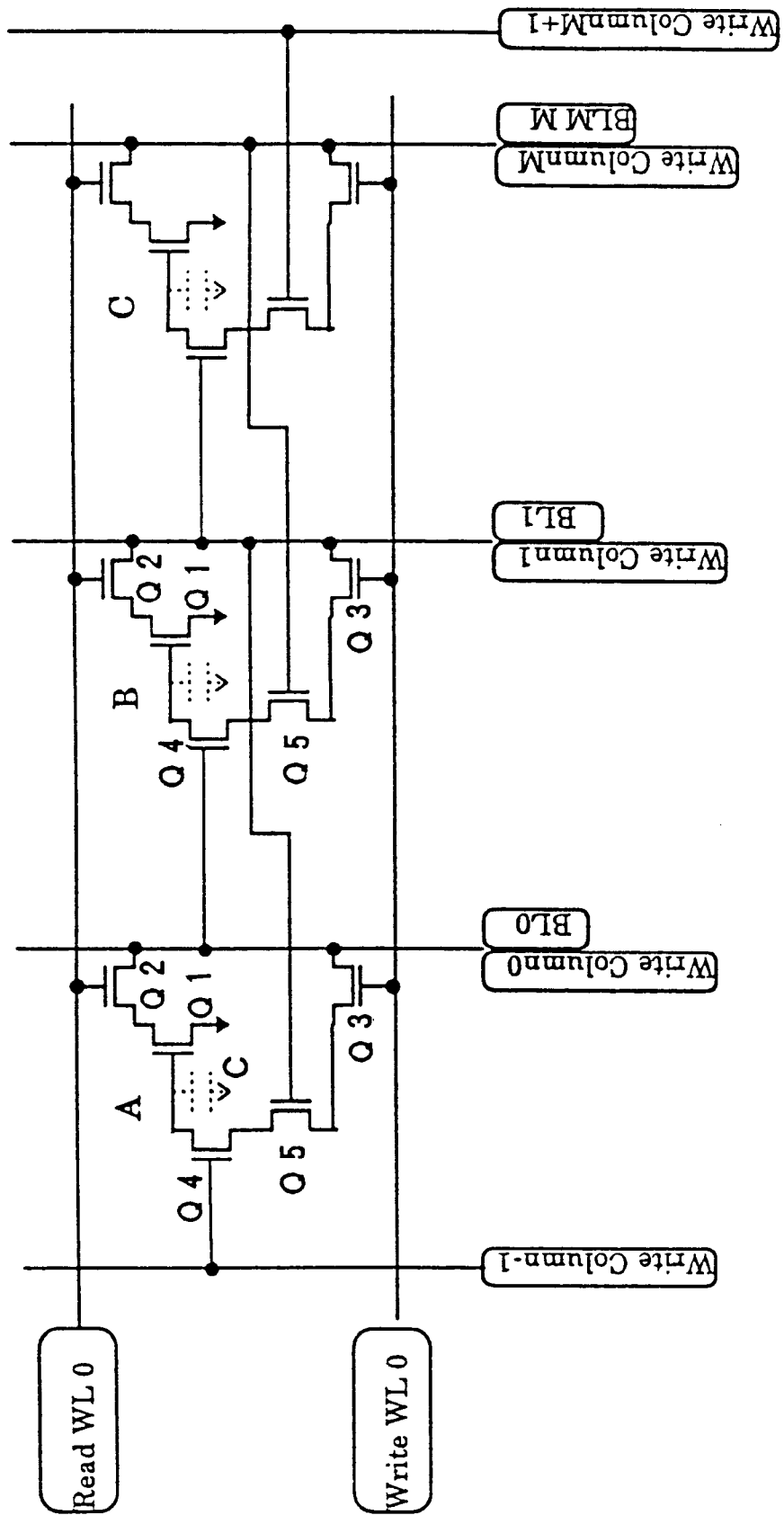
FIG. 13 is a circuit diagram of a sixth embodiment of the present invention.
Figure 14:
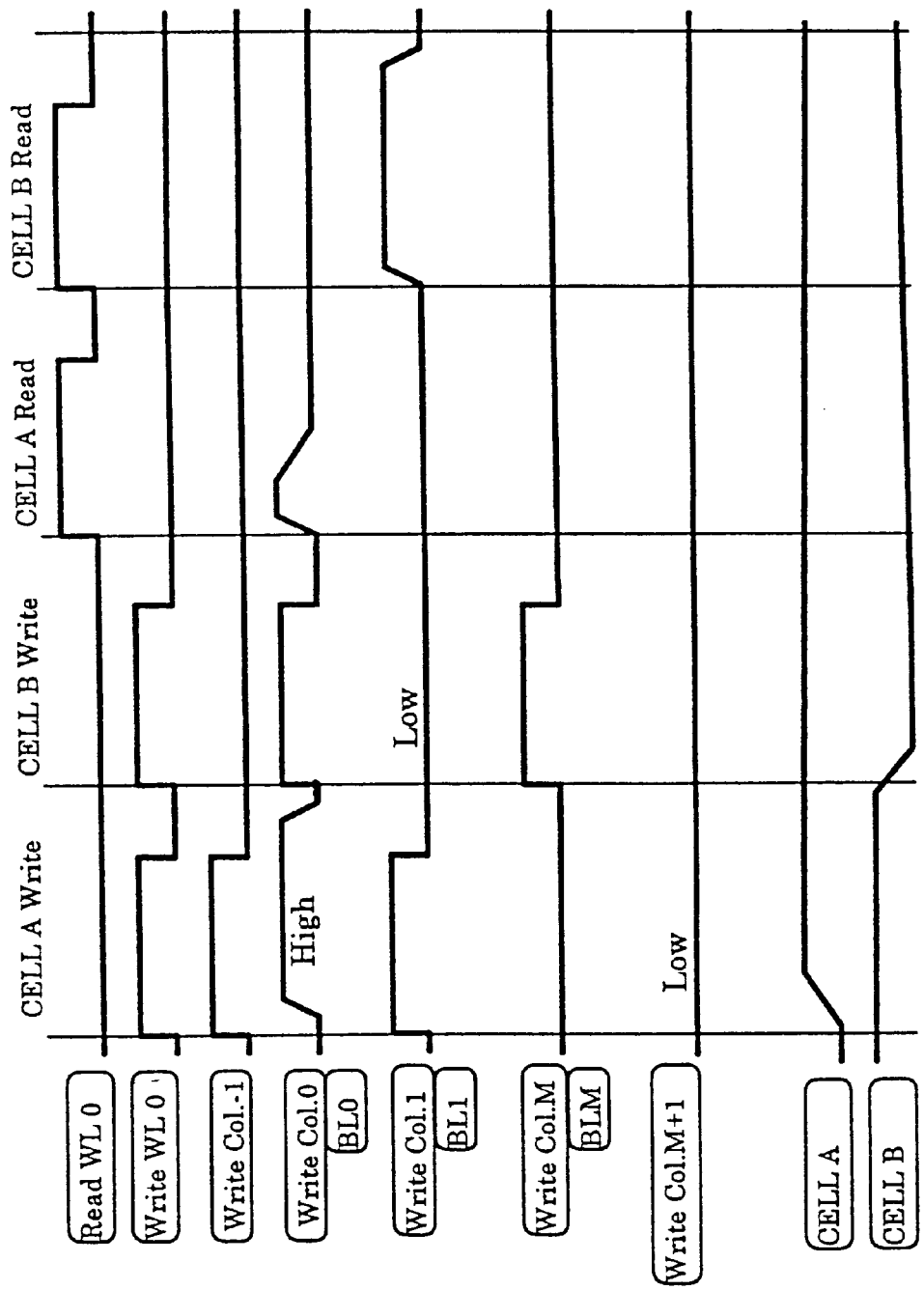
FIG. 14 is a timing chart of an operation of the sixth embodiment of the present invention shown in FIG. 13.

A description will now be given, with reference to FIGS. 13 and 14, of a sixth embodiment of the present invention, which corresponds to a fifth modification of the first embodiment thereof. The sixth embodiment unifies, in each cell, the read bit line RBL and the write bit line WBL (in the following, each bit line is assigned symbol BL in FIG. 13). Further, the above unified line is further unified with the column write select signal line WCOL for the adjacent column. Hence, the number of lines extending along the column can be reduced to 1 per cell. In order to realize the above, a fifth transistor Q5 is provided to each cell so that it is controlled by the unified signal line for the adjacent column located at the right side of the column of the above unified signal line.

For example, the transistor Q5 of the cell A is interposed between the write transistor Q3 and the column write select transistor Q4, and write data is written into the cell capacitor C via the three transistors Q3, Q5 and Q4. The transistor Q3 is controlled by the write word line WWL, and the transistor Q5 is controlled by the bit line BL of the adjacent column located at the right side of the column of interest. The column write select transistor Q4 is controlled by the bit line of the left adjacent column. For example, in FIG. 13, the transistor Q3 of the cell B is controlled by the write word line WWL0, and the transistor Q5 is controlled by the bit line BL2 (which is not shown in FIG. 13 but can be considered as BL(M) where M=2). The transistor Q4 is controlled by the column write select signal WCOL0 of the left adjacent column. The column write select transistor Q4 of the cell A is controlled by the column write select signal WCOL(-1). It will be noted that FIG. 13 shows a cell arrangement for only one word for the sake of simplicity, but cells are arranged in a matrix formation in practice.

In the write cycle, the read word line RWL is low and is thus maintained in the non-selected state, so that the bit line BL is isolated from the cell capacitor C. Hence, the bit line BL can be used as the write bit line. In the read cycle, the write word line WWL is low and is thus maintained in the non-selected state, so that the bit line BL cannot be connected to the cell capacitor C via the transistor Q3.

Two column write select signals WCOL are applied to the gates of the transistors Q4 and Q5 by setting two adjacent bit lines BL of the columns located at both sides to the high level, while the transistor Q3 is turned ON by the write word line WWL. For example, when data is written into the cell B in FIG. 14, the adjacent bit lines BL0 and BL(M) located at both sides of the column having the cell B and the write word line WWL0 are switched to the high level. In this manner, the transistors Q3, Q5 and Q4 of the cell B are turned ON, and data on the bit line BL1 can be written into the cell capacitor C of the cell B via these transistors.

In the read cycle of the cell B, the write word line WWL0 is set to the low level (selected state), whereby the cell capacitor C thereof is isolated from the bit line BL1. The read word line RWL0 is switched to the high level, data stored in the cell B is read to the bit line BL1 via the transistor Q2. In the read cycle, the sense amplifier and the pull-up circuit are connected, as will be described later.

In the above-mentioned first through sixth embodiments of the present invention, data can be written per bit. The following seventh and eighth embodiments of the present invention are directed to realizing a byte-wide arrangement (multi-bit arrangement) in which writing of each bit of data can be selectively controlled. This is also called a write-per-bit arrangement. For example, data having a plurality of bits such as 8 or 16 bits can be read or written at one time, and further a write mask control can be performed for each bit. Hence, it is possible to perform a control such that the four upper bits of eight-bit data are updated, while the four lower bits thereof are retained.

Figure 15:
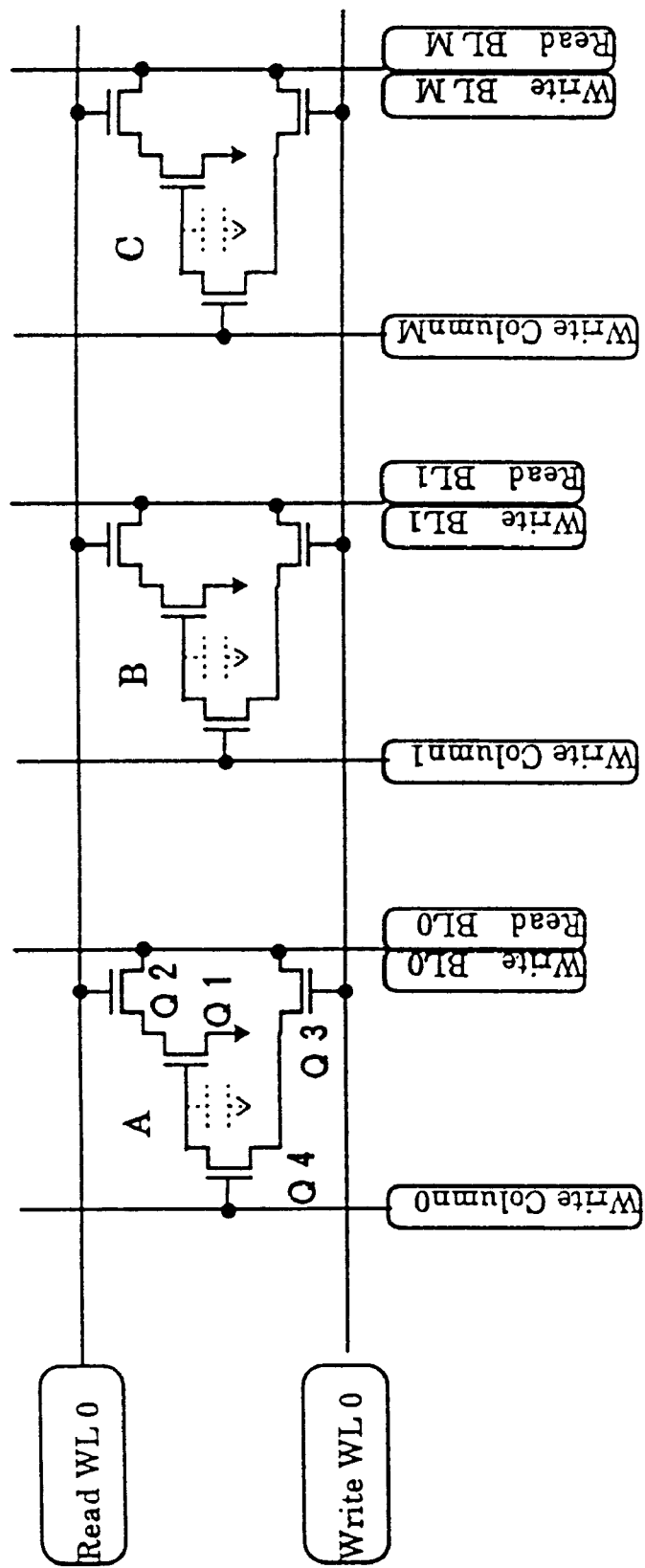
FIG. 15 is a circuit diagram of a seventh embodiment of the present invention.
Figure 16:
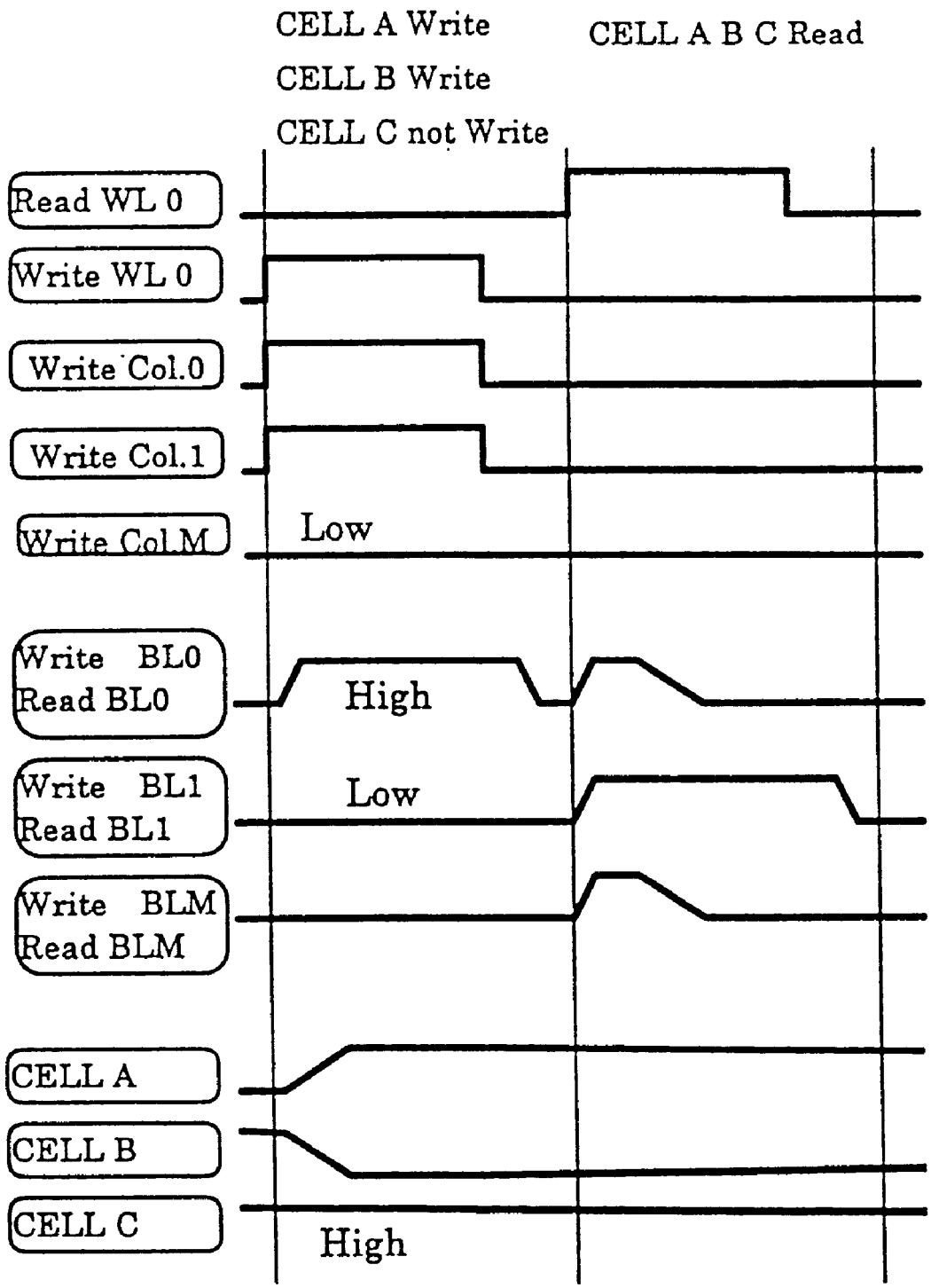
FIG. 16 is a timing chart of an operation of the seventh embodiment of the present invention shown in FIG. 15.

FIGS. 15 and 16 are diagrams of the seventh embodiment of the present invention, in which the write bit line WBL and the read bit line RBL are unified so as to reduce the number of lines extending along the column to two per cell. It will be noted that FIG. 15 shows a cell arrangement for only one word for the sake of simplicity, but cells are arranged in a matrix formation in practice.

Although the circuit configuration shown in FIG. 15 is the same as that shown in FIG. 11, the control of the circuit configuration shown in FIG. 15 is different from that shown in FIG. 12 and is as shown in FIG. 16 in which the circuit shown in FIG. 15 is caused to perform the write-per-bit arrangement. The operation shown in FIG. 16 is observed when it is assumed that the circuit shown in FIG. 15 handles only three bits A, B and C shown therein for the sake of simplicity. In the operation shown in FIG. 16, data are written into the cells A and B in the write cycle, and the original data stored in the cell C is retained. It will be noted that the seventh embodiment of the present invention is not limited to the above three-bit structure and is applicable to structures handling any bits.

The column write select signals WCOL0 and WCOL1 for the cells A and B into which data are to be written are simultaneously switched to the high level, while the column write select signal WCOL(M) for the cell C is maintained at the low level. The write word line WWL0 is switched to the high level, and data are applied to the bit lines WBL0 and WBL1 connected to the selected cells. Hence, data can be written into the cell capacitors of the cells A and B. In the example shown in FIG. 16, high-level data and low-level data are written into the cells A and B, respectively. The cell C holds the high-level data. In the read cycle, the drive circuit which applies the write data to the bit lines are disconnected from these bit lines. Further, the read word line RWL0 is selected, and the bit lines are selected so that the pull-up circuits and the sense amplifiers are connected thereto.

Figure 17:
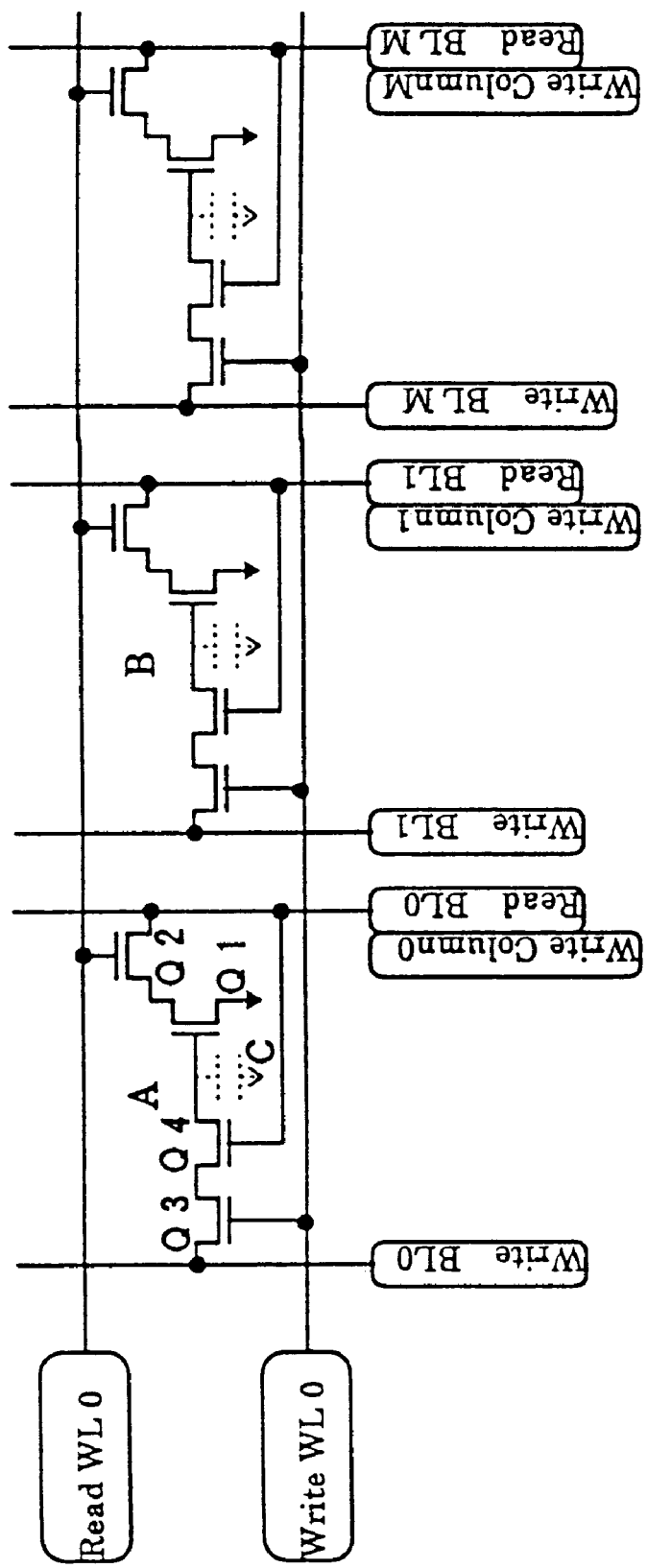
FIG. 17 is a circuit diagram of an eighth embodiment of the present invention.
Figure 18:
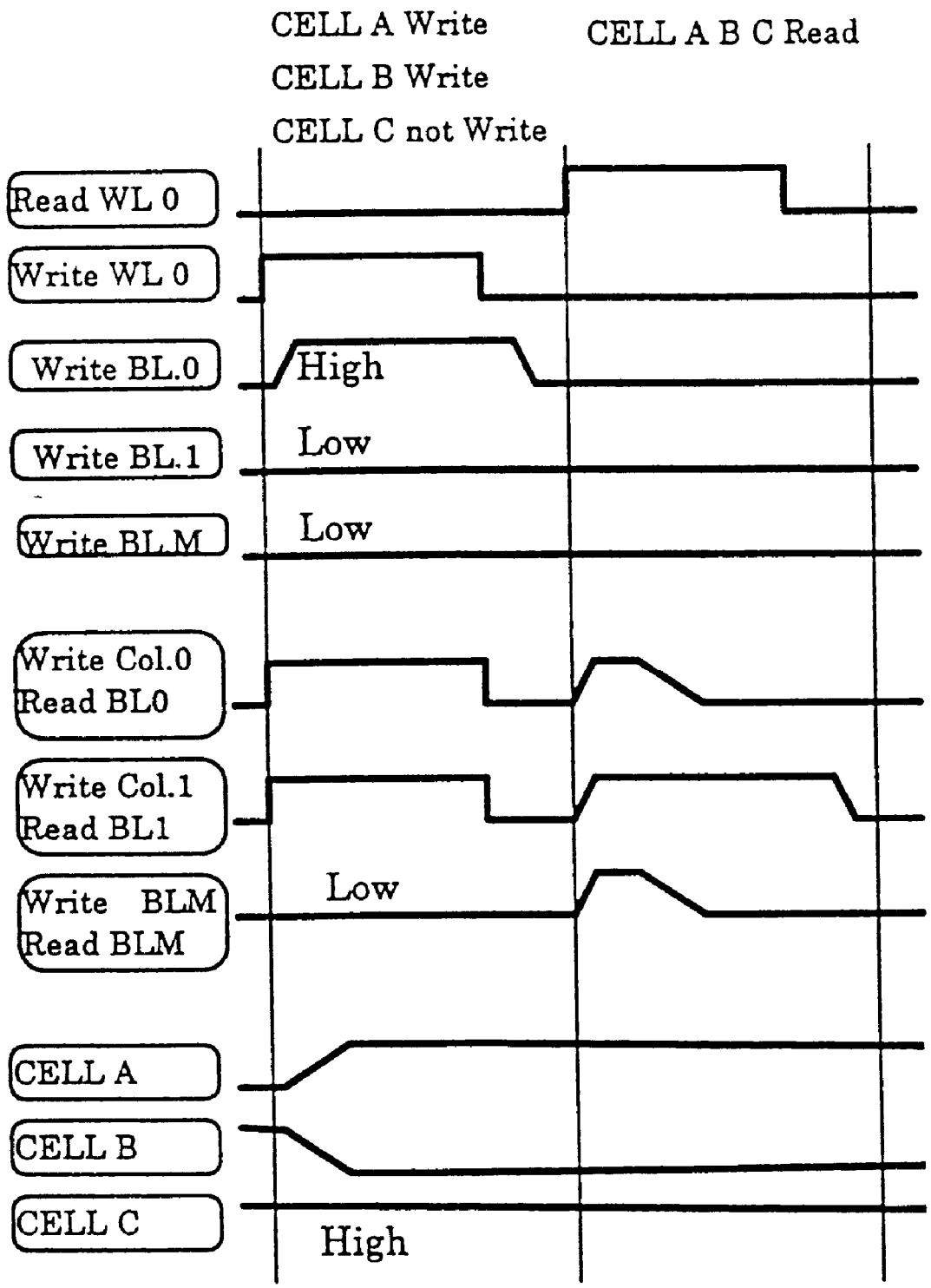
FIG. 18 is a timing chart of an operation of the eighth embodiment of the present invention shown in FIG. 17.

FIGS. 17 and 18 are diagrams of the eighth embodiment of the present invention, in which the column write select signal line WCOL and the read bit line RBL are unified in each cell so that the number of lines extending along the column can be reduced to two per cell. In this regard, the eighth embodiment of the present invention is the same as the seventh embodiment thereof. Further, the bit-based selective write control in the byte-wide (multi-bit) arrangement is carried out. It will be noted that FIG. 17 shows a cell arrangement for only one word for the sake of simplicity, but cells are arranged in a matrix formation in practice.

FIG. 18 shows an operation in which data are written into the cells A and B in the write cycle while the original data of cell C is retained. The column write select signals WCOL0 and WCOL1 for the cells A and B are simultaneously switched to the high level. Further, the write word line WWL0 is set to the high level, and write data are applied to the write bit lines WBL0 and WBL1 respectively provided for the cells A and B. Hence, the write data can be written into the cell capacitors of the cells A and B. When data is read from the cells, the column write select signal lines WCOL0–WCOL(M) are turned OFF, and the read word line RWL0 is selected. Then, the bit lines RBL0–RBL(M) are selected and are connected to the pull-up circuits and the sense amplifiers. Hence, data can be read from the cells in parallel.

Figure 19:
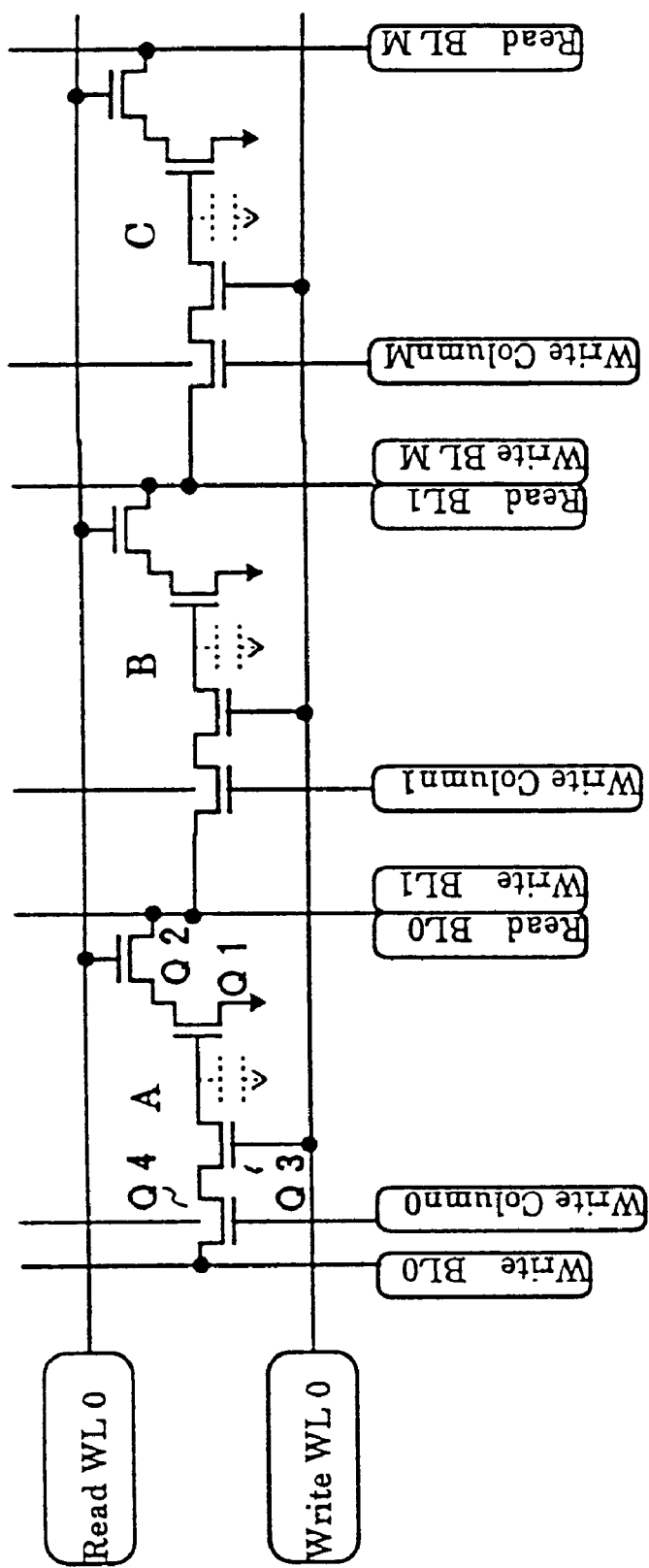
FIG. 19 is a circuit diagram of a ninth embodiment of the present invention.
Figure 20:
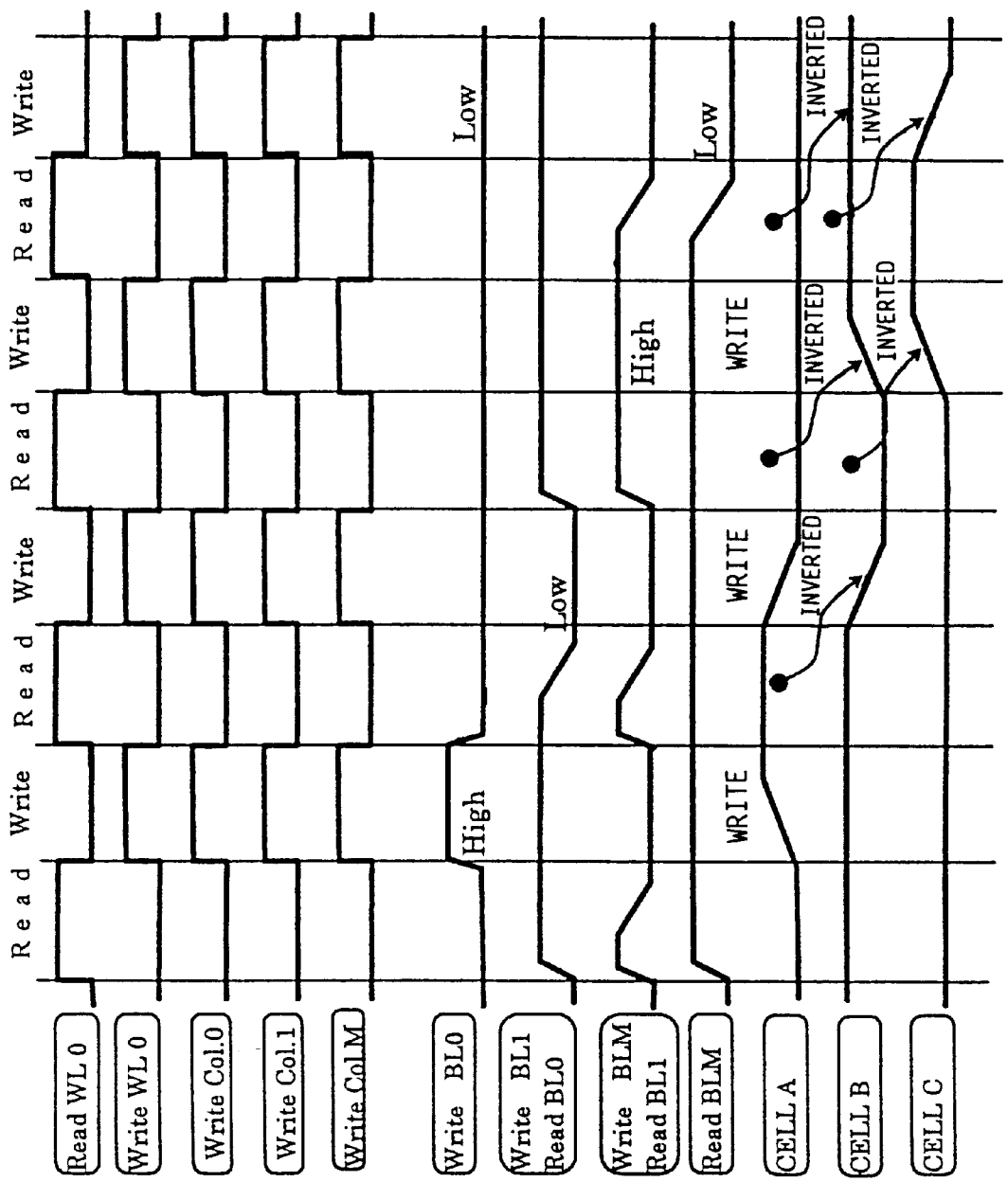
FIG. 20 is a timing chart of an operation of the ninth embodiment of the present invention shown in FIG. 19.

FIGS. 19 and 20 are diagrams of a ninth embodiment of the present invention, in which the read bit line RBL and the write bit line WBL for the adjacent column are unified, so that the number of lines extending along the column can be reduced to two per cell. In this regard, the ninth embodiment of the present invention is the same as the circuit configuration shown in FIG. 9. According to the ninth embodiment of the present invention, the circuit shown in FIG. 19 is controlled so as to function as a shift register. It will be noted that FIG. 19 shows a cell arrangement for only one word for the sake of simplicity, but cells are arranged in a matrix formation in practice.

Referring to FIG. 20, the shift register operation of the circuit shown in FIG. 19 will be described. In the first half of each cycle, data is read and the potential of the read bit line RBL is caused to be settled to the high or low level. The cells have a gain. Hence, if an appropriate time is defined, an operation in which the potential of the bit line swings between the ground level and a power supply voltage VDD can be realized without any sense amplifier. More particularly, the bit line which is pulled up to the power supply voltage VDD in the pulse-like formation is pulled down to the ground level by the cell or is retained at the power supply voltage VDD. In the second half of each cycle, data is written into the cell while the above data is used as write data for the adjacent cell located at the right side. Data can be shifted to the cell at the right side by one cell in one cycle formed of the above read and write operations. It should be noted that the data is inverted each time it is shifted rightwards by one cell, as shown in FIG. 20.

It is possible to shift data in an oblique direction by selecting different addresses by using the read word line and the write word line.

If some column write select signal lines WCOL are fixed to the low level, it is possible to hold data of desired cells as in the case of the bit-based writing arrangement. Hence, it is possible to partially shift data.

Figure 21:
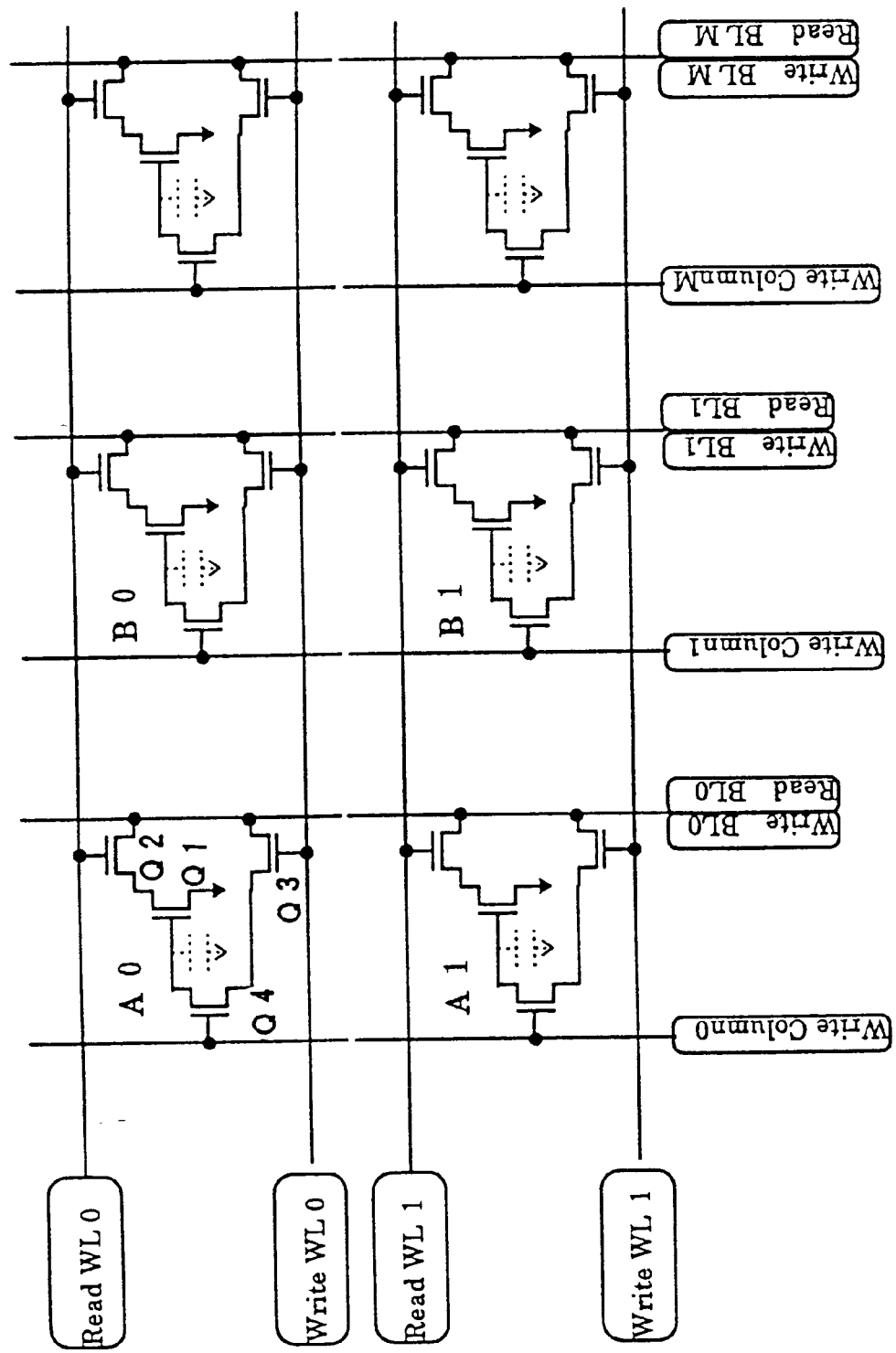
FIG. 21 is a circuit diagram of a tenth embodiment of the present invention.
Figure 22:
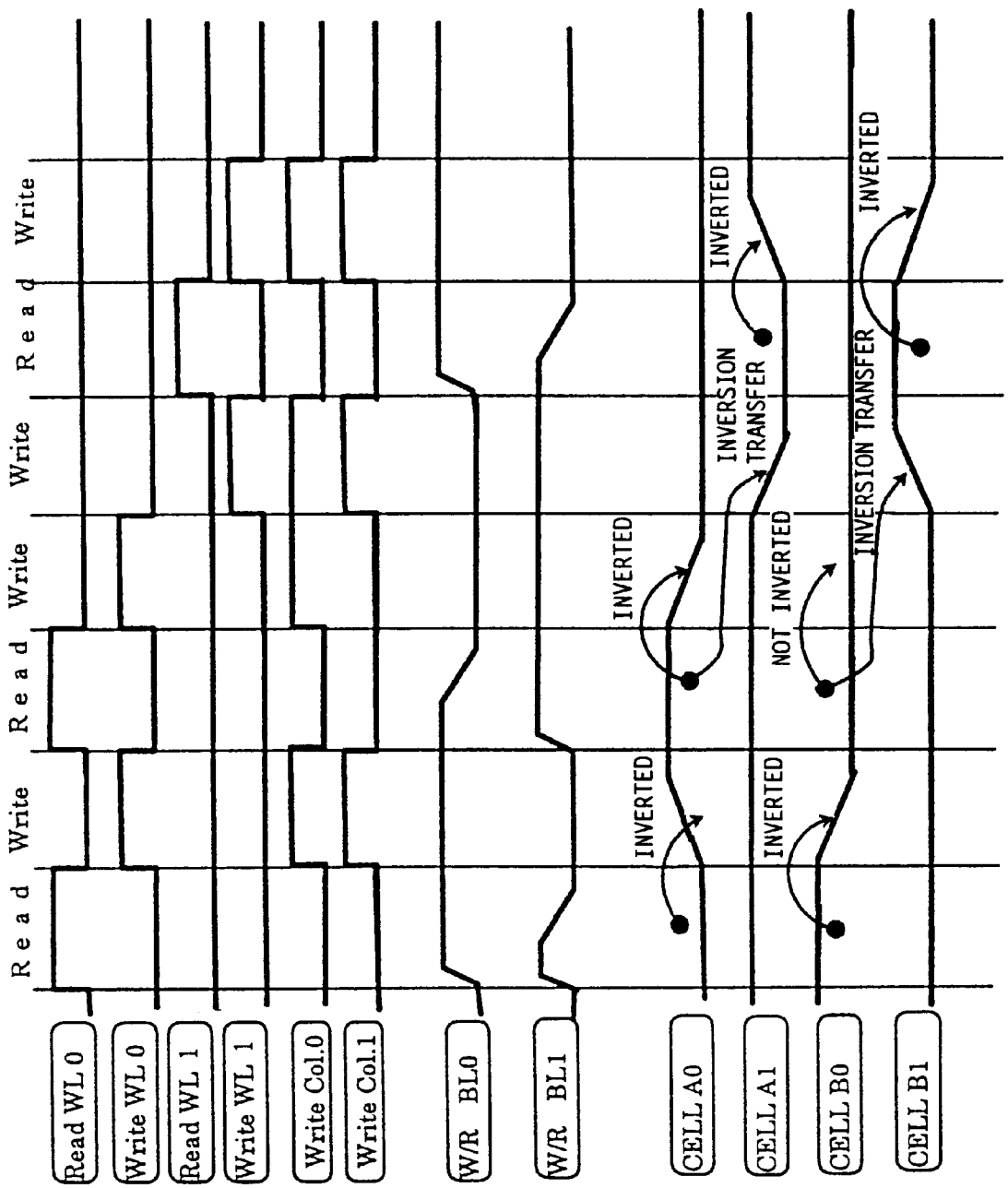
FIG. 22 is a timing chart of an operation of the tenth embodiment of the present invention shown in FIG. 21.

FIGS. 21 and 22 are diagrams of a tenth embodiment of the present invention in which the read bit line RBL and the write bit line WBL are unified in each cell so that the number of lines extending along the column can be reduced to two per cell. In this regard, the circuit configuration shown in FIG. 21 is the same as that shown in FIG. 11. Further, the circuit configuration shown in FIG. 21 is controlled so as to function as a shift register in which data can be shifted from a cell to another cell in the same column. It will be noted that FIG. 21 shows a cell arrangement for only two words for the sake of simplicity, but cells are arranged in a matrix formation in practice.

Referring to FIG. 22, in the first cycle, the read word line RWL0 is driven so that data is read from cells A0 and B0 to the unified (read) bit lines RBL0 and RBL1, respectively. Then, the write word line WWL0 and the column write select signal lines WCOL0 and WCOL1 are driven so that the read data are written into the cells A0 and B0. Hence, as shown in FIG. 22, the inverted versions of the original data of the cells A0 and B0 are stored therein. Next, the read word line RWL0 is driven, and the data stored in the cells A0 and B0 are output again. Since the inverted versions of the original data are written into the cells A0 and B0 as described above, the potentials of the read bit lines RBL0 and RBL1 are inverted.

Then, the write word line WWL0 and the column write select signal line WCOL0 are driven so that data is written into the cell A0. Hence, the cell A0 stores the original data, while the cell B0 has the inverted version of the original data. Subsequently, the write word line WWL1 and the column write select signal lines WCOL0 and WCOL1 are driven. Hence, data on the unified bit lines BL0 and BL1 are written into cells A1 and B1, respectively. Hence, the cells A1 and B1 respectively store the original data of the cells A0 and B0 which are transferred thereto. Finally, the read word line RWL1 is driven so that the data stored in the cells A1 and B1 are respectively read to the unified read bit lines RBL0 and RBL1. Then, the write word line WWL1 and the column write select signal lines WCOL0 and WCOL1 are driven so that the read data are written into the cells A1 and B1. Hence, the data stored in the cells A1 and B1 are inverted.

In the above-mentioned manner, a plurality of pieces of data can be transferred along the column. It can be seen from the above description that the refresh can be performed by executing the above self-inverting operation twice. Hence, the refresh operation does not need any sense amplifier. When the column write select signal is driven at the time of writing data, the data is inverted. When the column write select signal is not driven at the time of writing data, the data is not inverted but held. Hence, it is possible to invert the specified bit by the column write select signal, in other words, to perform an XOR operation. A copy of data can be executed if a first transfer with the data inversion is performed once and a second transfer with the self inversion is carried out in the place to which the data is inverted and transferred by the above first transfer. Further, a multiple-copy of data can be performed by executing a first transfer with the data inversion and repeatedly executing the transfer.

The above-mentioned first through tenth embodiments of the present invention are directed to configurations of the cell array which is an essential part of the semiconductor memory devices. Now, a description will be given of the overall structures of semiconductor memory devices equipped with any of the first through tenth embodiments of the present invention.

Figure 23:
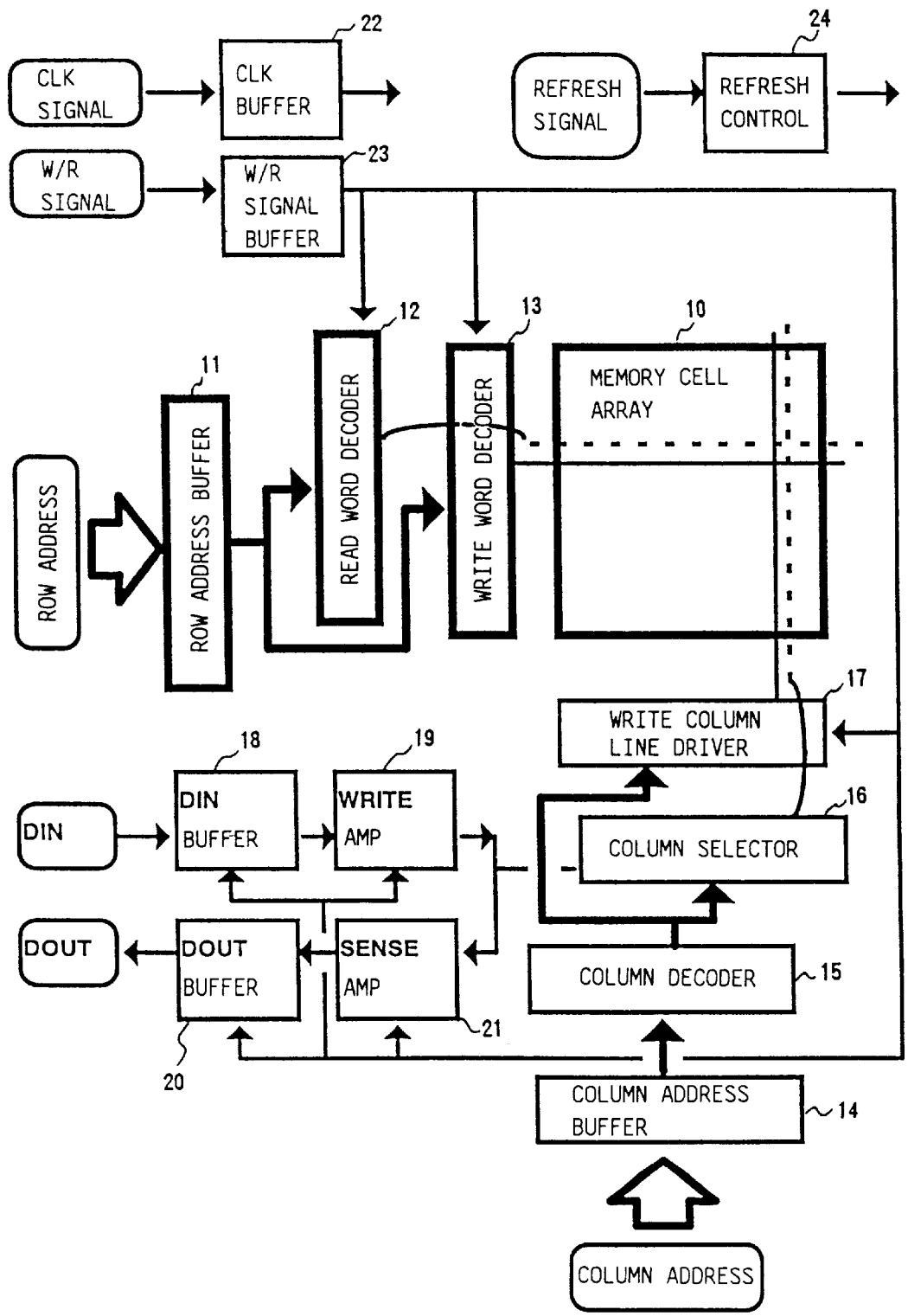
FIG. 23 is a block diagram of an overall structure of a semiconductor memory device according to the present invention.

FIG. 23 is a block diagram showing an overall structure (DRAM) of the semiconductor memory device. As shown in FIG. 23, the semiconductor memory device comprises a memory cell array 10, a row address buffer 11, a read word decoder 12, a write word decoder 13, a column address buffer 14, a column decoder 15, a column selector 16, a write column line driver 17, a data input (DIN) buffer 18, a write amplifier 19, data output (DOUT) buffer 20, a sense amplifier 21, a clock buffer 22 and a write/read (W/R) signal buffer 23, and a refresh controller 24.

The row address is temporarily stored in the row address buffer 11, and is then output to the read word decoder 12 and the write word decoder 13. The write/read signal (which corresponds to a write enable signal/WE) is applied, via the buffer 23, to the decoders 12 and 13, the write column line driver 17, the data input buffer 18, the write amplifier 19, the data output buffer 20 and the sense amplifier 21. When a data write is indicated by the write/read signal, the word decoder 13 is activated. Then, the word decoder 13 decodes the row address and drives the write word line WWL of the memory cell array 10. When a data read is indicated by the write/read signal, the word decoder 12 is activated. Then, the word decoder 12 decodes the row address, and drives the read word line RWL of the memory cell array 10.

The column address is input to the column address buffer 14, and is then decoded by the column decoder 15. The decoded column address is output to the column selector 16 and the write column line driver 17. The column selector 16 selectively connects the aforementioned write bit lines WBL and the read bit lines RBL to the write amplifier 19 or the sense amplifier 21. The write column line driver 17 drives the aforementioned column write select signal lines WCOL. Write data DIN externally supplied is applied to the column selector 16 via the data input buffer 18 and the write amplifier 19. The column selector 16 drives the corresponding write bit line WBL. Data read from the memory cell array 10 passes through the sense amplifier 21 and the data output buffer 20, and is then output to the outside of the device as output data DOUT.

A clock signal CLK externally supplied is input to the clock buffer 22, and is then distributed to various parts. The clock buffer 22 is equipped with a timing generator, which generates various timing signals from the externally supplied clock signal CLK. The refresh controller 24 responds to a refresh signal, and controls a predetermined refresh operation.

Figure 24:
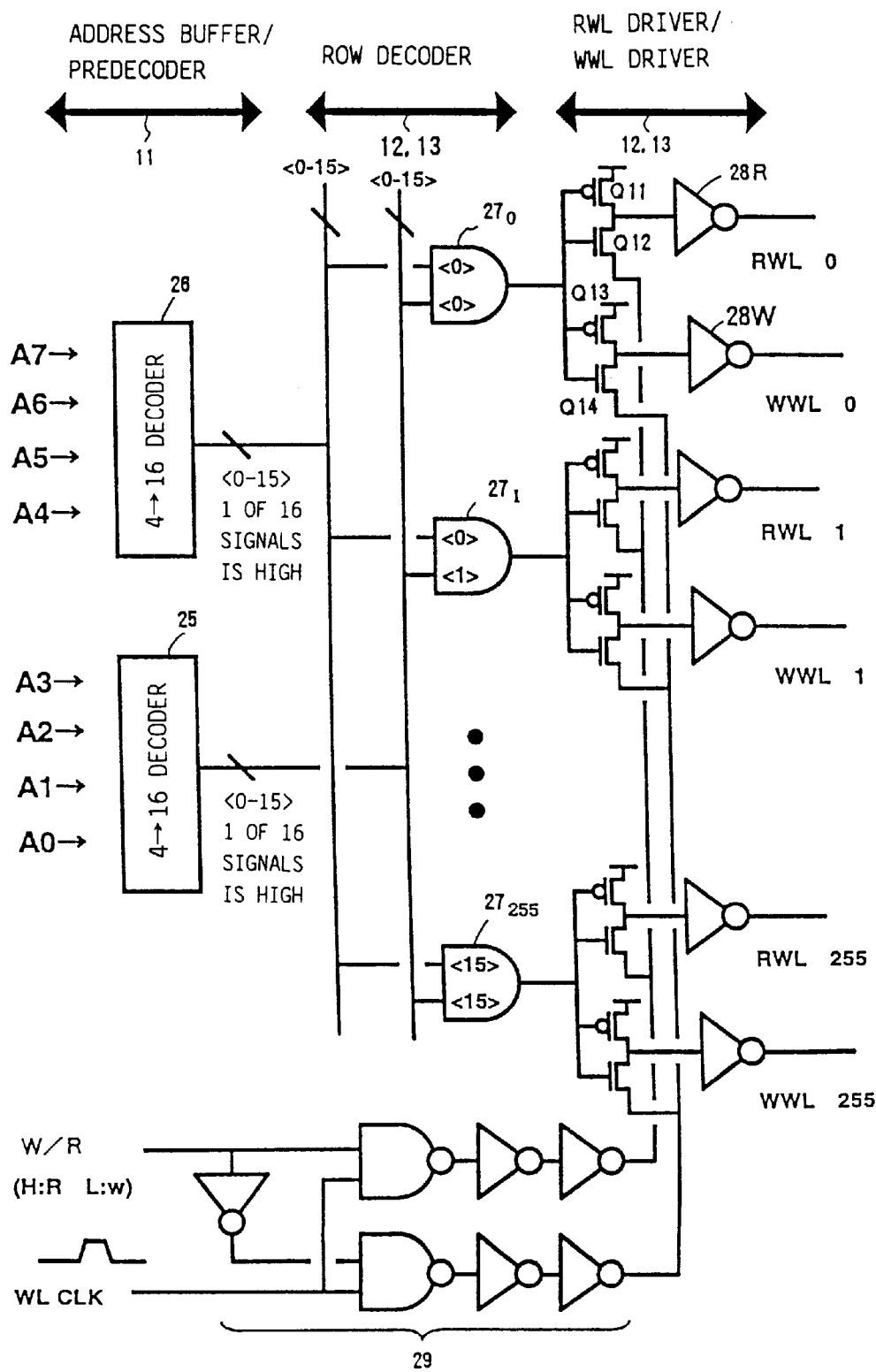
FIG. 24 is a circuit diagram of a circuit configuration of a word line drive system of the semiconductor memory device shown in FIG. 23.

FIG. 24 shows a word line drive system of the semiconductor memory device shown in FIG. 23. An address buffer/predecoder shown in FIG. 24 corresponds to an internal structure of the row address buffer 11 shown in FIG. 23. A row decoder, an RWL driver and a WWL driver shown in FIG. 24 correspond to the read word decoder 12 and the write word decoder 13 shown in FIG. 23. The word line drive system shown in FIG. 24 can be common to any of the first through tenth embodiments of the present invention.

The address buffer/predecoder includes two decoders 25 and 26, each of which converts four bits applied thereto into 16 signals. The address signal is composed of 16 bits A0–A15. Eight bits A0–A7 form the row address, and the remaining eight bits A8–A15 form the column address. The decoder 25 converts the address bits A0–A3 into 16 signals, which are then applied to the row decoder of the next stage. Similarly, the decoder 26 converts the address bits A4–A7 into 16 signals, which are then applied to the row decoder of the next stage.

The row decoder includes 256 AND gates $27_0$–$27_{255}$, each of which gates receives a corresponding one of the 16 signals from the decoder 25 and a corresponding one of the 16 signals from the decoder 26, and executes an AND operation thereon.

The RWL/WWL driver includes transistors 256 unit circuits, each of which is made up of Q11–Q14 and two inverters 28R and 28W. The transistors Q11 and Q13 are P-channel MOS transistors, and the transistors Q12 and Q14 are N-channel MOS transistors. For example, the output signal of the AND gate $27_0$ is applied to the gates of the transistors Q11–Q14. The source of the transistor Q11 is connected to the power supply voltage VDD, and the source of the transistor Q12 is connected to the timing circuit 29. The source of the transistor Q13 is connected to the power supply voltage VDD, and the source of the transistor Q14 is connected to the timing circuit 29. The drains of the transistors Q11 and Q12 are connected to the input of the inverter 28R, and the output of the inverter 28R is connected to the read word line RWL0. The drains of the transistors Q13 and Q14 are connected to the input of the inverter 28W, and the output of the inverter 28W is connected to the write word line WWL0.

The timing circuit 29, which is made up of two NAND gates and five inverters, receives the write/read signal W/R from the buffer shown in FIG. 23 and a word line clock signal WLCLK from the clock buffer 22, and generates two signals which become low at the time of writing and reading data, respectively. The signal line which becomes low at the time of writing data is connected to the source of the transistor Q14, and the signal line which becomes low at the time of reading data is connected to the source of the transistor Q12.

Figure 25:
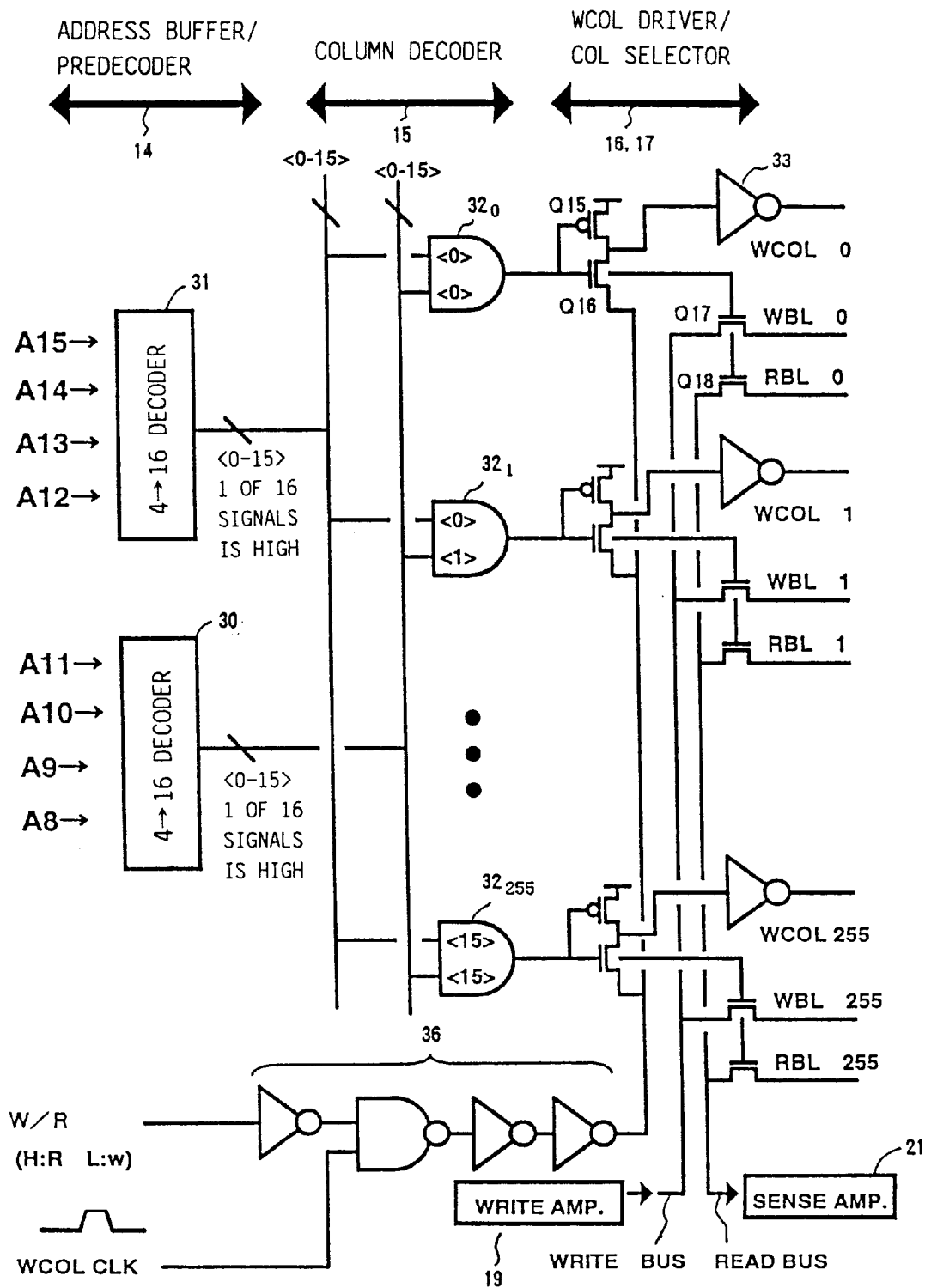
FIG. 25 is a circuit diagram of a circuit configuration of a column system of the semiconductor memory device shown in FIG. 23 and related to the first embodiment of the present invention.

FIG. 25 is a circuit diagram of a structure of a column system corresponding to the first embodiment of the present invention shown in FIGS. 3 and 4. The column system shown in FIG. 25 is provided in each of the embodiments of the present invention. The column system shown in FIG. 25 is made up of an address buffer/predecoder, a column decoder and a WCOL driver/COL selector. The address buffer/predecoder corresponds to the column address buffer 14 shown in FIG. 23. The column decoder shown in FIG. 25 corresponds to the column decoder 15 shown in FIG. 23. The column selector/column write select signal line (COL selector/WCOL driver) corresponds to the column selector 16 and the write column line driver 17 shown in FIG. 23.

The address buffer/predecoder includes two decoders 30 and 31, each of which converts four bits into 16 signals. As has been described previously, the address consists of 16 bits, and the bits A8–A15 thereof forms the column address. The coder 30 converts the address bits A8–A11 into 16 signals, which are output to the column decoder of the next stage. Similarly, the decoder 31 converts the address bits A12–A15 into 16 signals, which are output to the column decoder of the next stage.

The column decoder, which includes 256 AND gates $32_0$–$32_{255}$, receives one of the 16 signals from the decoder 30 and one of the 16 signals from the decoder 31, and performs an AND operation on the received signals.

The WCOL driver/COL selector 256 unit circuits, each of which is made up of transistors Q15–Q18 and an inverter 33. The transistor Q15 is a P-channel MOS transistor, and the transistors Q16–Q18 are N-channel MOS transistors. For example, the output signal of the AND gate $32_0$ is connected to the gates of the transistors Q15–Q18. The source of the transistor Q15 is connected to the power supply voltage VDD, and the source of the transistor Q16 is connected to the timing circuit 36. The drain of the transistor Q17 is connected to the write amplifier 19 via a write bus, and the drain of the transistor Q18 is connected to the sense amplifier 21 via a read bus. The connection node of the transistors Q15 and Q16 is connected to the input of the inverter 33, and the output of which drives the column write select signal line WCOL0. The source of the transistor Q17 is connected to the write bit line WBL0, and the source of the transistor Q18 is connected to the read bit line RBL0.

The timing circuit 36 includes three inverters and a NAND gate, and outputs a low-level signal during the period of the high-level of a write select clock WCOL CLK supplied from the clock buffer 22 when the write/read signal W/R is at the low level which indicates the write operation. The write operation is indicated when the output signal of the timing circuit 36 is low. When the 0th column is specified, the output of the AND gate $32_0$ of the column decoder 15 is switched to the high level. Hence, the low-level signal is applied to the inverter 33 via the transistor Q16, and the column write select signal WCOL0 is switched to the high level. At that time, the transistors Q17 and Q18 are both ON.

Figure 26:
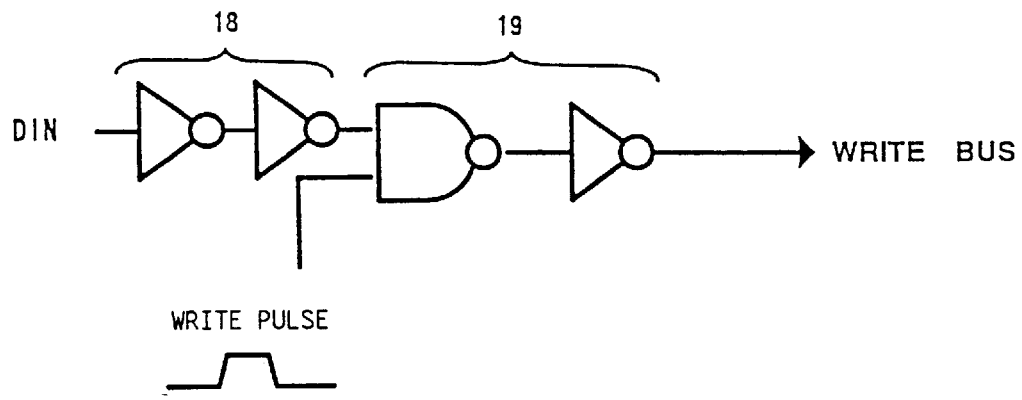
FIG. 26 is a circuit diagram of a write amplifier shown in FIG. 23.

FIG. 26 is a circuit diagram of an example of the data input buffer 18 and the write amplifier 19. The data input buffer 18 includes two inverters, and the write amplifier includes one inverter and one NAND gate. At the timing of the write pulse from the clock buffer 22, write data from the data input buffer 18 is output to the write bus.

Figure 27A:
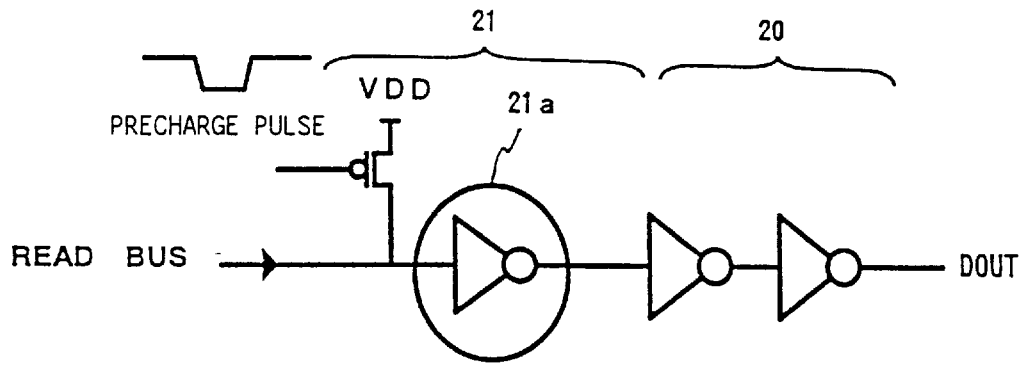
FIG. 27A is a circuit diagram of a circuit configuration of a sense amplifier shown in FIG. 23.
Figure 27B:
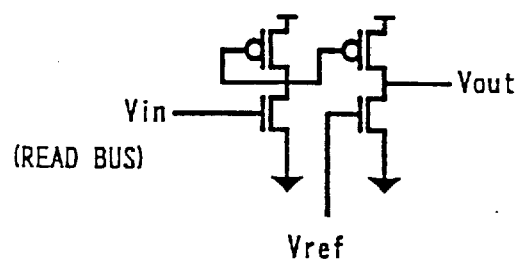
FIG. 27B is a circuit diagram of another circuit configuration of the sense amplifier shown in FIG. 23.

FIGS. 27A and 27B are respectively circuit diagrams of two examples of the sense amplifier 21. FIG. 27A shows an inverter sense amplifier, and FIG. 27B shows a current-mirror sense amplifier. The inverter sense amplifier shown in FIG. 27A is made up of an inverter 21a and one P-channel MOS transistor. A precharge pulse is applied to the gate of the P-channel MOS transistor, so that the read bus is precharged to the power supply voltage VDD. The output buffer 20 has two inverters so that the three inverters are provided between the read bus and the data output buffer 20 (FIG. 23). The inverted version of the input signal applied to the inverter 21a of the first stage is output from the inverter of the third stage. The current-mirror sense amplifier shown in FIG. 27B can be used so that it is replaced by the inverter 21a of the amplifier 21. The current-mirror sense amplifier is made up of two P-channel MOS transistors and two N-channel MOS transistors. The current-mirror sense amplifier senses the potential Vin of the read bus, and outputs a sensed voltage Vout to the data output buffer 20.

Figure 28:
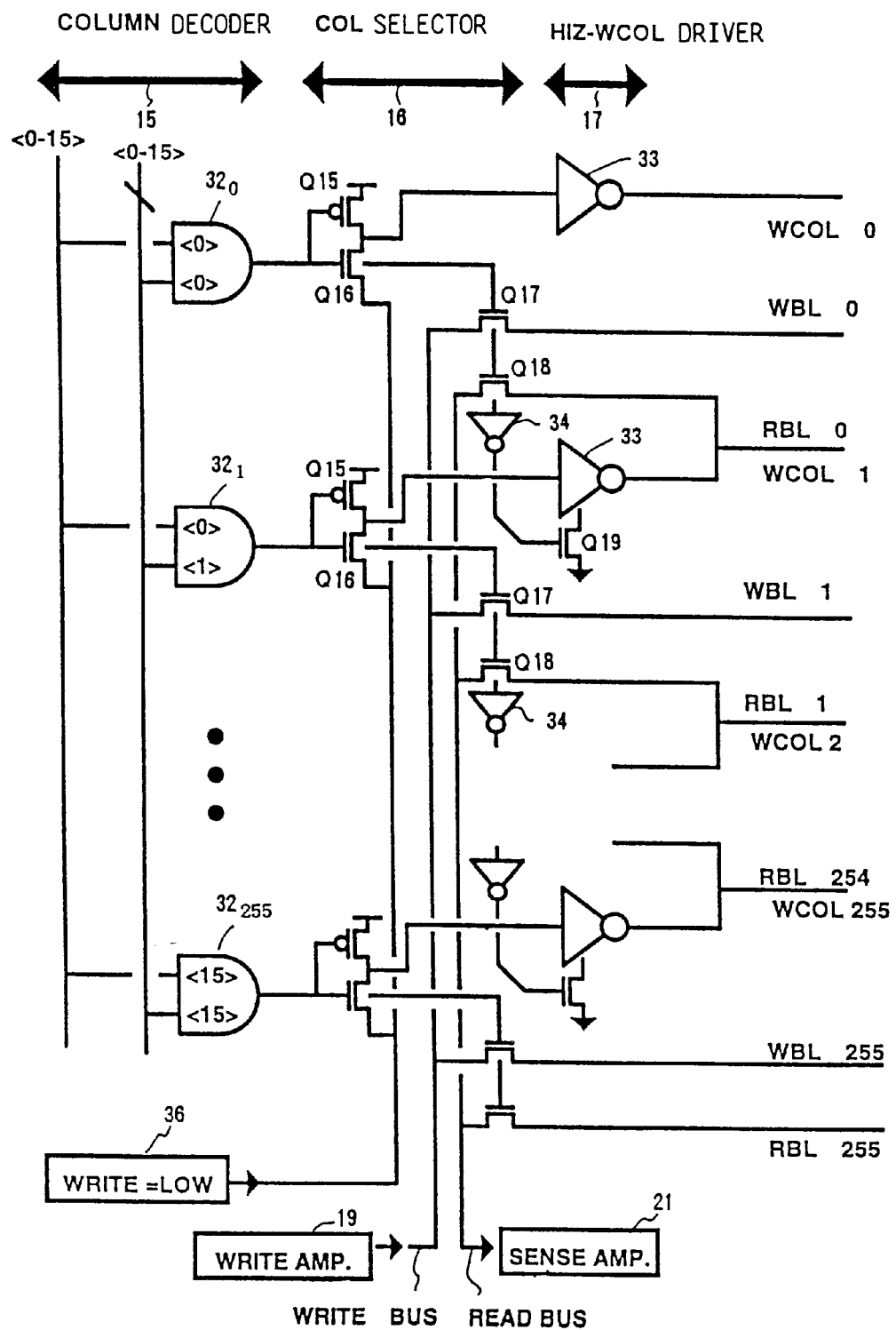
FIG. 28 is a circuit diagram of a circuit configuration of a column system of the semiconductor memory device shown in FIG. 23 and related to the second embodiment of the present invention.

FIG. 28 is a diagram of a structure of a column system correspond to the second embodiment of the present invention described with reference to FIGS. 5 and 6. The column system shown in FIG. 28 includes the column decoder 15, the column selector 16 and the write column line driver 17 labeled HIZ-WCOL. In practice, the column system shown in FIG. 28 includes the address buffer/predecoder 14, which is omitted from FIG. 28 for the sake of simplicity. The column selector 16 includes the transistors Q15–Q18 and the inverter 34. The driver 17 includes the transistor Q19 and the inverter 33.

According to the second embodiment of the present invention, the read bit line RBL and the column write select signal line WCOL for the right adjacent column are unified (RBLn=WCOLn+1). The driver 17 realizes the above unified signal line. More particularly, The drain of the transistor Q18 of the 0th column is connected to the output of the inverter 33 of the first column, so that the inverter 33 of the first column is turned ON and OFF by the transistor Q19. When the transistor Q18 is ON, the transistor Q19 is OFF, and the output of the AND gate $32_1$ is low. Hence, the transistor Q15 is ON and the inverter 33 receives the high-level signal. Hence, the P-channel MOS transistor of the inverter 33 is turned OFF, and thus the output of the inverter 33 of the first column is in the high-impedance state. That is, the unified signal line functions as the read bit line RBL0. When the transistor Q18 is OFF, the transistor Q19 is ON. When the output of the AND gate $32_1$ is low, the inverter 33 of the first column outputs the low-level signal. When the output of the AND gate $32_1$ is high and the signal from the timing circuit 36 is low, the transistor Q16 is turned ON, and the input of the inverter 33 is low. Hence, the inverter 33 outputs the high-level signal. In this state, the unified signal line functions as the column write select signal line WCOL1 of the first column.

Figure 29:
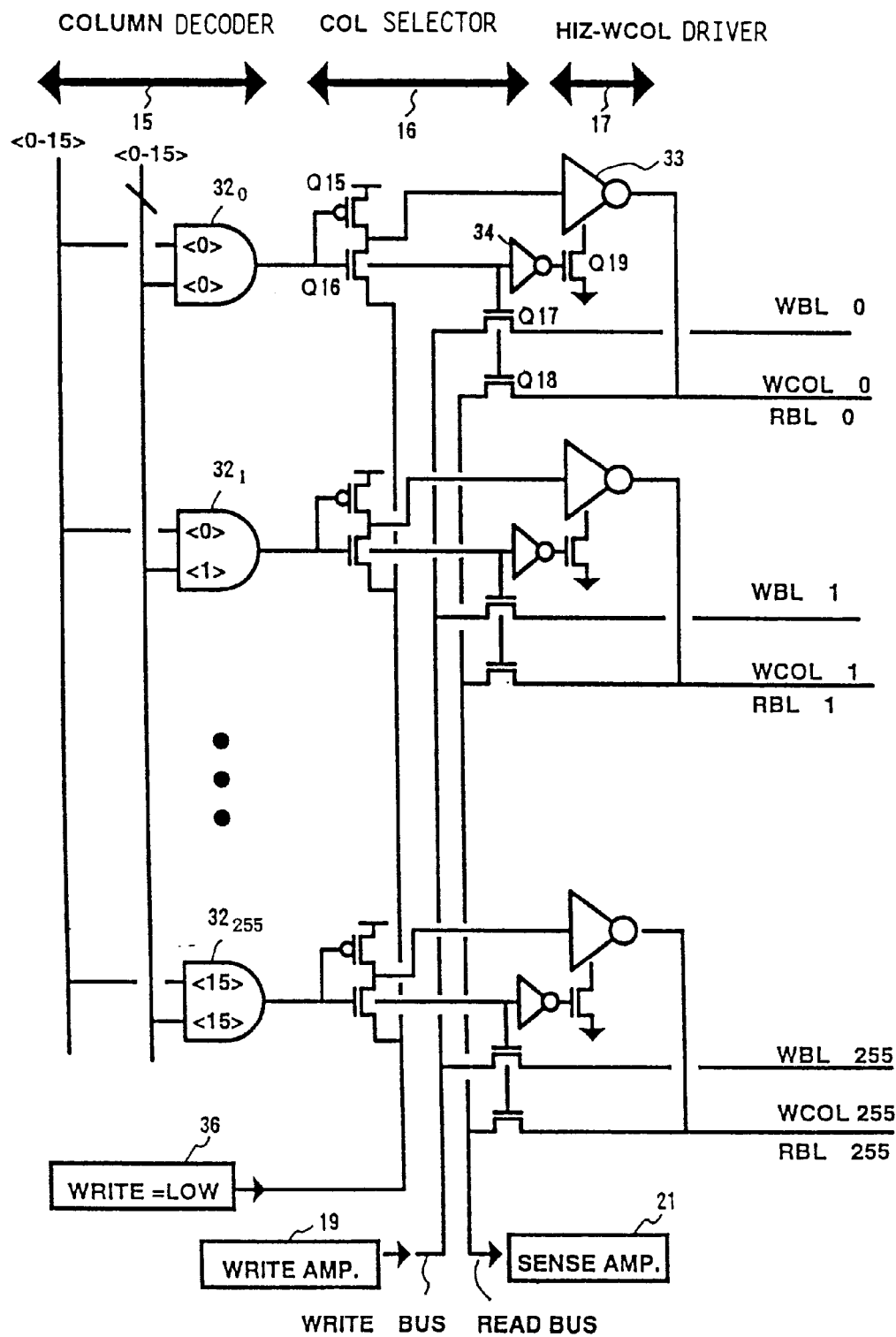
FIG. 29 is a circuit diagram of a circuit configuration of a column system of the semiconductor memory device shown in FIG. 23 and related to the third embodiment of the present invention.

FIG. 29 is a diagram of a structure of a column system correspond to the third embodiment of the present invention described with reference to FIGS. 7 and 8. The column system shown in FIG. 29 includes the column decoder 15, the column selector 16 and the write column line driver 17 labeled HIZ-WCOL. Although the column system shown in FIG. 29 has the address buffer/predecoder 14 shown in FIG. 25, it is not shown for the sake of simplicity. The column selector 16 includes the transistors Q15–Q18 and the inverter 34. The driver 17 includes the transistor Q19 and the inverter 33.

According to the third embodiment of the present invention, the read bit line RBL and the column write select signal line WCOL are unified in each column (RBLn= WCOLn). The driver 17 has a configuration which realizes the above unified signal line. For example, as to the 0th column, the drain of the transistor Q18 and the output of the inverter 33 are connected together. The inverter 33 is controlled to be turned ON and OFF by the transistor Q19. When the signal from the timing circuit 36 is high and indicates the read operation, the inverter 33 receives the high-level signal, and the P-channel MOS transistor of the inverter 33 is OFF. The AND gate $32_0$ is selected and outputs the high-level signal. The transistor Q18 is turned ON and then the transistor Q19 is turned OFF. Hence, the output of the inverter 33 of the 0th column is switched to the high-impedance state. Thus, the unified signal line functions as the read bit line RBL0. When the AND gate $32_0$ outputs the low-level signal (non-selected state), the transistor Q18 is turned OFF, and the transistor Q19 is turned ON. Hence, the inverter 33 receives the high-level signal, and the N-channel MOS transistor thereof is turned ON. Hence, the inverter 33 outputs the low-level signal.

When the signal from the timing circuit 36 is low and the write operation is indicated, the AND gate $32_0$ is selected and outputs the high-level signal. Hence, the transistor Q18 is turned ON, while the sense amplifier 21 is in the disabled state. Hence, the inverter 33 receives the low-level signal, so that the P-channel MOS transistor of the inverter 33 is turned ON and the high-level signal is output from the inverter 33. The above means that the column write select signal WCOL0 is output. When the AND gate $32_0$ is in the non-selected state and thus outputs the low-level signal, the transistor Q15 is turned ON, and the N-channel MOS transistor of the inverter 33 is turned ON. The inverter 34 receives the low-level signal and outputs its inverted version. Hence, the transistor Q19 is turned ON. As a result, the inverter 33 outputs the low-level signal. Thus, the unified signal line functions as the column write select signal line WCOL0 of the 0th column.

Figure 30:
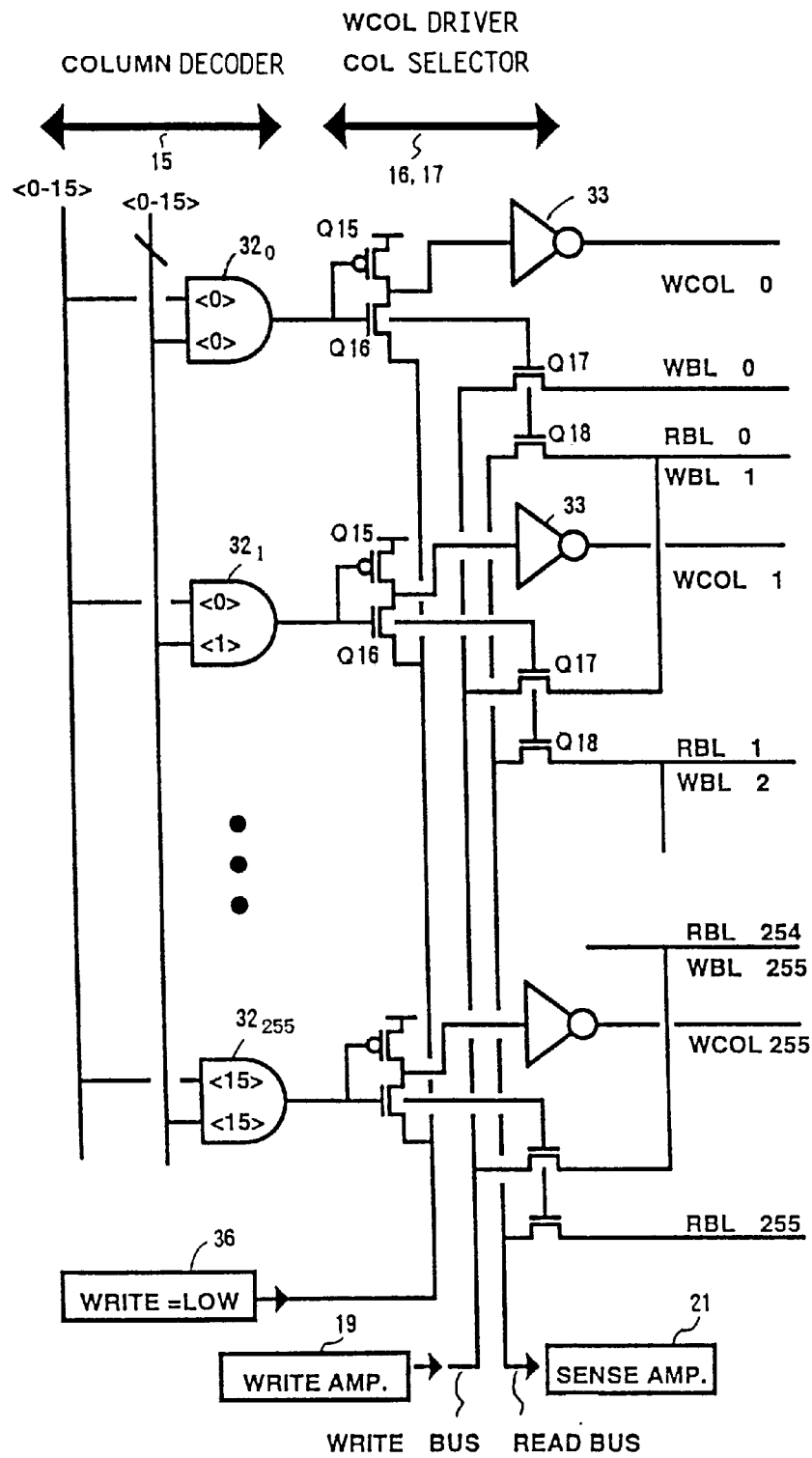
FIG. 30 is a circuit diagram of a circuit configuration of a column system of the semiconductor memory device shown in FIG. 23 and related to the fourth embodiment of the present invention.

FIG. 30 is a diagram of a structure of a column system corresponding to the fourth embodiment of the present invention described with reference to FIGS. 9 and 10. The column system shown in FIG. 30 includes the column decoder 15, the column selector 16 and the write column line driver 17 labeled WCOL. In practice, the column system shown in FIG. 30 includes the address buffer/predecoder 14, which is omitted from FIG. 30 for the sake of simplicity. The circuit configuration shown in FIG. 30 is the same as that shown in FIG. 25 except for some connections. According to the fourth embodiment of the present invention, the read bit line RBL and the write bit line WBL of the right adjacent column are unified (RBLn=WBLn+1). Hence, in FIG. 30, the transistor Q17 of the first column is connected to the transistor Q18 of the 0th column. When the column decoder 15 selects the 0th column, the transistor Q18 of the 0th column is turned ON, and the unified line functions as the read bit line RBL0 of the 0th column. When the first column is selected, the transistor Q17 of the first column is turned ON, and the unified signal line functions as the write bit line WBL1 of the first column.

Figure 31:
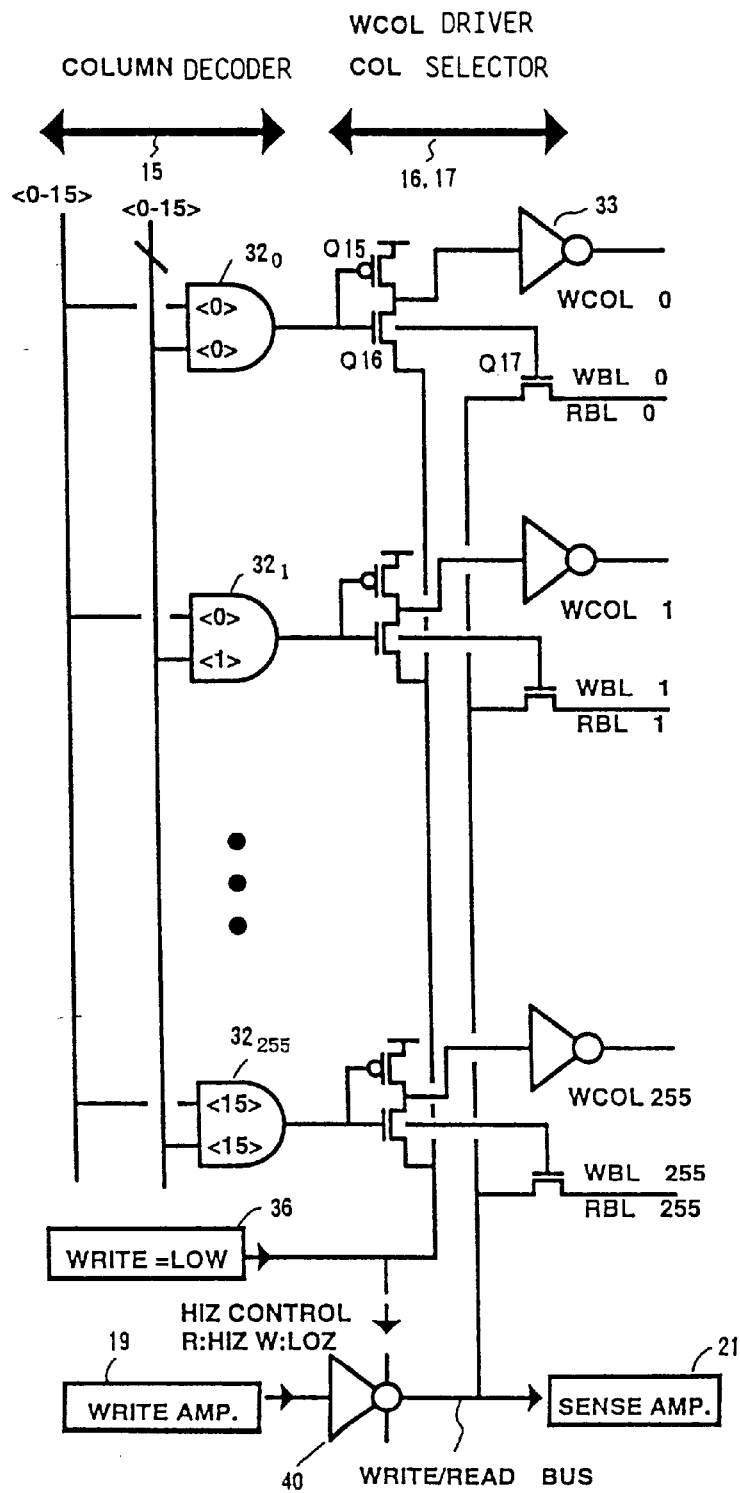
FIG. 31 is a circuit diagram of a circuit configuration of a column system of the semiconductor memory device shown in FIG. 23 and related to the fifth embodiment of the present invention.

FIG. 31 is a diagram of a structure of a column system corresponding to the fifth embodiment of the present invention described with reference to FIGS. 11 and 12. The column shown in FIG. 31 includes the column decoder 15, the column selector 16 and the write column driver 17 labeled WCOL. In practice, the column system shown in FIG. 31 includes the address buffer/predecoder 14, which is omitted from FIG. 31 for the sake of simplicity. The unit circuit of each column is made up of three transistors Q15–Q17 and the inverter 33. In the fifth embodiment of the present invention, the read bit line RBL and the write bit line WBL are unified in each column. The transistor Q17 is connected to the unified bit line. Correspondingly, the read bus and the write bus are unified. A tristate inverter gate 40 is provided between the unified bus and the write amplifier 19. The gate 40 is opened when the timing circuit 36 outputs the low-level signal indicative of the write operation. Hence, the unified (write/read) bus is driven. When the output signal of the timing circuit 36 is high, the output of the tristate inverter gate 40 is in the high-impedance state.

Figure 32:
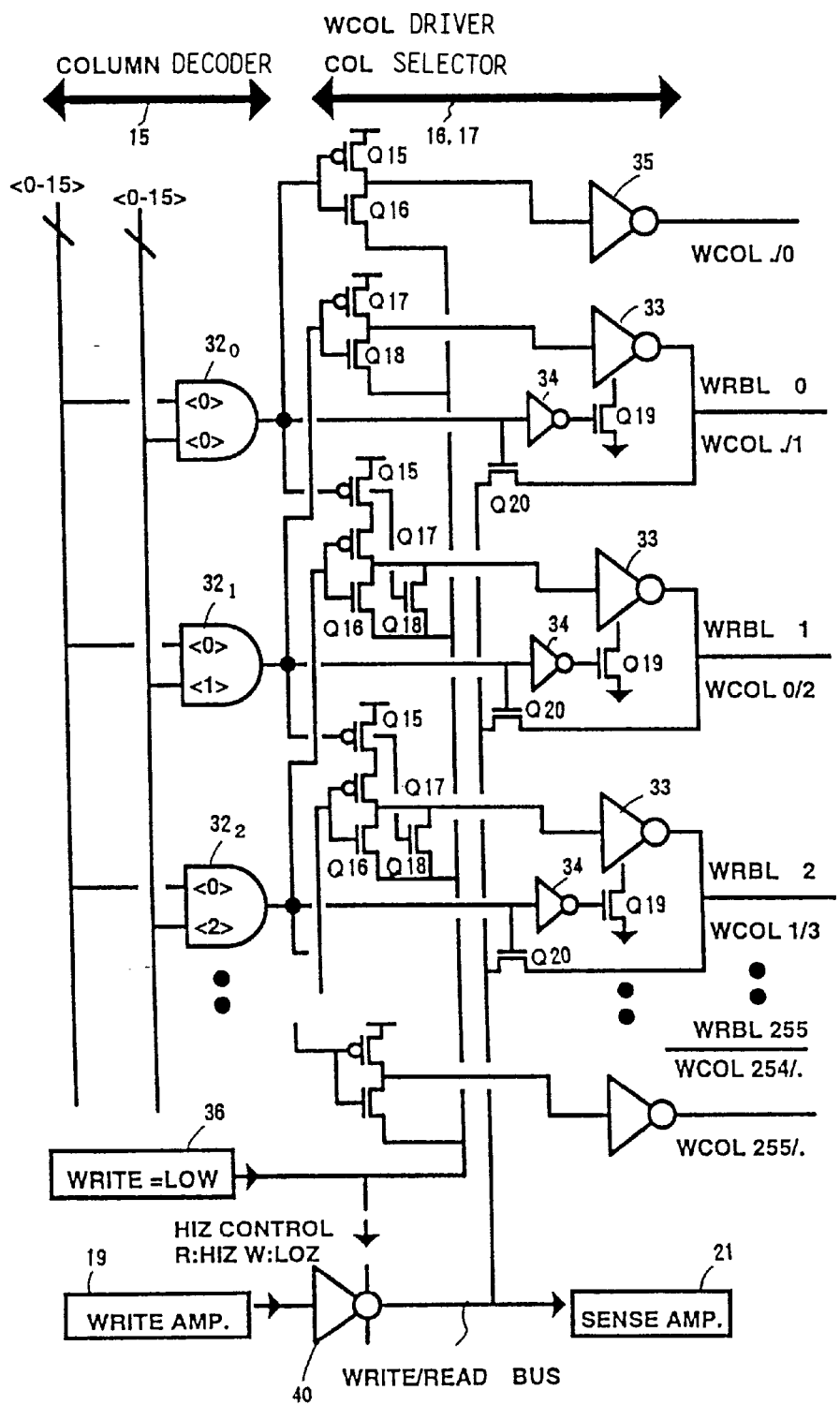
FIG. 32 is a circuit diagram of a circuit configuration of a column system of the semiconductor memory device shown n FIG. 23 and related to the sixth embodiment of the present invention.

FIG. 32 is a diagram of a structure of a column system according to the sixth embodiment of the present invention described with reference to FIGS. 13 and 14. According to the sixth embodiment of the present invention, the read bit line RBL and the write bit line WBL are unified in each cell. Further, the unified bit line is unified with the column write select signal line WCOL for the adjacent column. Hence, the number of lines along the column can be reduced to one per cell. That is, W/RBLn=WCOLn−1,n+1. For example, the signal line extending from the first column shown in FIG. 32 functions as the read bit line RBL1 and the write bit line WBL1 for the first column, and the column write select signal lines WCOL0 and WCOL2 for the 0th and 2nd columns respectively.

The first column selected by the AND gate $32_1$ includes the transistors Q15–Q20 and two inverters 33 and 34. When data is written into the first column (WRBL1), the output of the AND gate $32_1$ of the column decoder 15 becomes high, and the transistor Q20 of the first column is turned ON.

Thus, write data supplied from the write amplifier 19 via the tristate inverter gate 40 passes through the transistor Q20, and is output, as a write data signal, to the unified signal line (WRBL1) of the first column. At this time, since the output of the AND gate $32_2$ is low, the inverter 34 of the second column outputs the high-level signal, which is supplied with the transistor Q19. Then, the transistor Q19 turns ON the inverter 33. The transistor Q18 of the second column is ON because the output of the AND gate $32_1$ is high. Hence, the low-level signal from the timing circuit 36 passes through the transistor Q18, and is applied to the inverter 33. Hence, the output signal of the inverter 33 becomes high, and the high-level signal is output to the unified line WRBL2 as the column write select signal WCOL1 for the first column. In the non-selected state, the AND gate $32_0$ outputs the low-level signal. The transistor Q18 is supplied with the high-level signal from the AND gate $32_1$ and is thus turned ON. Hence, the inverter 33 receives the low-level signal and outputs its inverted version. The output of the inverter drives the unified line WRBL0 as the other column write select signal line WCOL1.

The circuit configuration for the 0th column is equipped with an inverter 35, and is different from that for the first or second column. This is because the 0th column is adjacent to only one column.

Figure 33:
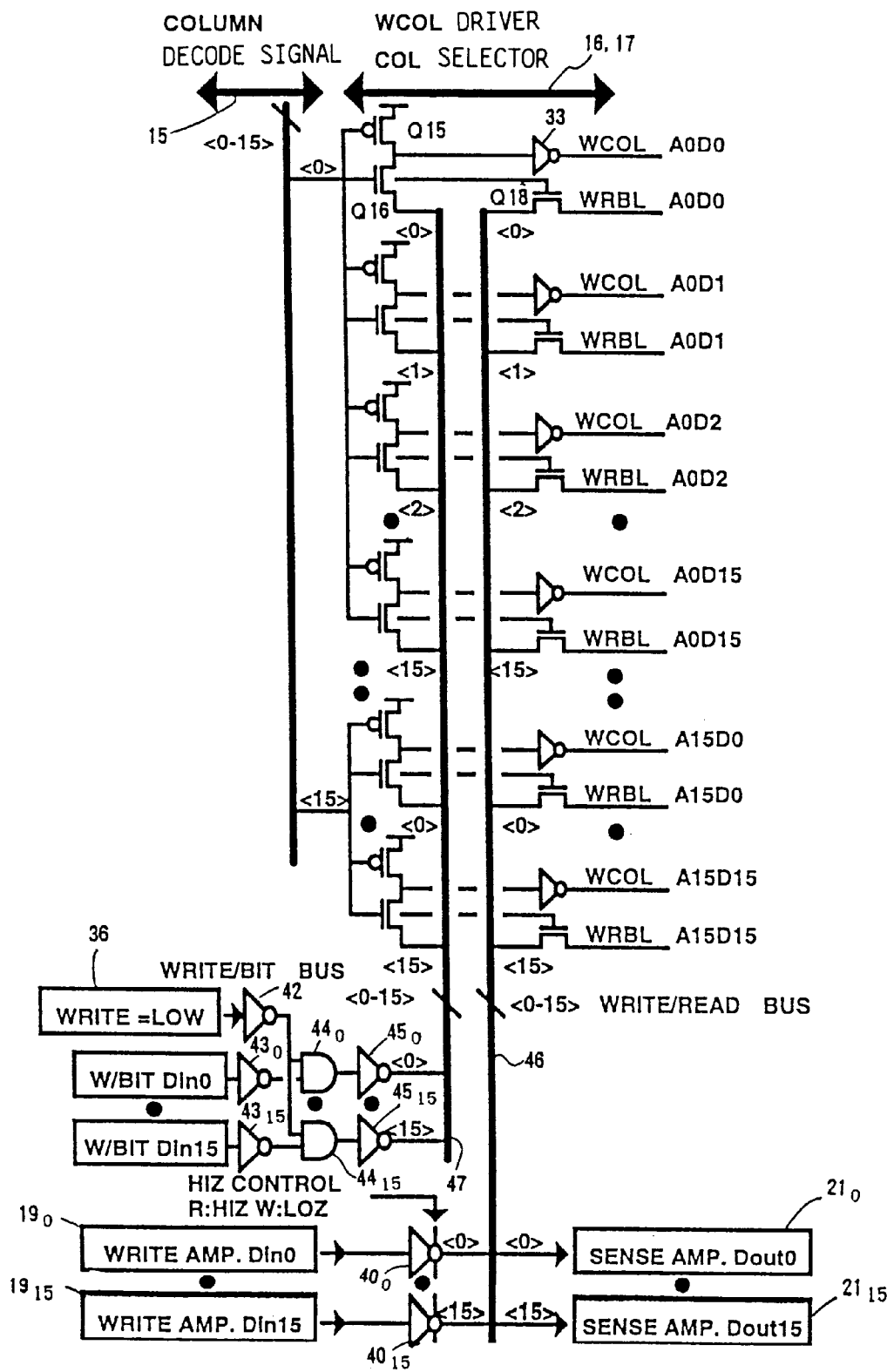
FIG. 33 is a circuit diagram of a circuit configuration of a column system of the semiconductor memory device shown in FIG. 23 and related to the seventh embodiment of the present invention.

FIG. 33 is a diagram of a structure of a column system according to the seventh embodiment of the present invention described with reference to FIGS. 15 and 16. The column system shown in FIG. 33 is applied to a 16-bit byte-wide arrangement in which the write bit line WBL and the read bit line RBL are unified. The column system shown in FIG. 33 has a plurality of groups (16 groups in FIG. 33), each of which groups has 16 columns. The 16 signals that are output by the column decoder 15 are respectively supplied to the 16 groups. Each of the columns in each group includes the transistors Q15, Q16 and Q18 and the inverter 33. Each of the 16 signals is supplied to a respective one of the 16 groups. Hence, the 16 columns of each group is supplied with the identical signal. FIG. 33 depicts one group consisting of 16 columns (bits) A0D0–A0D15. This group is supplied with one of the 16 signals. More particularly, the gates of the transistors Q15, Q16 and Q18 are supplied with the corresponding one of the 16 decoded signals. When the group shown in FIG. 33 is selected, the transistor Q18 is turned ON, and the unified bit line WRBL is connected to a unified data bus 46. Write data Din consists of 16 bits Din0–Din15, which are respectively supplied to the data bus 46 via the write amplifiers $19_0$–$19_{15}$ and tristate inverter gates $40_0$–$40_{15}$. Sense amplifiers $21_0$–$21_{15}$ are connected to corresponding bus lines of the 16-bit data bus 46.

In order to realize the 16-bit write-per-bit arrangement, a 16-bit write control bus 47 is provided which is capable of defining the selective write instruction for each data bit, that is, indicating for each bit whether new data should be written or the original data should be held. In FIG. 33, 16 indication signals W/BITDin0–W/BITDin15 are defined for the respective 16 bits in order to indicate whether data should be written for each of the 16 bits. In FIG. 33, the 16 indication signals W/BITDin0–W/BITDin15 are externally supplied to AND gates $44_0$–$44_{15}$ via inverters $43_0$–$43_{15}$. The AND gates $44_0$–$44_{15}$ are supplied, via the inverter 42, with a signal which is low at the time of writing data. At that time, the indication signals W/BITDin0–W/BITDin15 are supplied to the 16-bit write control bus 47 via the AND gates $44_0$–$44_{15}$ and the inverters $45_0$–$45_{15}$. For example, if data are written into only the columns A0D0–A0D3, the corresponding indication signals W/BITDin0–W/BITDin3 are set to the low level. The corresponding AND gates $44_0$–$44_3$ output the highlevel signals, and the outputs of the inverters $45_0$–$45_3$ become low. Each of the 16 bits of the write control bus 47 is connected to the source of the transistor Q16 of a respective one of the bits. In each of the selected columns, when the source of the transistor Q16 becomes equal to the low level, the inverter 33 is supplied with the low level and thus switches the column write select signal WCOL to the high level.

In the above-mentioned manner, the columns into which data should be written are selected by using the indication signals W/BITDin0–W/BITDin15.

Figure 34:
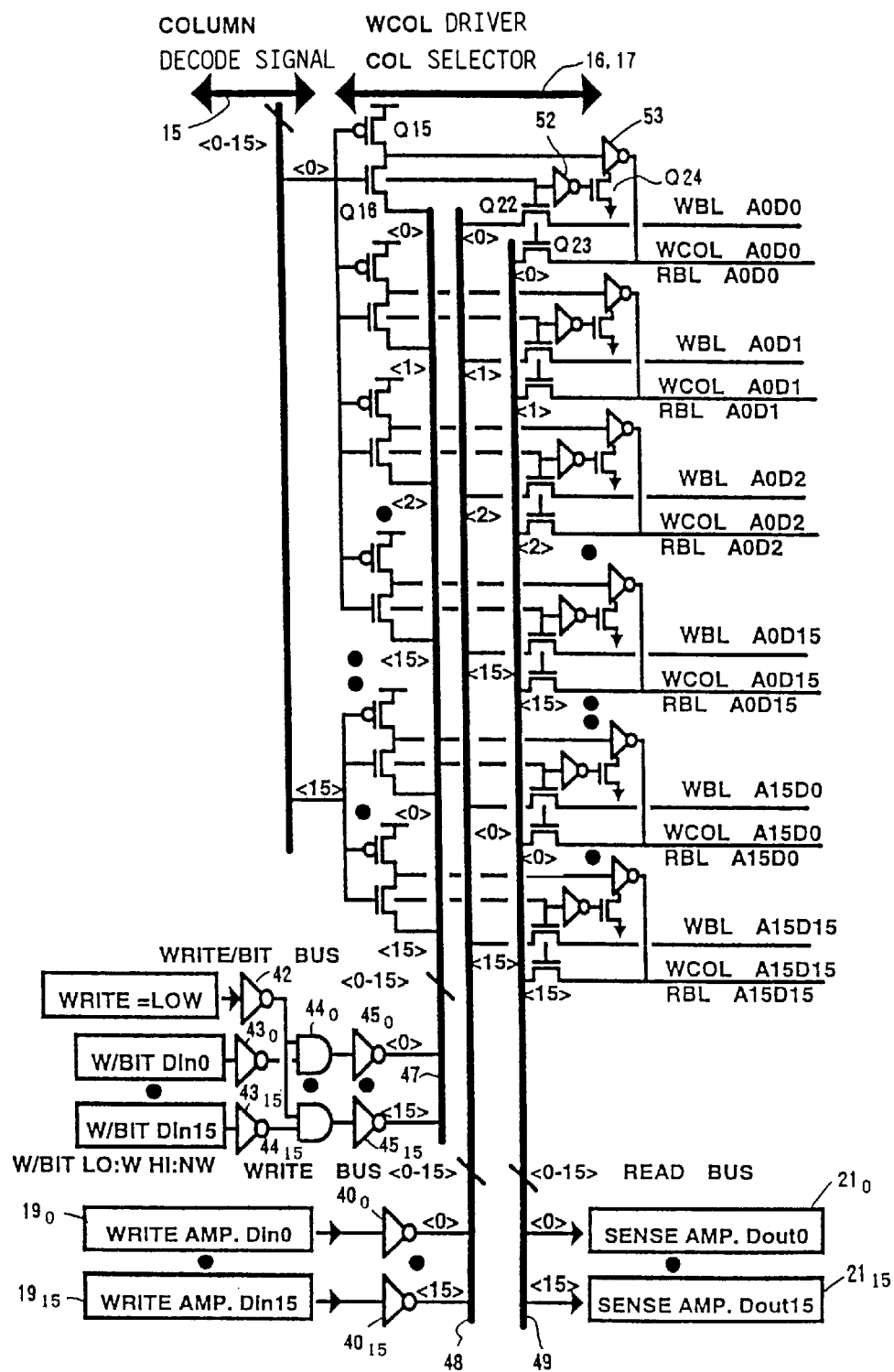
FIG. 34 is a circuit diagram of a circuit configuration of a column system of the semiconductor memory device shown in FIG. 23 and related to the eighth embodiment of the present invention.

FIG. 34 is a diagram of a structure of a column system corresponding to the eighth embodiment of the present invention described with reference to FIGS. 17 and 18. The column system shown in FIG. 34 is applied to a 16-bit byte-wide arrangement in which the read bit line RBL and the column write select signal line WCOL are unified. As in the case shown in FIG. 33, one group consists of 16 columns and is supplied with one of the 16 decoded signals. In FIG. 34, a 16-bit write data bus 48 and a 16-bit read data bus 49 are specifically provided.

In each column, there are provided five transistors Q15, Q16, Q22–Q24 and two inverters 52 and 53. Each of the bits of the write data bus 48 is connected to the drain of the transistor Q22 of a respective one of the columns. The drains of the transistors Q22 and Q23 are supplied with one of the 16 decoded signals, and are turned ON when the corresponding column is selected. At this time, the transistor Q24 is turned OFF due to the function of the inverter 52. At the time of reading data, the signal applied to the inverter 42 is high, and the write control bus 47 is high. Hence, the inverter 53 receives the high-level signal, and the P-channel MOS transistor of the inverter 53 is turned OFF. Thus, the output of the inverter 53 is in the high-impedance state, and the unified bit line functions as the read bit line RBL.

When writing of data into the column A0D0 is instructed (the signal W/BITDin0 is low), the source of the corresponding transistor Q16 is low. The inverter 53 inverts the drain potential of the transistor Q16, and thus the column write select signal WCOL is switched to the high level.

Figure 35:
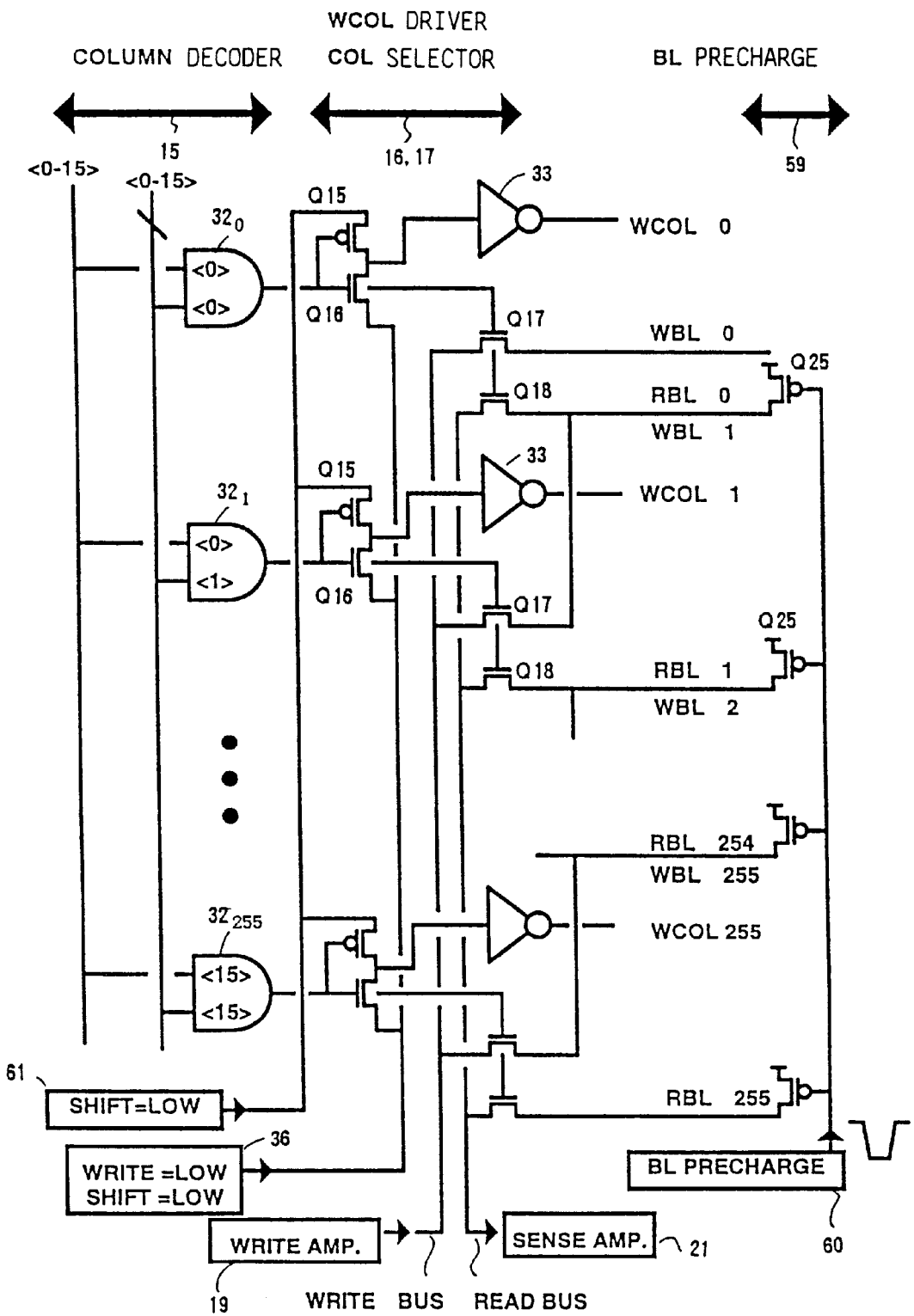
FIG. 35 is a circuit diagram of a circuit configuration of a column system of the semiconductor memory device shown in FIG. 23 and related to the ninth embodiment of the present invention.

FIG. 35 shows a structure of a column system corresponding to the ninth embodiment of the present invention described with reference to FIGS. 19 and 20. In the ninth embodiment of the present invention, the read bit line RBL and write bit line WBL for the adjacent column are unified (RBLn=WBLn+1), so that the number of lines extending along the column is reduced to two per cell. Further, the configuration is controlled so as to realize the shift register. Hence, the column system shown in FIG. 35 is formed by adding a circuit which can select all the column write select signal lines WCOL in response to a shift indication signal 61 to the column system shown in FIG. 30. Further, a bit line precharge circuit 59 is added in order to read data of the cells connected to the same read word line RWL and to simultaneously output them to the read bit lines RBL.

When the shift operation is indicated, the shift indication signal 61 is set to the low level, which is applied to the source of the transistor Q15 of each column. In the non-selected state, the output signal of the AND gate $32_n$ is low, and the transistor Q15 is ON. Hence, the inverter 33 receives the low-level signal and thus output the high-level signal. Hence, the column write select signal line WCOLn is selected. In the selected state, the AND gate $32_n$ outputs the high-level signal. The signal from the timing circuit 36 is low, and thus the inverter 33 receives the low-level signal via the transistor Q16. Then, the inverter 33 outputs the high-level signal, so that the column write select signal line WCOLn can be selected. Hence, by setting the column write select signal lines WCOLn to the high level, the shift inversion transfer is executed on all the cells in the same row.

A bit line precharge signal 60 which defines the timing for bit line precharge is applied to the gates of the P-channel MOS transistors Q25 which precharges the unified bit lines RBL to a given potential. Hence, even when the sense amplifier 21 and the transistor Q18 are OFF in each column, the unified bit line isolated therefrom can be pulled up in the initial stage of the read cycle in a pulse-like formation. As a result, by the data read from the cell, the voltage levels corresponding to the high-level and low-level potential can be obtained even on the bit line which is not selected.

As has been described with reference to FIG. 20, in the shift inversion transfer, the read operation and the write operation are alternately carried out. In the write operation, the shift indication signal is applied so that all the columns are selected.

Figure 36:
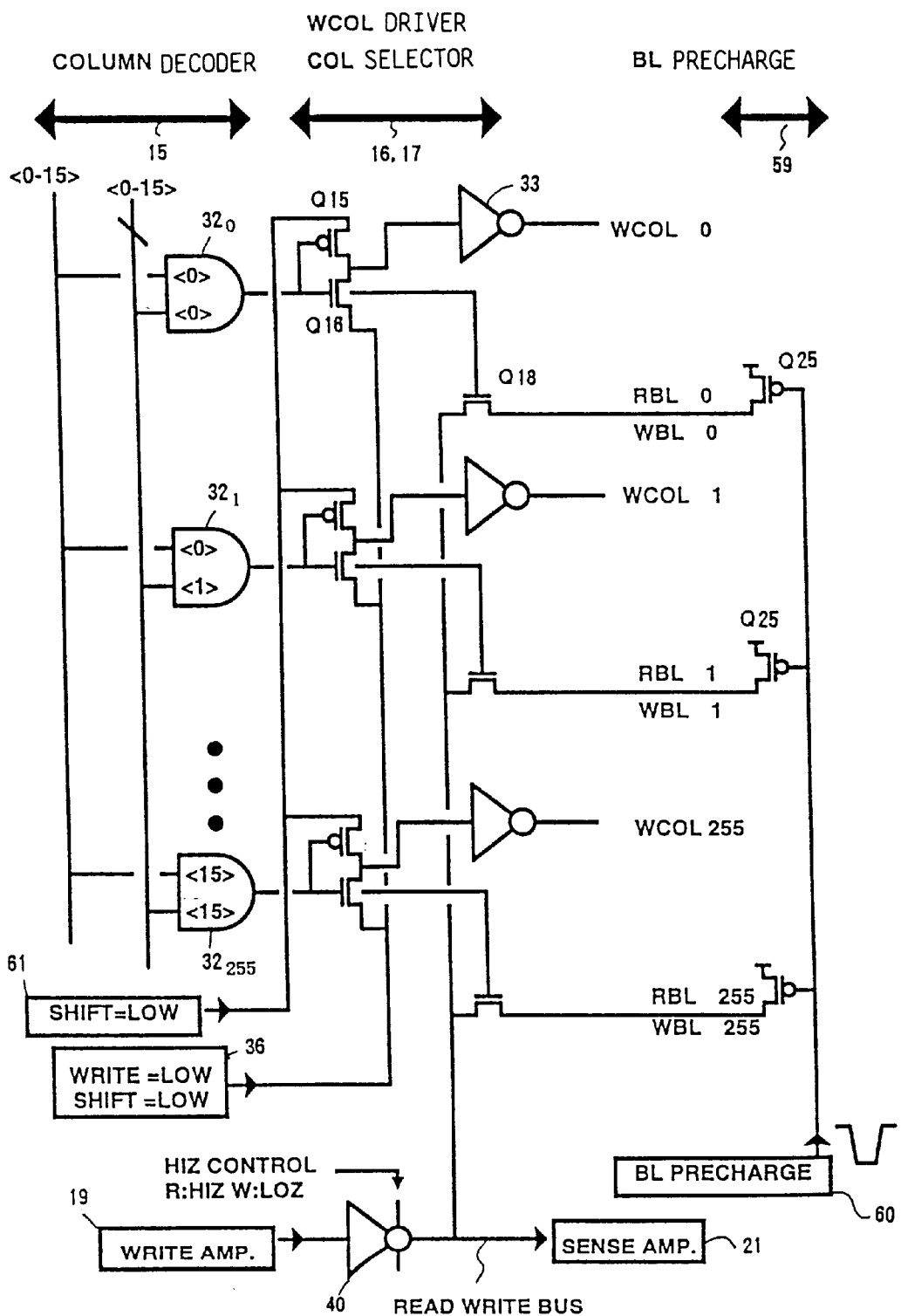
FIG. 36 is a circuit diagram of a circuit configuration of a column system of the semiconductor memory device shown in FIG. 23 and related to the tenth embodiment of the present invention.

FIG. 36 is a diagram of a structure of a column system corresponding to the tenth embodiment of the present invention as described with reference to FIGS. 21 and 22. In the tenth embodiment of the present invention, the read bit line RBL and the write bit line WBL are unified (RBLn=WBLn) to thereby reduce the number of lines extending along the column to two per cell. Further, the configuration is controlled to have the function of shift register. The configuration shown in FIG. 36 is obtained by deleting the transistors Q17 from the configuration shown in FIG. 35 and substituting a write/read data bus for the specifically used write data and read data buses. With the above arrangement, all the column write select signals WCOL are switched to the high level in response to the shift indication signal, so that the operation shown in FIG. 22 can be realized.

The present invention realizes the write speed approximately equal to that of the SRAM device and has a size smaller than that of the SRAM device. This will be described with reference to FIGS. 37A, 37B, 38A and 38B.

Figure 38A:
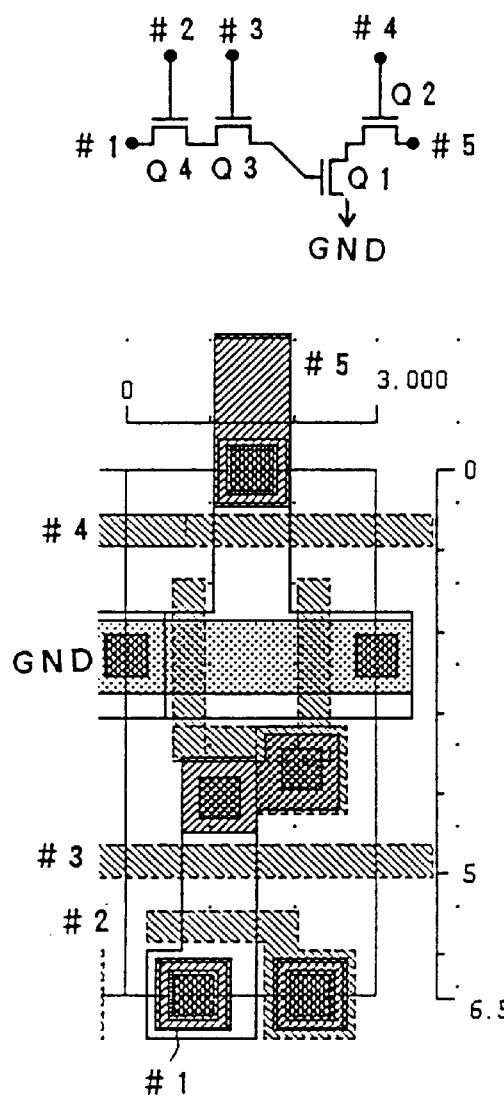
Figure 38B:
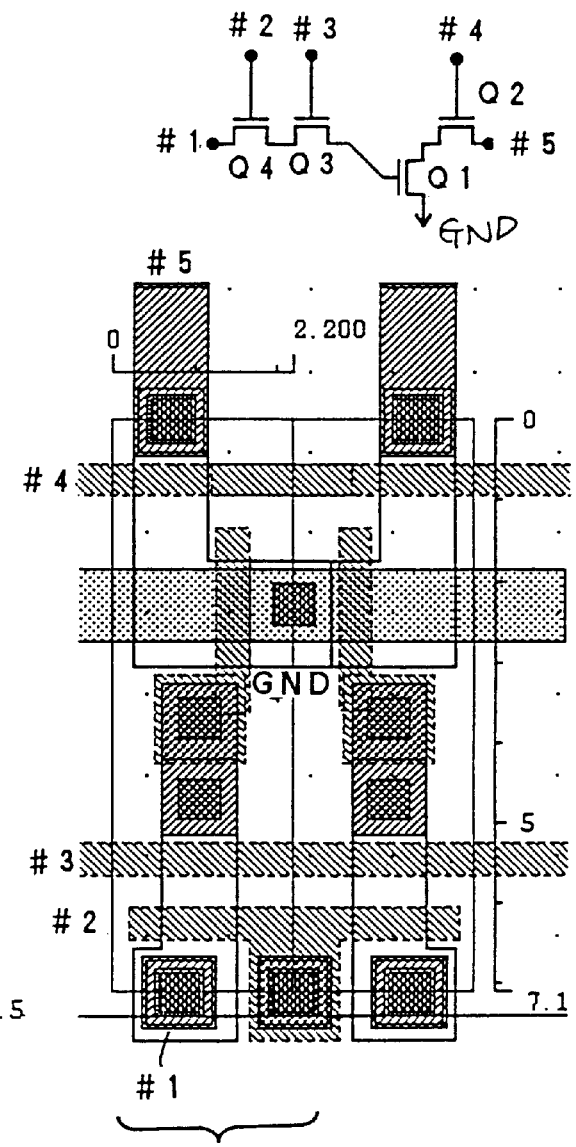

FIGS. 37A and 37B show memory cells of a general SRAM device. The memory cell shown in FIG. 37A consists of six transistors, and the memory cell shown in FIG. 37B consists of four transistors. FIGS. 38A and 38B relate to the present invention and respectively show two layout patterns of a memory cell having four transistors Q1–Q4. The layout shown in FIG. 38B includes two memory cells. The layout shown in FIG. 37A requires an area of 31.7 $\mu m^2$ and the layout shown in FIG. 37B requires an area of 24.0 $\mu m^2$. The layout shown in FIG. 38A requires an area of 19.5 $\mu m^2$ and the layout shown in FIG. 38B has an area of 15.6 $\mu m^2$.

The semiconductor memory device of the present invention includes all semiconductor devices having memory cell arrays as described before, and includes, for example, devices mixed with logic circuits.

The semiconductor memory device according to the above first through tenth embodiments of the present invention have a possibility that data stored in the cell capacitors Cs may be inverted under a particular conduction because the memory cells share the write word lines WWL and the column write select signal lines WCOL. Such an erroneous data inversion may be called a write disturb error.

A description will now be given, with reference to FIGS. 39 and 40, of the mechanism of the write disturb error.

Figure 39:
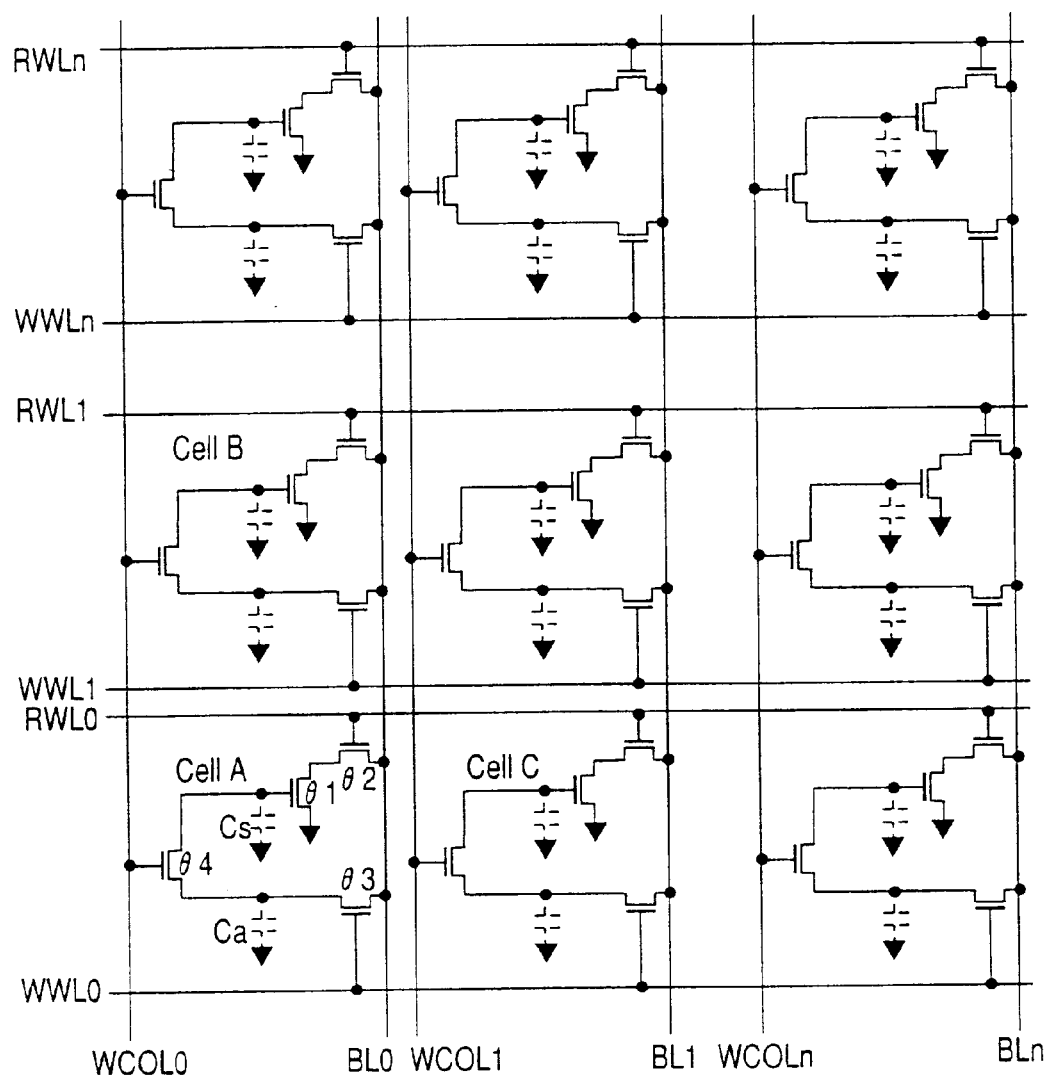
FIG. 39 is a circuit diagram showing the principle of a data inversion error which may occur in the memory cell.

An initial state is defined in which data '1' is stored in the cell capacitor or storage capacitor Cs of the cell A shown in FIG. 39. In the above initial state, the signals at given nodes are as shown in part (a) shown in FIG. 40. In the initial state, the transistor Q1 is ON because data '1' is stored in the cell capacitor Cs. An intermediate node capacitance Ca, which is not negligible, is present between the write transistor Q3 and the column select write transistor Q4.

It will now be assumed that data '0' is written into the cell B in the above initial state. In order to realize the above write operation, the column write select signal WCOL0 and the write word line WWL1 are set to the high level, and the bit line BL0 is set to the low level, as shown in part (b) of FIG. 40.

It will further be assumed that data '0' or '1' is written into the cell C. In this case, the column write select signal WCOL1 and the write word line WWL0 are set to the high level, and the bit line BL1 is set to the low level or the high level, as shown in part (c) of FIG. 40. At this time, the write word line WWL0 is at the high level (the cells A and C commonly own the write word line WWL0), and thus the write transistor Q3 of the cell A is turned ON. Thus, the intermediate node capacitor Ca of the cell A is discharged to the bit line BL0 which has been set to the low level in advance. Thus, the potential of the intermediate node capacitor Ca is changed to the low level.

Data '0' or '1' is written into the cell B again. The column write select signal WCOL0 and the write word line WWL1 are set to the high level, and the bit line BL0 is set to the low level or the high level, as shown in part (d) of FIG. 40. At this time, the column write select signal WCOL0 is at the high level (the cells A and B share the column write select signal WCOL0), and thus the column write select transistor Q4 of the cell A is turned ON. Thus, the cell capacitor Cs of the cell A and the intermediate node capacitor Ca thereof conduct, and the charge stored in the cell capacitor Cs of the cell A is redistributed to the cell capacitor Cs and the intermediate node Ca. Hence, the potential of the cell capacitor Cs of the cell A is reduced.

Figure 40:
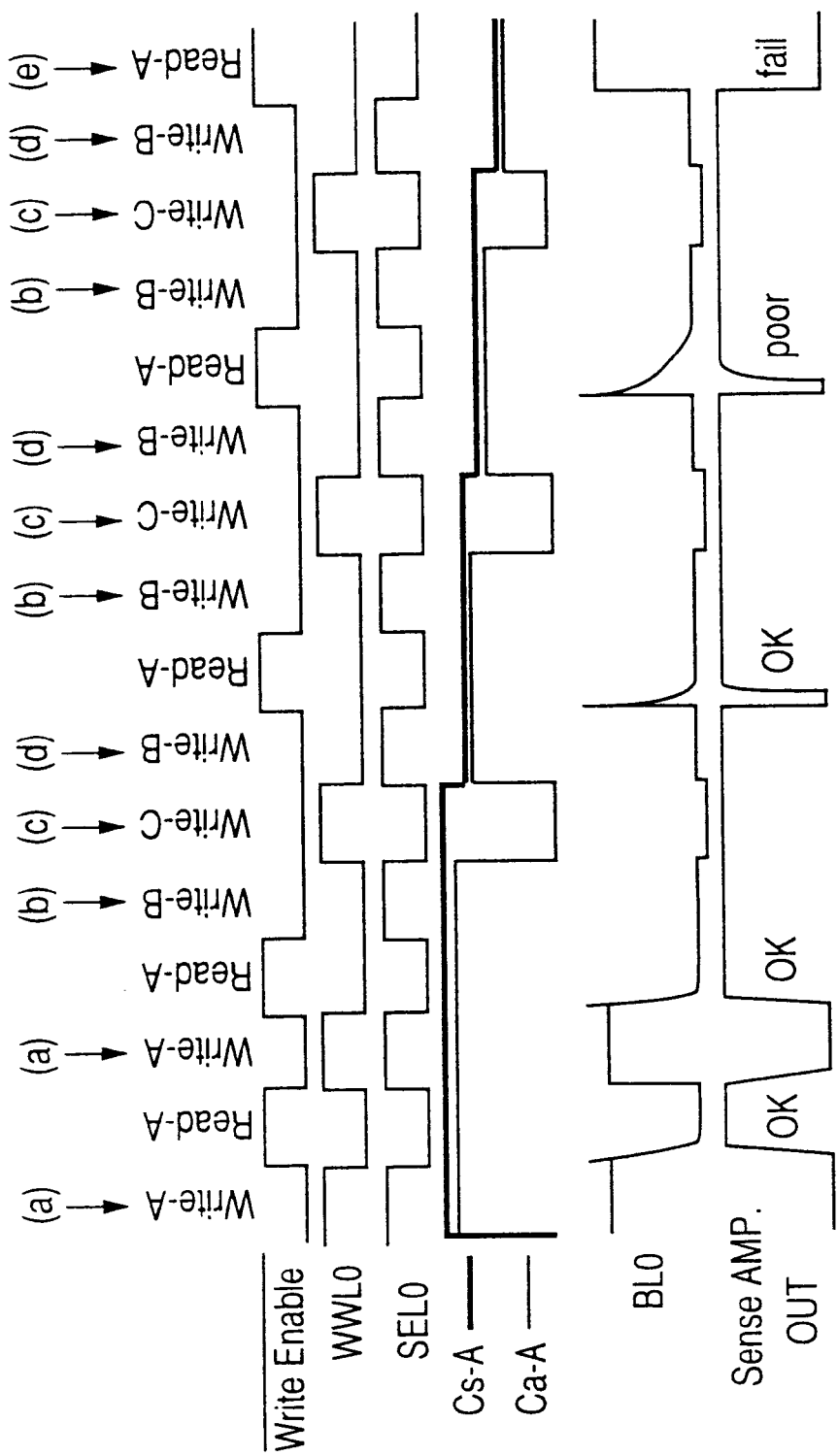
FIG. 40 is a timing chart showing the data inversion error.

Then, the operations shown in parts (b) through (d) of FIG. 40 are repeatedly carried out several times. Hence, the potential of the cell capacitor Cs of the cell A is continuously reduced in stepwise formation, and becomes equal to or lower than the threshold voltage of the driver transistor Q1. Thus, the driver transistor Q1 is turned OFF, and data '1' stored in the initial state is inverted to data '0'. The above data inversion is the data inversion error (write disturb error).

Figure 41:
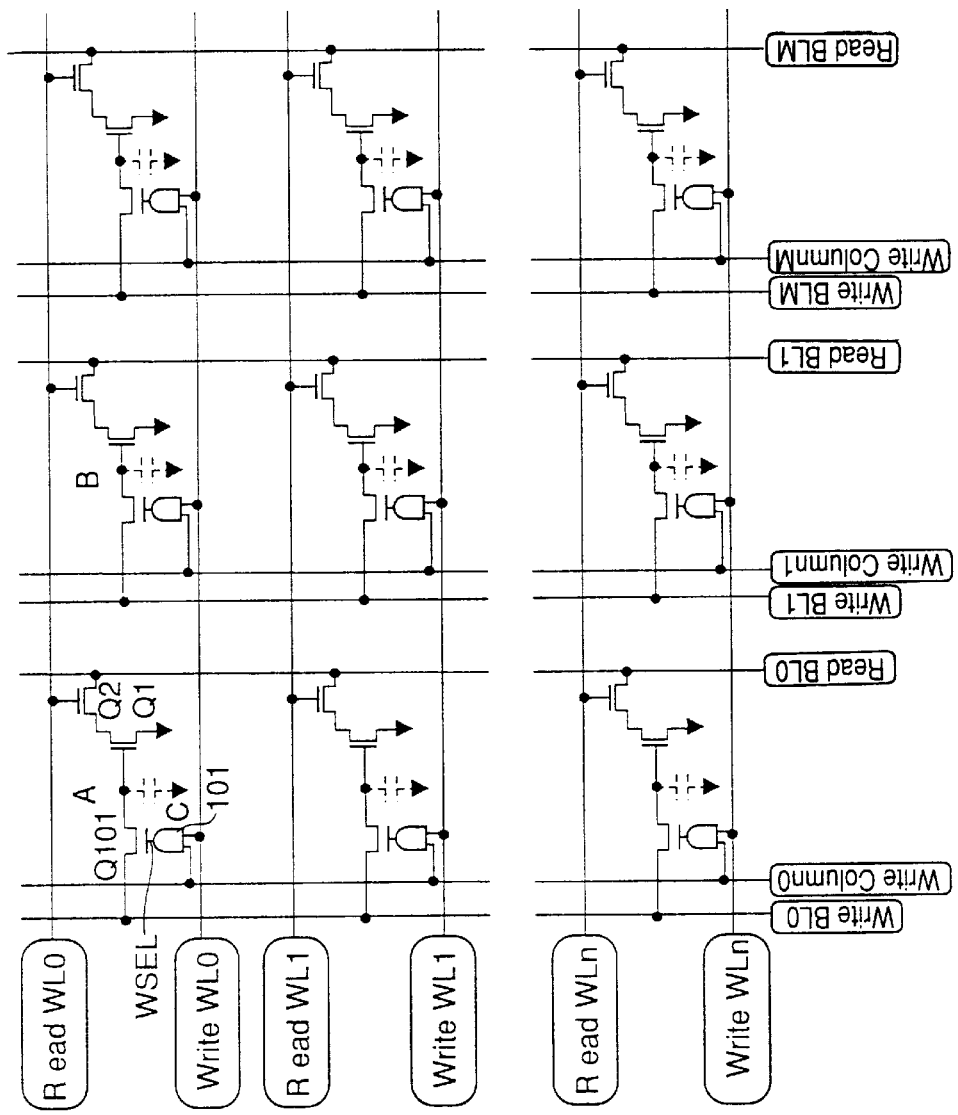
FIG. 41 is a circuit diagram of the principle of a memory cell having a mechanism resistant to the data inversion error.

With the above in mind, the first through tenth embodiments of the present invention are modified to more definitely ensure the operations thereof. More particularly, the write transistors Q3 and the column write select transistors Q4 are replaced by an AND circuit 101 and outputs a write select transistor Q101 as shown in FIG. 41. The AND circuit 101 receives the write word line WWL and the column write select signal line WCOL, and a write select signal line WSEL. The write select transistor Q101 is controlled by the write select signal line WSEL, and applies write data from the write bit line WBL to the cell capacitor C connected to the gate of the driver transistor Q1.

In the memory cell array shown in FIG. 41, the AND circuit 101 of each cell decodes the write word line WWL and the column write select signal line WCOL, so that the write target cell can be specified. Hence, the other cells which share the write word line WWL and the column write select signal line WCOL together with the specified cell are not affected and the data in the respective cell capacitors C are not damaged. That is, the intermediate node capacitors Ca serving as buffers do not exist, so that the data inversion error does not occur.

The arrangement shown in FIG. 41 achieves non-data-break writing, and does not need the read and rewriting operations on the other cells connected to the write word line WWL. Instead, only the write operation is carried out, so that the write cycle can be reduced. That is, the data can be written with a time as long as the write operation of the SRAM device. The operation of the memory cell array shown in FIG. 41 is the same as shown in FIG. 2, and a description thereof will be omitted.

A description will be given of embodiments of the present invention based on the principle shown in FIG. 41.

Figure 42:
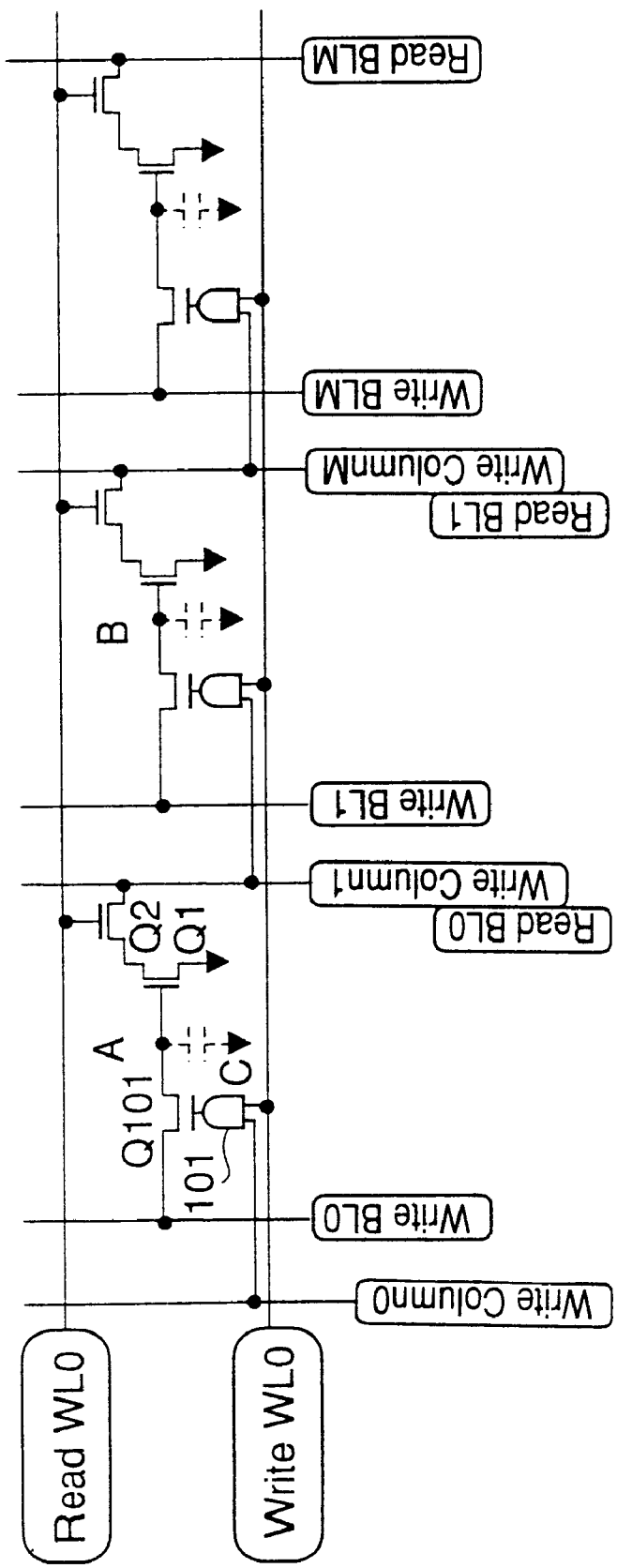
FIG. 42 is a circuit diagram of an eleventh embodiment of the present invention.

Fig.42 is a circuit diagram of an eleventh embodiment of the present invention, which corresponds to a variation of the aforementioned second embodiment. According to the eleventh embodiment of the present invention, the column write select signal line WCOL and the read bit line RBL of the adjacent column are unified, so that the number of wiring lines extending along the column can be reduced to two per cell. More particularly the read bit line RBL(M-1) in the left-side cell column is used as the column write select signal line WCOL(M) of the right-side cell column. For example, referring to FIG. 42, the read bit line RBL0 of the cell A and the column write select signal line WCOL1 are unified. Although FIG. 42 shows an arrangement for only one word line for the sake of simplicity, cells are arranged in matrix formation in practice, as shown in FIG. 41.

An operation of the circuit shown in FIG. 42 will be described with reference to FIG. 6. In the write cycle of the cell A, the read word line RWL0 is in the non-selected state (at the low level), and the transistor Q2 is OFF. Hence, the read bit line RBL0 is isolated from the cells. Hence, the read bit line RBL0 which is idle in the write cycle of the cell A can be used as the column write select signal line WCOL1 at the time of writing data into the cell B. In contrast, At the time of reading data from the cell A, even when the column write select signal line WCOL1 of the cell B is at the high level (data on the read bit line RBL is '1'), the write word line WWL0 is in the non-selected state (at the low level). Hence, the output signal of the AND circuit 101 of the cell B is low, so that the cell capacitor of the cell B cannot be connected to the write bit line WBL1.

In the write cycle, a drive circuit which outputs the column write select signal WCOL is connected to the unified line. At the time of reading, the drive circuit is isolated from the unified line, which is connected to the sense amplifier and the pulse-like pull-up circuit as in the case of the second embodiment of the present invention.

Figure 43:
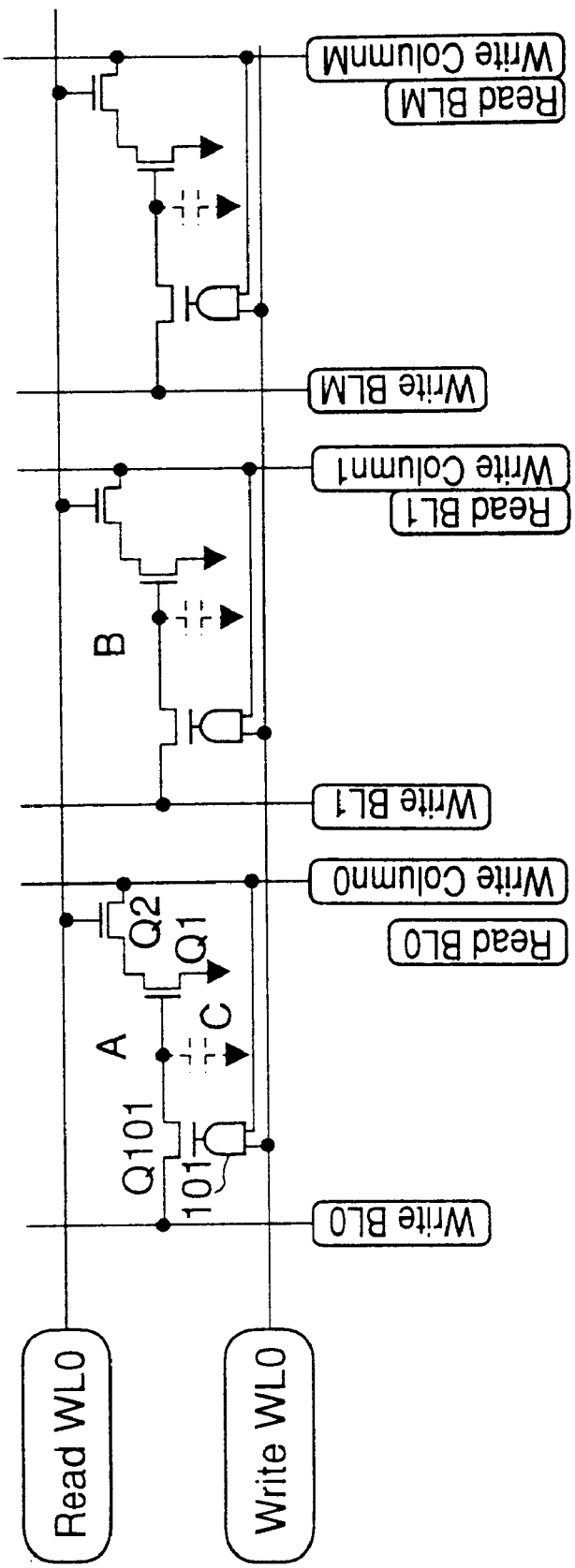
FIG. 43 is a circuit diagram of a twelfth embodiment of the present invention.

FIG. 43 is a circuit diagram of a twelfth embodiment of the present invention, which corresponds to a variation of the aforementioned third embodiment. According to the twelfth embodiment of the present invention, in each cell, the column write select signal line WCOL(N) and the read bit line RBL(N) are unified, so that the number of lines extending along the column is reduced to two per cell. Although FIG. 43 shows an arrangement for only one word line for the sake of simplicity, cells are arranged in matrix formation in practice, as shown in FIG. 41.

An operation of the circuit shown in FIG. 43 will be described with reference to FIG. 8. In the write cycle of the cell A, the read word line RWL0 is in the non-selected state (at the low level), and the read bit line RBL0 is isolated from the cells. Hence, the read bit line RBL0 which is idle during the write cycle of the cell A can be used as the column write select signal line WCOL0 at the time of writing data into the cell A. In contrast, at the time of reading data from the cell A, the column write select signal line WCOL0 is not needed and can be used as the read bit line RBL0. In this case, even when the read bit line RBL0 is changed to the high level, the write word line WWL0 is in the non-selected state (at the low level), and the output signal of the AND circuit 101 of the cell A is changed to the low level. Thus, the capacitor C of the cell A cannot be connected to the write bit line WBL0.

Figure 44:
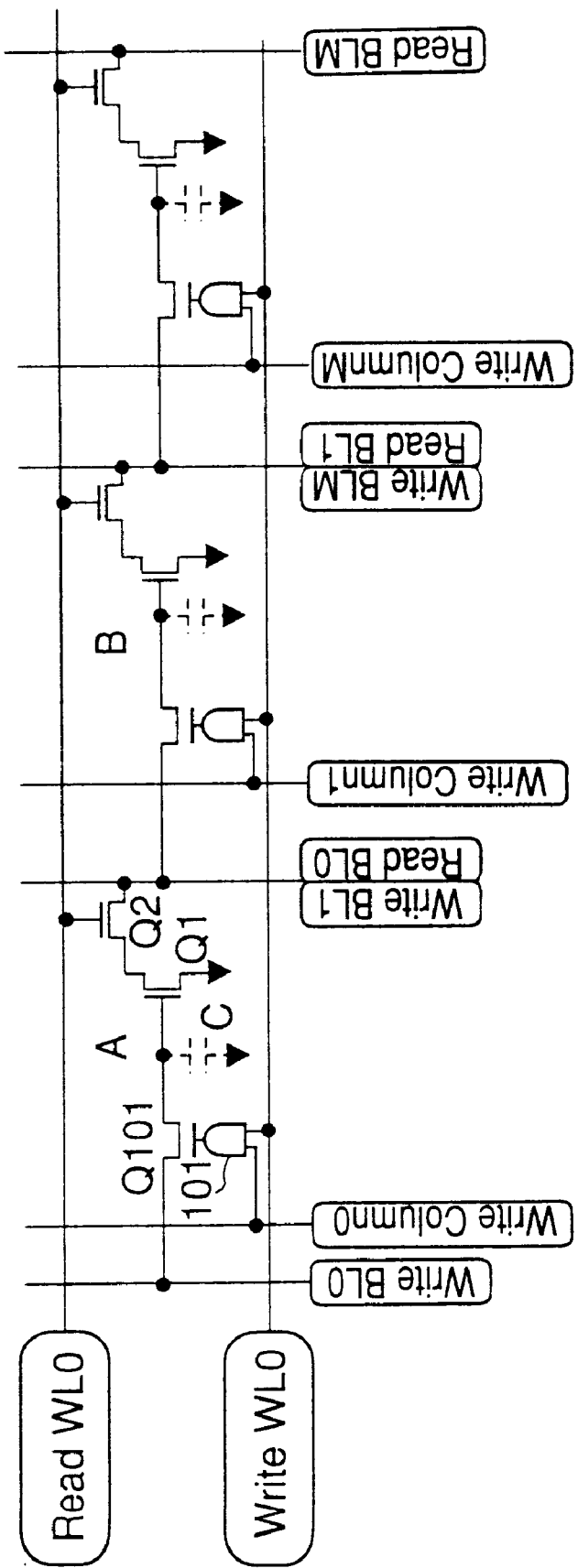
FIG. 44 is a circuit diagram of a thirteenth embodiment of the present invention.

FIG. 44 is a circuit diagram of a thirteenth embodiment of the present invention, which corresponds to a variation of the aforementioned fourth embodiment. According to the thirteenth embodiment of the present invention, the read bit line RBL and the write bit line WBL of the adjacent column are unified, so that the number of lines extending along the column can be reduced to two per cell. More particularly, the read bit line RBL(M-1) of the left-side cell column is used as the write bit line WBL(M) of the right-side cell column. For example, referring to FIG. 44, the read bit line RBL0 of the cell A and the write bit line WBL1 of the cell B are unified. Although FIG. 44 shows an arrangement for only one word line for the sake of simplicity, cells are arranged in matrix formation in practice, as shown in FIG. 41.

An operation of the circuit shown in FIG. 44 will be described with reference to FIG. 10. In the write cycle of the cell A, the read word line RWL0 is in the non-selected state (at the low level), and thus the read bit line RBL0 is isolated from the cells. Hence, the read bit line RBL0 which is idle during the write cycle of the cell A can be used as the write bit line WBL1 at the time of writing data into the cell B. In contrast, at the time of reading data from the cell A, even when data from the cell A is high, the write word line WWL0 is in the non-selected state (at the low level), and the output signal of the AND circuit 101 of the cell B is low. Hence, the read data cannot be written into the cell capacitor C of the cell B.

In the write cycle, a drive circuit which outputs the column write select signal WCOL is connected to the unified line. At the time of reading, the drive circuit is isolated from the unified line, which is connected to the sense amplifier and the pulse-like pull-up circuit as in the case of the second embodiment of the present invention.

Figure 45:
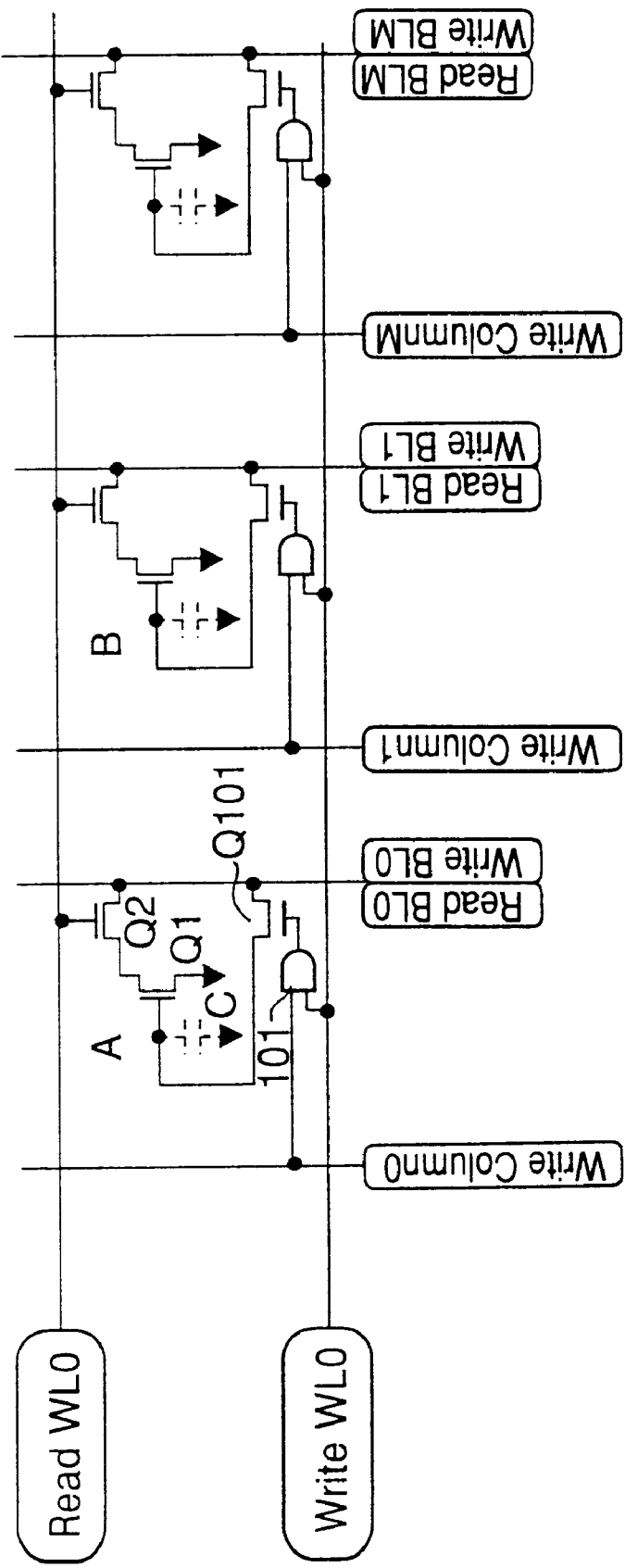
FIG. 45 is a circuit diagram of a fourteenth embodiment of the present invention.

FIG. 45 is a circuit diagram of a fourteenth embodiment of the present invention, which corresponds to a variation of the aforementioned fifth embodiment. According to the fourteenth embodiment of the present invention, in each cell, the write bit line WBL and the read bit line RBL are unified, so that the number of lines extending along the column is reduced to two per cell. Although FIG. 45 shows an arrangement for only one word line for the sake of simplicity, cells are arranged in matrix formation in practice, as shown in FIG. 41.

An operation of the circuit shown in FIG. 45 will be described with reference to FIG. 12. In the write cycle of the cell A, the read word line RWL0 is in the non-selected state (at the low level), and the read transistor Q2 is OFF. Hence, the cell is isolated from the read bit line RBL0. The data on the unified write bit line WBL0 passes through the write select transistor Q101, an is written into the cell capacitor C of the cell A. When data is read from the cell A, the write word line WWL0 and the column write select signal line WCOL0 are at the low level. Hence the AND circuit 101 of the cell A is switched to the low level, and the write select transistor Q101 is OFF. The read word line RWL0 is at the high level, and the transistor Q2 is turned ON. The transistor Q1 is turned ON or OFF depending on the cell capacitor C, and data is read to the unified read bit line RBL0.

Hence, the read bit line RBL0 which is idle during the write cycle of the cell A can be used as the write bit line WBL0 at the time of writing data into the cell A. In contrast, at the time of reading data from the cell A, the write bit line WBL0 is not needed and can be used as the read bit line RBL0.

Figure 46:
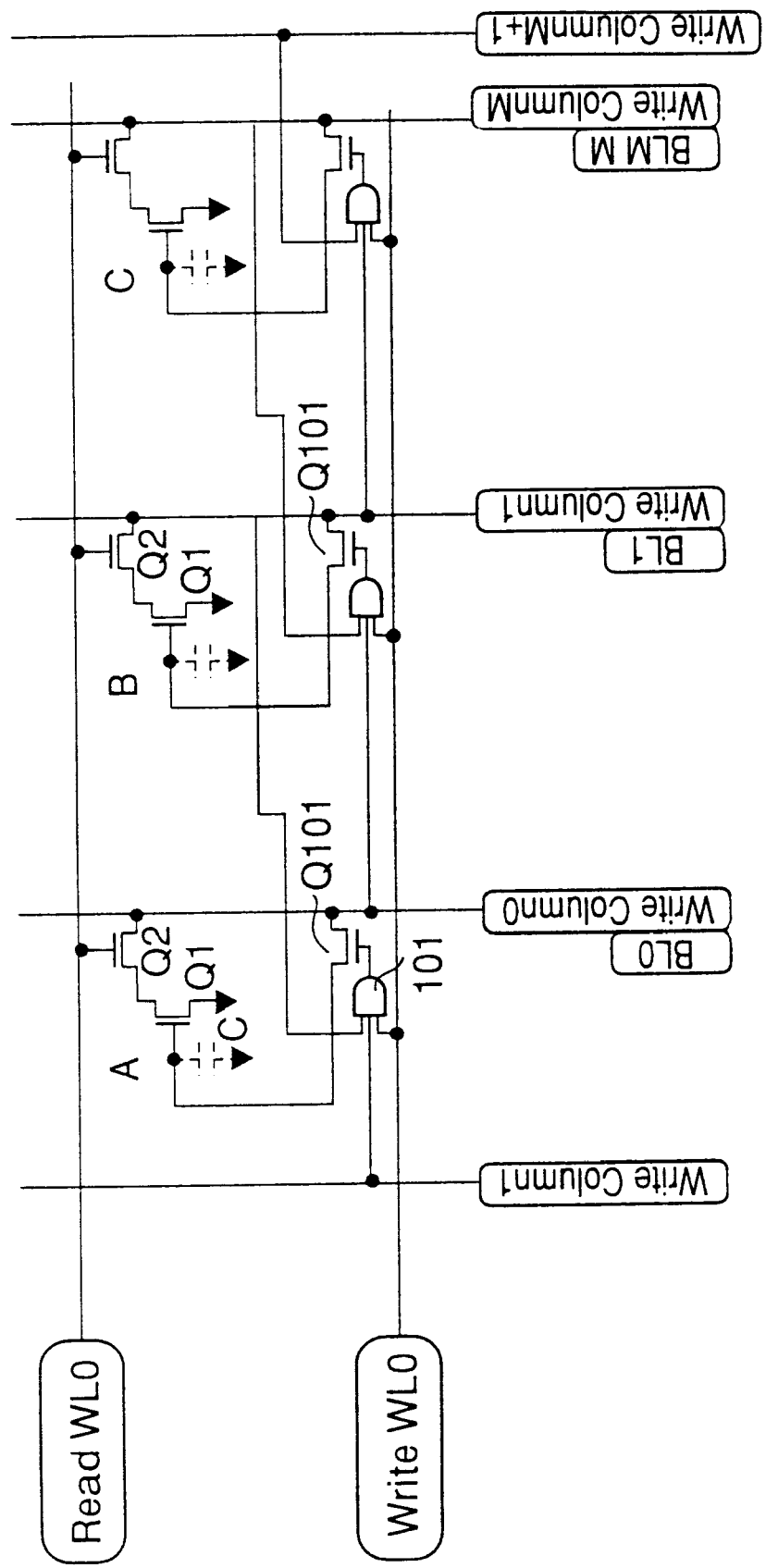
FIG. 46 is a circuit diagram of a fifteenth embodiment of the present invention.

FIG. 46 is a circuit diagram of a fifteenth embodiment of the present invention, which corresponds to a variation of the aforementioned sixth embodiment. According to the fifteenth embodiment of the present invention, in each cell, the read bit line RBL and the write bit line WBL are unified (hence, the bit lines are denoted simply by BL in FIG. 46). Further, the unified line is unified with the column write select signal line WCOL. Hence, the number of lines extending along the column is reduced to one per cell. For example, the AND circuit 101 of the cell A receives the column write select signal line WCOL1, the column write select signal line WCOL(n-1) and the write word line WWL0, and writes data into the cell capacitor C when all the signals are at the high level. Similarly, the cell B is controlled by the write word line WWL0 and the right adjacent bit line BL2 (M=2 of BL(M)) and the left adjacent column write select signal WCOL0.

Although FIG. 46 shows an arrangement for only one word line for the sake of simplicity, cells are arranged in matrix formation in practice, as shown in FIG. 41.

An operation of the circuit shown in FIG. 46 will be described with reference to FIG. 14. In the write cycle, the read word line RWL is in the non-selected state (at the low level), and thus the read bit line RBL is isolated from the cell capacitor C. Hence, the read bit line RBL which is idle during the write cycle can be used as the write bit line WBL at the time of writing data. In contrast, even when the potential of the write bit line WBL commonly used at the time of reading data is high or low, the cell capacitor cannot be connected to the write bit line WBL if the write word line WWL is in the non-selected state (at the low level).

The column write select signal WCOL connects the cell capacitor of the selected cell to the bit line BL by setting the bit lines BL and the write word lines WWL located at both sides thereof. For example, referring to FIG. 46, in the case where data is written into the cell B, when the bit lines BL0 and BL(M) located at both sides and the write word line WWL0 are set to the high level, the data on the bit line BL1 is written into the cell capacitor C via the write select transistor Q101.

In the read cycle of the cell B, the write word line WWL0 is switched to the non-selected state (the low level), and the cell capacitor is thus isolated from the bit line BL1. When the read word line RWL0 is switched to the high level, data stored in the cell B is read to the bit line BL1 via the transistor Q2. In the above read cycle, the sense amplifier and the pulse-like pull-up circuit are connected to the bit line.

In the above-mentioned eleventh through fifteenth embodiments of the present invention, the write operation is executed on the bit basis. As described below, sixteenth and seventeenth embodiments of the present invention are directed to realizing bit-based selective writing in the byte-wide arrangement (multi-bit arrangement). For example, data having a plurality of bits such as 8 or 16 bits can be read or written at one time, and further a write mask control can be performed for each bit. Hence, it is possible to perform a control such that the four upper bits of eight-bit data are updated, while the four lower bits thereof are retained.

Figure 47:
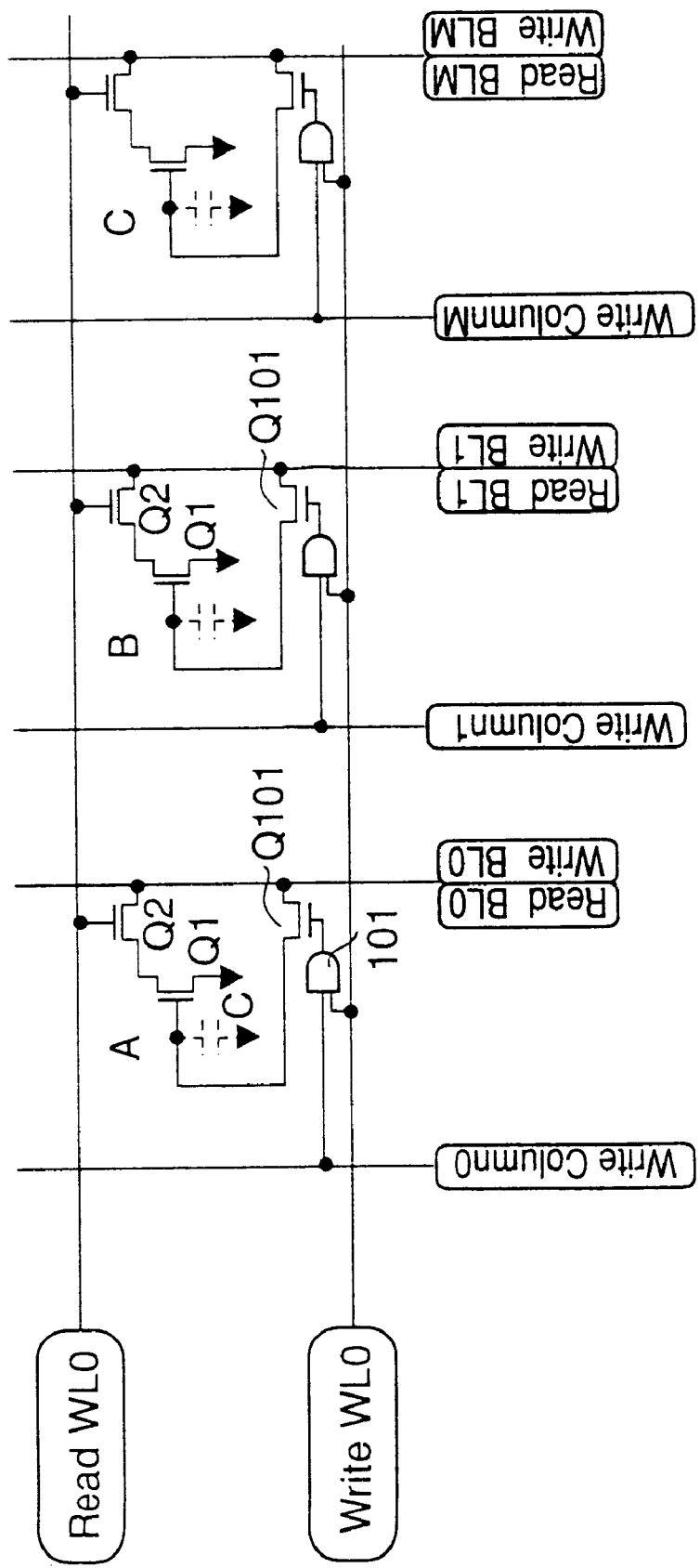
FIG. 47 is a circuit diagram of a sixteenth embodiment of the present invention.

FIG. 47 is a circuit diagram of the sixteenth embodiment of the present invention, which corresponds to a variation of the seventh embodiment. According to the sixteenth embodiment of the present invention, in each cell, the write bit line WBL and the read bit line RBL are unified, so that the number of lines extending along the column can be reduced to two per cell. Although FIG. 47 shows an arrangement for only one word line for the sake of simplicity, cells are arranged in matrix formation in practice, as shown in FIG. 41.

Although the circuit configuration shown in FIG. 47 is the same as that shown in FIG. 45, the write-per-bit arrangement is realized by employing the control shown in FIG. 16 rather than that shown in FIG. 12. The operation shown in FIG. 16 assumes a three-bit arrangement consisting of A, B ad C shown in FIG. 47. In the write cycle, data are written into the cells A and B, while the original data is retained in the cell C. The operation shown in FIG. 16 is directed to the three-bit arrangement in order to facilitate understanding the sixteenth embodiment. However, the sixteenth embodiment is not limited to the three-bit arrangement.

The column write select signals WCOL0 and WCOL1 of the cells A and B into which data will be written are simultaneously set to the high level, and the column write select signal WCOL(M) related to the cell C is set to the low level. The write word line WL0 is set to the high level and is thus selected. The write data is given to the bit lines WBL0 and WBL1 connected to the selected cells. Hence, the data are written into the cell capacitors of the cells A and B. In the example shown in FIG. 16, the high-level data and low-level data are respectively written into the cells A and B. The high-level data is retained in the cell C. In the read operation, the drive circuit which drives the write data from the bit line BL, and the read word line RWL0 is selected. Then each of the bit lines BL is selected, and data are read in parallel formation by means of the pulse-like pull-up circuits and the sense amplifiers.

Figure 48:
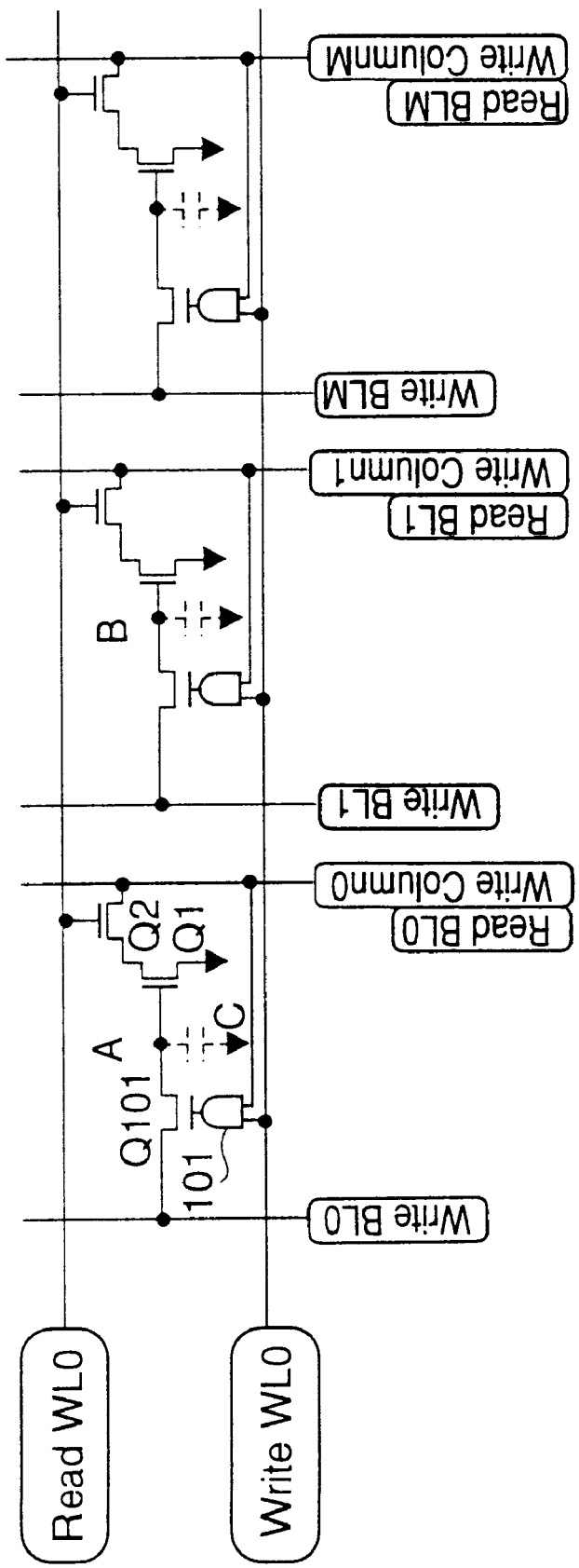
FIG. 48 is a circuit diagram of a seventeenth embodiment of the present invention.

FIG. 48 is a circuit diagram of the seventeenth embodiment of the present invention, which corresponds to a variation of the aforementioned eighth embodiment. According to the seventeenth embodiment of the present invention, in each cell, the column write select signal line WCOL and the read bit line RBL are unified, so that the number of lines extending along the column can be reduced to two per cell. In this regard, the circuit shown in FIG. 48 is the same as that shown in FIG. 43. Further, the writing is selectively controlled on the bit basis in the byte-wide-arrangement (multi-bit arrangement). Although FIG. 48 shows an arrangement for only one word line for the sake of simplicity, cells are arranged in matrix formation in practice, as shown in FIG. 41.

A description will now be given, with reference to FIG. 18, of an operation of the seventeenth embodiment of the present invention. In the write cycle shown in FIG. 18, data are written into the cells A and B, and the data stored in the cell C is retained. The column write select signal WCOL0 and WCOL1 for the cells A and B are switched to the high level, and the write word line WWL0 is switched to the high level. Data are applied to the write bit lines WBL0 and WBL1 for the cells A and B, so that the data are written into the cell capacitors of the cells A and B. The read operation is initiated by disconnecting the write column select means from the column write select signal lines WCOL0–WCOL(M). Then, the read word line RWL0 is selected, and the bit lines RBL0–RBL(M) are selected. Hence, the respective pulse-like pull-up means and the sense amplifiers read the data in parallel formation.

Figure 49:
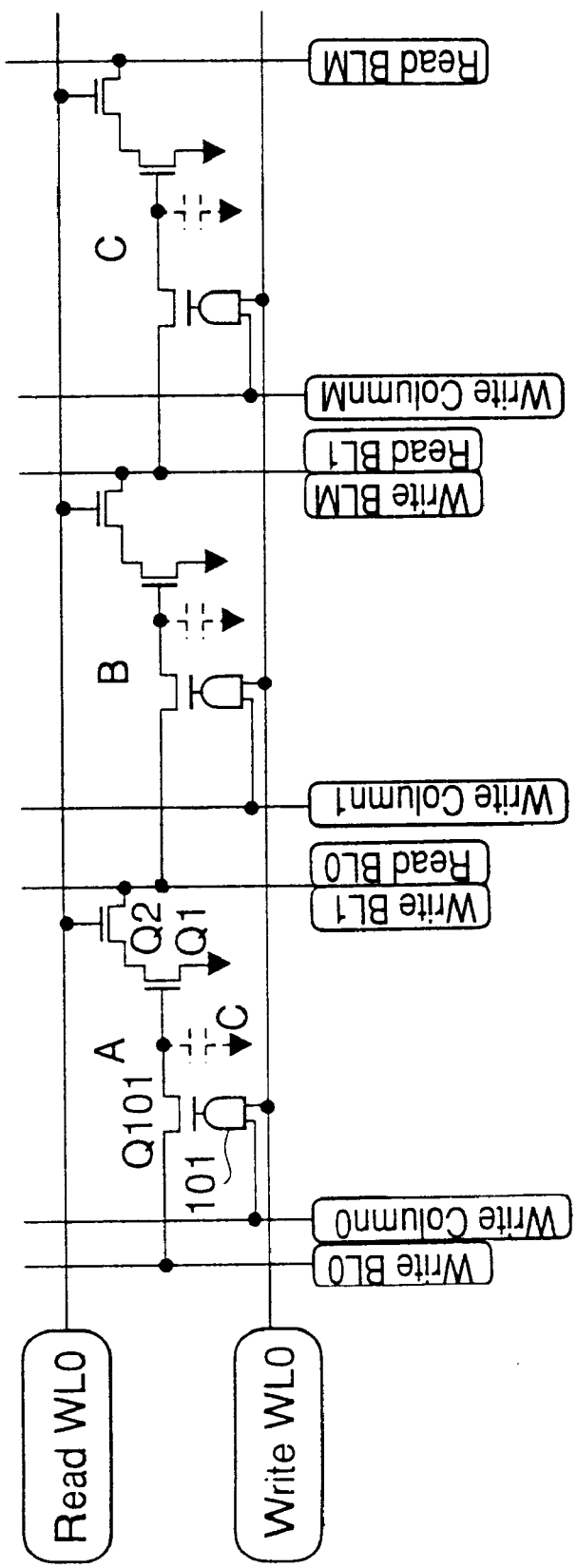
FIG. 49 is a circuit diagram of an eighteenth embodiment of the present invention.

FIG. 49 is a circuit diagram of an eighteenth embodiment of the present invention, which corresponds to a variation of the aforementioned ninth embodiment. According to the aforementioned ninth embodiment, the read bit line RBL and the write bit line WBL of the adjacent column are unified, so that the number of lines extending along the column can be reduced to two per cell. The eighteenth embodiment of the present invention has the same arrangement as described above. Further, a control is employed which realizes a function of the shift register. Although FIG. 48 shows an arrangement for only one word line for the sake of simplicity, cells are arranged in matrix formation in practice, as shown in FIG. 41.

An operation of the circuit shown in FIG. 49 will be described with reference to FIG. 20. In the first half of each cycle, the read operation is carried out so that the potential of the read bit line RBL is settled to either the high or low potential. Since the gain-type cells are employed, the bit lines which have been pulled up in pulse formation are drawn to the ground level or retained at the power supply voltage VDD after an appropriate time elapses. That is, there is no need to provide sense amplifiers. In the second half of each cycle, the write operation is carried out, and the write data is also used as write data to be written into the adjacent cell located at the right-hand side. One cycle consisting of the above read and write operations enables data in the cell capacitor to shift rightwards by one cell. It should be noted that the data is inverted as shown in FIG. 20.

The above shift operation shifts data in the lateral direction. If the read word line RWL and write word line WWL are respectively selected by different addresses, data will be shifted obliquely.

If some column write select signal lines WCOL are fixed to the low level, arbitrary cell data can be retained as in the case of the bit-basis writing.

Figure 50:
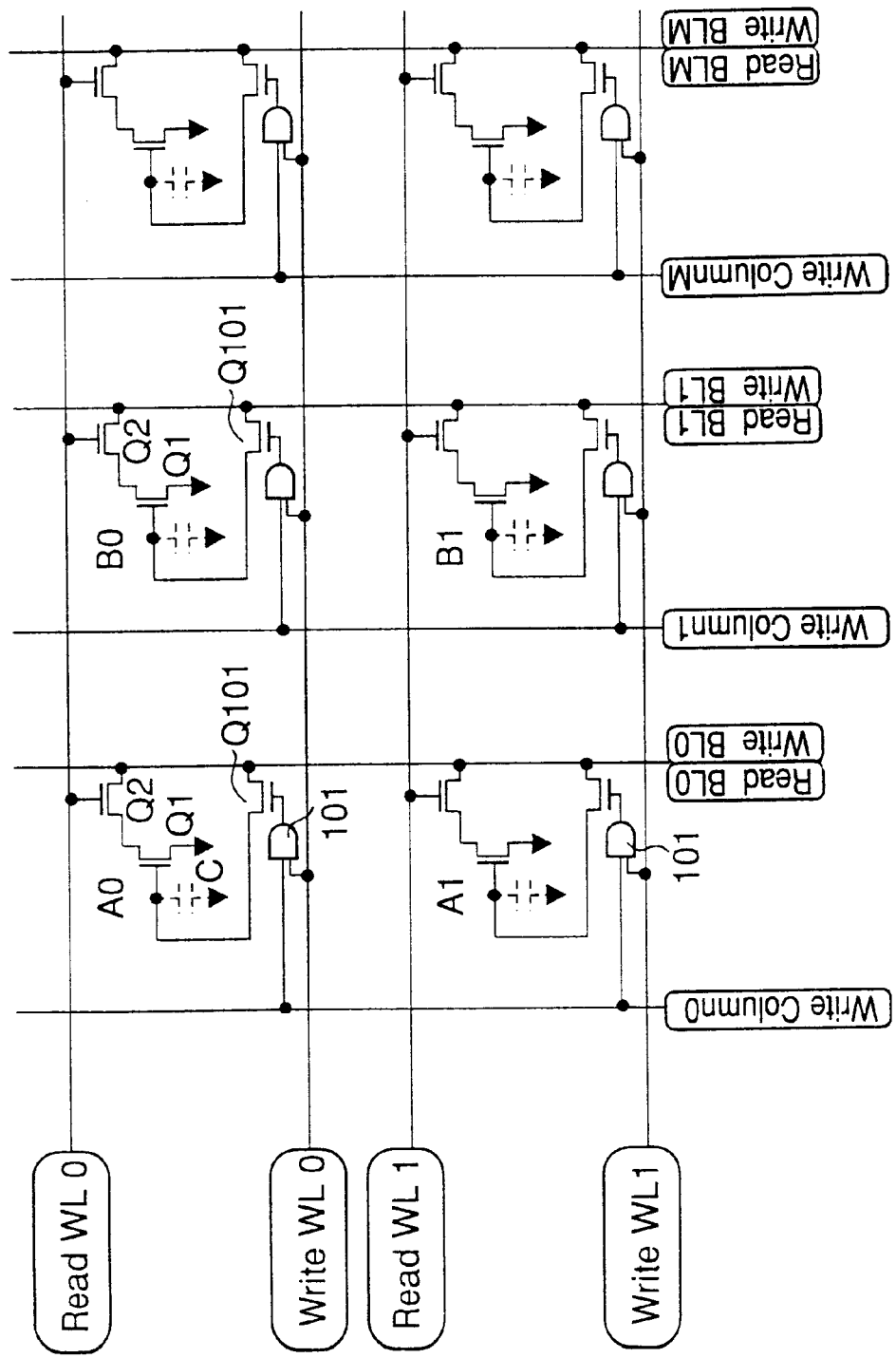
FIG. 50 is a circuit diagram of a nineteenth embodiment of the present invention.

FIG. 50 is a circuit diagram of a nineteenth embodiment of the present invention, which corresponds to a variation of the aforementioned tenth embodiment. According to the nineteenth embodiment of the present invention, each cell, the read bit line RBL and the write bit line WBL are unified, so that the number of lines extending along the column can be reduced to two per cell. The above arrangement is the same as that shown in FIG. 45. Further, a control is employed which realizes a function of the shift register in which data is shifted along the columns. Although FIG. 50 shows an arrangement for only one word line for the sake of simplicity, cells are arranged in matrix formation in practice, as shown in FIG. 41.

An operation of the circuit shown in FIG. 50 will be described with reference to FIG. 22. In the first cycle, the read word line RWL0 is driven, and data stored in the cells A0 and B0 are respectively read therefrom and are applied to the unified read bit lines RBL0 and RBL1. Next, the write word line WWL0 and the column write select signal lines WCOL0 and WCOL1 are driven, and data thus read are written into the cells A0 and B0. Hence, as shown in FIG. 22, the data stored in the cells A0 and B0 are inverted. Then, the read word line RWL0 is driven, and data stored in the cells A0 and B0 are output again. Since the inverted data have been written into the cells A0 and B0, the potentials of the read bit lines RBL0 and RBL1 are inverted.

Then, the write word line WWL0 and the column write select signal WCOL0 are driven, and data is written into the cell A0. Hence, the data of the cell A0 is returned to the original level or value, while the data of the cell B0 is retained in the inverted state. Subsequently, the write word line WWL1, the column write select signal lines WCOL0 and WCOL1 are driven. Hence, the data on the unified bit lines BL0 and BL1 are written into the cells A1 and B1. Thus, the cells A1 and B1 store data transferred from the cells A0 and B0. Finally, the read word line RWL1 is driven, and data stored in the cells A1 and B1 are read therefrom and are applied to the unified read bit lines RBL0 and RBL1. The write word line WWL1 and the column write select signal lines WCOL0 and WCOL1 are driven, and the read data are written into the cells A1 and B1. Hence, the data in the cells A1 and B1 are inverted.

As described above, a plurality of pieces of data can be shifted along the column direction. It can be seen from the above that the refresh operation can be achieved by executing the self-inverting operation twice. Hence, the refresh operation does not need the sense amplifiers. When the column write select signal is selected at the time of writing, data is inverted, while data is retained when not selected. Hence, the column write select signal WCOL specifies bits to be inverted. In other words, the XOR operation can be executed.

The memory cells arrays of the eleventh through nineteenth embodiments of the present invention are those the memory cell arrays of the semiconductor memory device shown in FIG. 23.

FIGS. 51A through 51F are circuit diagrams of circuits of the AND circuits used in the eleventh through nineteenth embodiments of the present invention.

Figure 51A:
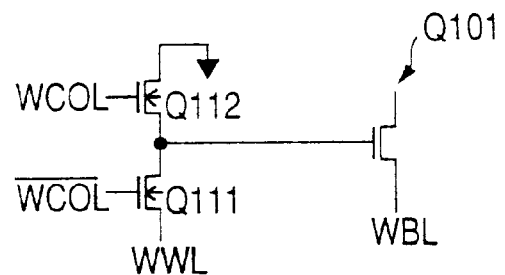
FIGS. 51A, 51B, 51C, 51D, 51E and 51F are respectively circuit diagrams of an AND circuit used in the embodiment of the present invention.

FIG. 51A shows a first example of the AND circuit 101. The circuit shown in FIG. 51A includes n-channel MOS transistors Q111 and Q112. The transistor Q111 has a source connected to the gate of the write select transistor Q101, a drain connected to the write word line WWL, and a gate connected to the inverted version of the signal on the column write select signal line WCOL. The MOS transistor Q112 has a source connected to the ground, a drain connected to the gate of the write select transistor Q101, and a gate connected to the column write select signal line WCOL.

Figure 51B:
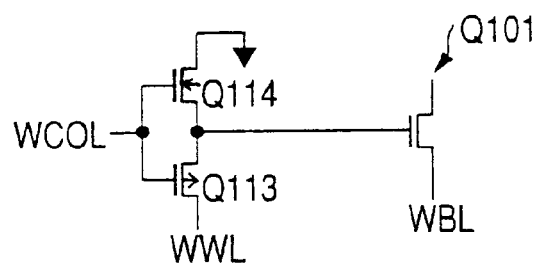

FIG. 51B shows a second example of the AND circuit 101. The circuit shown in FIG. 51B includes a p-channel MOS transistor Q113 and an n-channel MOS transistor Q114. The MOS transistor Q113 has a source connected to the gate of the write select transistor Q101, a drain connected to the write word line WWL, and a gate connected to the inverted version of the signal on the column write select signal line WCOL. The MOS transistor Q114 has a source connected to the ground, a drain connected to the gate of the write select transistor Q101, and a gate connected to the inverted version of the signal on the column write select signal line WCOL.

Figure 51C:
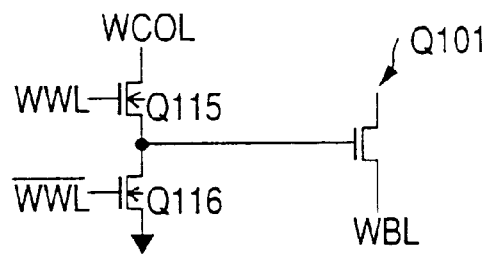

FIG. 51C shows a third example of the AND circuit 101. The circuit shown in FIG. 51C includes n-channel MOS transistors Q115 and Q116. The MOS transistor Q115 has a source connected to the column write select signal line WCOL, a drain connected to the gate of the write select transistor Q101, and a gate connected to the write word line WWL. The MOS transistor Q116 has a source connected to the ground, a drain connected to the gate of the write select transistor Q101, and a gate connected to the inverted version of the signal on the write word line WWL.

Figure 51D:
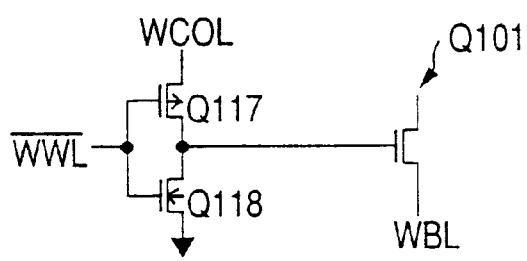

FIG. 51D shows a fourth example of the AND circuit 101. The circuit shown in FIG. 51D includes a p-channel MOS transistor Q117 and an n-channel MOS transistor Q118. The MOS transistor Q117 has a source connected to the column write select signal line WCOL, a drain connected to the gate of the write select transistor Q101, and a gate connected to the inverted version of the signal on the write word line WWL. The transistor Q118 has a source connected to the ground, a drain connected to the gate of the write select transistor Q101, and a gate connected to the inverted version of the signal on the write word line WWL.

Figure 51E:
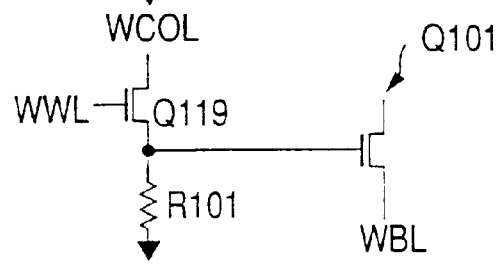

FIG. 51E shows a fifth example of the AND circuit 101, which includes an n-channel MOS transistor Q119 and a high-resistance polysilicon R101 serving as a resistor. The transistor Q119 has a source connected to the column write select signal line WCOL, a drain connected to the gate of the write select transistor Q101, and a gate connected to the write word line WWL. The high-resistance polysilicon R101 is connected between the gate of the write select transistor Q101 and the ground.

Figure 51F:
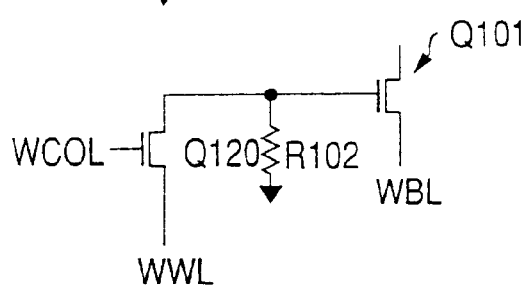
Figure 52A:
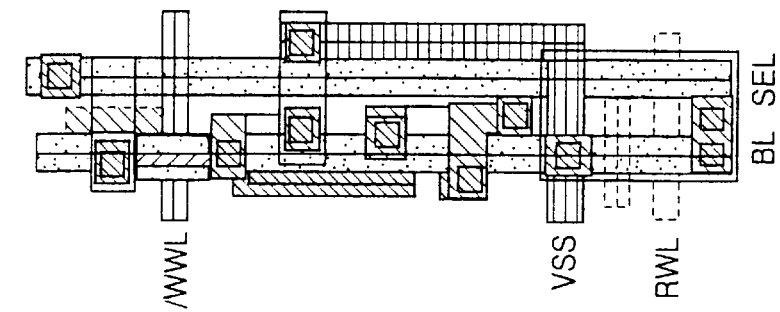
FIGS. 52A, 52B, 52C and 52D are respectively diagrams of layout patterns of the circuits shown in FIGS. 51A, 51B, 51C and 51D.
Figure 52B:
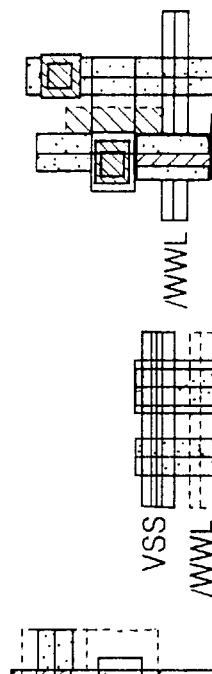
Figure 52C:
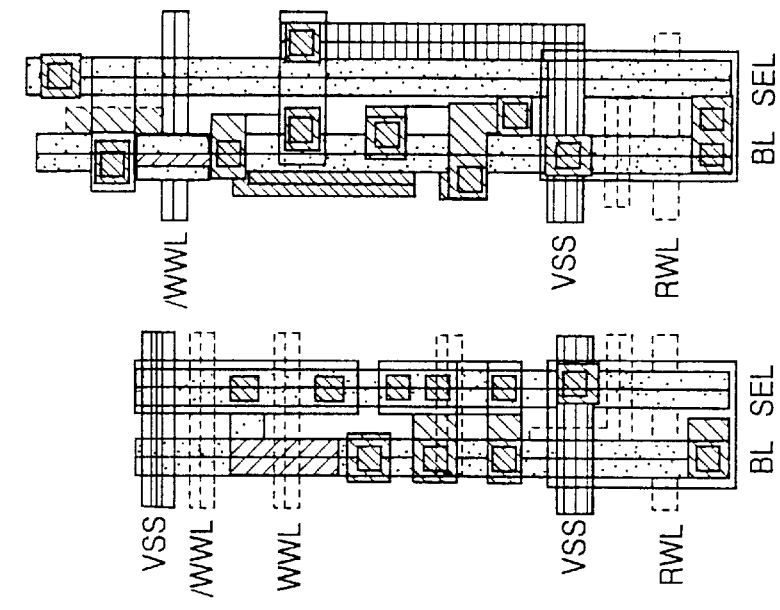
Figure 52D:
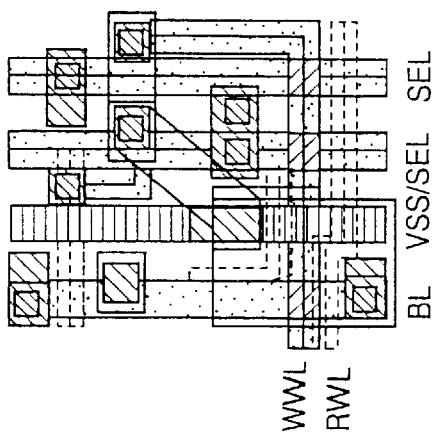

FIG. 51F shows a sixth example of the AND circuit 101, which includes an n-channel MOS transistor Q120 and a high-resistance polysilicon R102 serving as a resistor. The MOS transistor Q120 has a source connected to the gate of the write select transistor Q101, a drain connected to the write word line WWL, and a gate connected to the column write select signal line WCOL. The high-resistance polysilicon R102 is connected between the gate of the write select transistor Q101 and the ground.

The AND circuits 101 shown in FIGS. 51A through 51F can realize a write speed as fast as that of the SRAM devices, and a size smaller than that of the SRAM devices. The above advantages of the AND circuits 101 will be described with reference to FIGS. 52A through 52D.

FIG. 52A through 52D show layout patterns of the AND circuits 101 shown in FIGS. 51A through 51D, respectively. The layout shown in FIG. 52A requires an area of 13.4 $\mu m^2$, and the layout shown in FIG. 52B requires an area of 17.8 $\mu m^2$. The layout shown in FIG. 52C requires an area of 12.5 $\mu m^2$, and the layout shown in FIG. 52D has an area of 16.8 $\mu m^2$. Hence, high-speed compact DRAM devices can be achieved.

The present invention is not limited to the specifically disclosed embodiments and variations, and other variations and modifications may be made without departing from the scope of the present invention.

What is claimed is:

1. A semiconductor memory device comprising cells arranged in a matrix formation, each of the cells comprising:
    a driver transistor;
    a read transistor which is controlled by a read word line and outputs read data read from the cell to a read bit line;
    a write transistor which is controlled by a write word line and supplies write data supplied from a write bit line to a cell capacitor connected to a gate of the driver transistor; and
    a column write select transistor which is controlled by a column write select signal line and is connected to the write transistor in series.

2. The semiconductor memory device as claimed in claim 1, wherein in each of the cells, the write data supplied from the write bit line is supplied to the cell capacitor via both the column write select transistor and the write transistor.

3. The semiconductor memory device as claimed in claim 1, further comprising:
    a decoder which decodes a signal on an address line and thus specifies at least one of the cells; and
    a selector which supplies, at the time of writing, the write data to the write bit line of the specified cell and which selects the column write select signal line of the specified cell,
    the column write select transistor of the specified cell being driven under control of the selected column write select signal line.

4. The semiconductor memory device as claimed in claim 1, wherein the read bit line and the column write select signal line of an adjacent cell are unified and formed of a unified signal line.

5. The semiconductor memory device as claimed in claim 4, further comprising:
    a decoder which decodes a signal on an address line and thus specifies at least one of the cells; and
    a selector which supplies, at the time of writing, the write data to the write bit line of the specified cell and which selects the unified signal line of the specified cell,
    the column write select transistor of the specified cell being driven under control of the unified signal line.

6. The semiconductor memory device as claimed in claim 1, wherein the read bit line and the column write select signal line in each of the cells are unified and formed of a unified signal line.

7. The semiconductor memory device as claimed in claim 6, further comprising:
    a decoder which decodes a signal on an address line and thus specifies at least one of the cells; and
    a selector which supplies, at the time of writing, the write data to the write bit line of the specified cell and which selects the unified signal line of the specified cell,
    the column write select transistor of the specified cell being driven under control of the unified signal line.

8. The semiconductor memory device as claimed in claim 1, wherein the read bit line and the write bit signal line of an adjacent cell are unified and formed of a unified signal line.

9. The semiconductor memory device as claimed in claim 8, further comprising:
    a decoder which decodes a signal on an address line and thus specifies at least one of the cells; and
    a selector which supplies, at the time of writing, the write data to the unified signal line of the specified cell and which selects the column write select signal line of the specified cell,
    the column write select transistor of the specified cell being driven under control of the selected column write select signal line.

10. The semiconductor memory device as claimed in claim 1, wherein the read bit line and the write bit line in each of the cells are unified and formed of a unified signal line.

11. The semiconductor memory device as claimed in claim 10, further comprising:
    a decoder which decodes a signal on an address line and thus specifies at least one of the cells; and
    a selector which supplies, at the time of writing, the write data to the unified signal line and which selects the column write select signal line of the specified cell,
    the column write select transistor of the specified cell being driven under control of the unified signal line.

12. The semiconductor memory device as claimed in claim 1, further comprising a write control transistor provided between the write bit line and the cell capacitor and connected in series to the write transistor and the column write select transistor,
    wherein:
    the write control transistor is controlled by the write bit line of an adjacent cell; and
    the write bit line, the read bit line and the column write select signal line are unified in each of the cells and are formed by a unified signal line.

13. The semiconductor memory device as claimed in claim 12, further comprising:

a decoder which decodes a signal on an address line and thus specifies at least one of the cells; and a selector which supplies, at the time of writing, the write data to the unified signal line and which selects another unified signal line of a cell adjacent to the specified cell, the column write select transistor of the specified cell being driven under control of the unified signal line.

14. The semiconductor memory device as claimed in claim 1, wherein:

the write bit line and the read bit line are formed of a unified signal line in each of the cells; and column write select signal lines related to a plurality of cells are simultaneously driven so that a plurality of bits can be simultaneously written into the plurality of cells.

15. The semiconductor memory device as claimed in claim 1, wherein:

the read bit line and the column write select signal line are formed of a unified signal line in each of the cells; and column write select signal lines related to a plurality of cells are simultaneously driven so that a plurality of bits can be simultaneously written into the plurality of cells.

16. The semiconductor memory device as claimed in claim 1, wherein:

the read bit line and the write bit line of an adjacent cell are formed of a unified signal line;

read and write operations are alternately carried out; and read data appearing on the unified signal line is written into the cell of an adjacent column so that data is shifted.

17. The semiconductor memory device as claimed in claim 1, wherein:

the read bit line and the write bit line of an adjacent cell are formed of a unified signal line in each of the cells;

read and write operations are alternately carried out; and read data appearing on the unified signal line is written into the cell of an adjacent column so that data is shifted.

* * * * *